US00RE50144E

(19) United States
(12) Reissued Patent
Schnell et al.

(10) Patent Number: US RE50,144 E
(45) Date of Reissued Patent: *Sep. 24, 2024

(54) APPARATUS AND METHOD FOR GENERATING AUDIO SUBBAND VALUES AND APPARATUS AND METHOD FOR GENERATING TIME-DOMAIN AUDIO SAMPLES

(71) Applicant: Fraunhofer-Gesellschaft zur Foerderung der angewandten Forschung e.V., Munich (DE)

(72) Inventors: Markus Schnell, Erlangen (DE); Manfred Lutzky, Nuremberg (DE); Markus Lohwasser, Hersbruck (DE); Markus Schmidt, Erlangen (DE); Marc Gayer, Erlangen (DE); Michael Mellar, Ludwigshafen (DE); Bernd Edler, Hannover (DE); Markus Multrus, Nuremberg (DE); Gerald Schuller, Erfurt (DE); Ralf Geiger, Ilmenau (DE); Bernhard Grill, Lauf (DE)

(73) Assignee: Fraunhofer-Gesellschaft zur Foerderung der angewandten Forschung e.V., Munich (DE)

( * ) Notice: This patent is subject to a terminal disclaimer.

(21) Appl. No.: 17/845,503

(22) Filed: Jun. 21, 2022

Related U.S. Patent Documents

Reissue of:
(64) Patent No.: 8,438,015
Issued: May 7, 2013
Appl. No.: 12/293,532
PCT Filed: Oct. 23, 2007
PCT No.: PCT/EP2007/009200
§ 371 (c)(1),
(2) Date: Aug. 31, 2009
PCT Pub. No.: WO2008/049590
PCT Pub. Date: May 2, 2008

U.S. Applications:
(62) Division of application No. 17/845,375, filed on Jun. 21, 2022, which is an application for the reissue of Pat. No. 8,438,015.
(Continued)

(51) Int. Cl.
*G10L 19/00* (2013.01)
*G10L 19/02* (2013.01)
(Continued)

(52) U.S. Cl.
CPC ..... *G10L 19/0204* (2013.01); *G10L 19/022* (2013.01); *G10L 25/45* (2013.01); *H03H 17/0266* (2013.01); *G10L 21/038* (2013.01)

(58) Field of Classification Search
CPC ... G10L 19/0204; G10L 19/022; G10L 24/45; G10L 21/38; H03H 17/0266
See application file for complete search history.

(56) References Cited

U.S. PATENT DOCUMENTS 351,882 A 11/1886 Mutchler
3,748,363 A 7/1973 Maier
(Continued)

FOREIGN PATENT DOCUMENTS

EP 1160977 12/2001
EP 1160977 A2 12/2001
(Continued)

OTHER PUBLICATIONS

Ekstrand, Per, "Bandwidth extension of audio signals by spectral band replication", Proc. 1st IEEE Benelux orkshop on Model Based Processing and Coding of AudioLeuven, Belgium, pp. 53-58.
(Continued)

*Primary Examiner* — Robert L Nasser
(74) *Attorney, Agent, or Firm* — Perkins Coie LLP; Michael A. Glenn

(57) ABSTRACT

An embodiment of an apparatus for generating audio subband values in audio subband channels includes an analysis
(Continued)

windower for windowing a frame of time-domain audio input samples being in a time sequence extending from an early sample to a later sample using an analysis window function including a sequence of window coefficients to obtain windowed samples. The analysis window function includes a first number of window coefficients derived from a larger window function including a sequence of a larger second number of window coefficients, wherein the window coefficients of the window function are derived by an interpolation of window coefficients of the larger window function. The apparatus further includes a calculator for calculating the audio subband values using the windowed samples.

7 Claims, 29 Drawing Sheets

Related U.S. Application Data

(60) Provisional application No. 60/862,954, filed on Oct. 25, 2006.

(51) Int. Cl.

| | |
|---|---|
| ***G10L 19/022*** | (2013.01) |
| ***G10L 25/45*** | (2013.01) |
| ***H03H 17/02*** | (2006.01) |
| *G10L 21/038* | (2013.01) |

(56) References Cited

U.S. PATENT DOCUMENTS

| | | | | |
|---|---|---|---|---|
| 5,227,990 | A | 7/1993 | Vaupel | |
| 5,394,473 | A | 2/1995 | Davidson | |
| 5,758,020 | A | 5/1998 | Tsutsui | |
| 5,809,474 | A | 9/1998 | Park | |
| 6,377,917 | B1 | 4/2002 | Gimenez de los Galanes et al. | |
| 6,587,817 | B1 | 7/2003 | Vahatalo et al. | |
| 6,654,716 | B2 | 11/2003 | Bruhn et al. | |
| 6,707,869 | B1 | 3/2004 | Zhang | |
| 6,748,363 | B1 | 6/2004 | Lueck et al. | |
| 6,996,198 | B2 | 2/2006 | Cvetkovic | |
| 7,487,097 | B2 | 2/2009 | Engdegard et al. | |
| 8,036,903 | B2 | 10/2011 | Grill et al. | |
| 2002/0176353 | A1* | 11/2002 | Atlas et al. | 370/203 |
| 2005/0102150 | A1 | 5/2005 | Lin et al. | |
| 2007/0030977 | A1* | 2/2007 | Konagai | H04R 3/12 381/17 |
| 2007/0118367 | A1 | 5/2007 | Dickson et al. | |
| 2007/0174063 | A1* | 7/2007 | Mehrotra et al. | 704/501 |

FOREIGN PATENT DOCUMENTS

| | | | |
|---|---|---|---|
| EP | 1199711 | | 4/2002 |
| EP | 1199711 | A1 | 4/2002 |
| EP | 1641120 | | 3/2006 |
| JP | 9-162745 | | 6/1997 |
| JP | 2002055698 | | 2/2002 |
| JP | 2002-91499 | | 3/2002 |
| JP | 2002091499 | A | 3/2002 |
| JP | 2004-512560 | | 4/2004 |
| RU | 2251795 | C2 | 5/2005 |
| TW | 497335 | | 10/1989 |
| TW | 200608351 | | 8/1993 |
| TW | 351882 | | 10/1995 |
| TW | 497335 | B | 8/2002 |
| TW | 519629 | | 2/2003 |
| TW | 519629 | B | 2/2003 |
| TW | 200608351 | A | 3/2006 |
| WO | 0191111 | A1 | 11/2001 |
| WO | WO 01/91111 | | 11/2001 |
| WO | 2003003345 | A1 | 1/2003 |
| WO | 2003019533 | A1 | 3/2003 |
| WO | WO 03/019533 | | 6/2003 |
| WO | WO 03/003345 | | 9/2003 |
| WO | WO 2004/097794 | A2 | 11/2004 |
| WO | 2005073959 | A1 | 8/2005 |
| WO | 2005078706 | A1 | 8/2005 |
| WO | WO 2005/073959 | | 8/2005 |
| WO | WO 2005/078706 | | 8/2005 |
| WO | 2006107833 | A1 | 10/2006 |
| WO | WO 2006/107833 | | 10/2006 |
| WO | 2008/049590 | | 5/2008 |

OTHER PUBLICATIONS

Geiger, et al., "Enhanced MPEG-4 Low Delay AAC—Low Bitrate High Quality Communication", Audio Engineering Society, Convention Paper 6998, Presented at the 122nd Convention, Vienna, Austria, May 5-8, 2007, 13 pages.

Lutzky, Manfred, et al., "Structural Analysis of Low Latency Audio Coding Schemes", 119th AES ConventionNew York, USA, Total of 14 pages.

Schnell, et al., "Low Delay Filterbanks for Enhanced Low Delay Audio Coding", IEEE Workshop on Applications of Signal Processing to Audio and Acoustics, Oct. 21, 2007, pp. 235-238.

Schnell, et al., "Proposed Core Experiment on AAC-ELD", MPEG Meeting; Motion Picture Expert Group or ISO/IEC JTC1/SC29/WG11 No. M14517, San Jose, USA, Apr. 18, 2007, 18 pages.

Schuller, Gerald D.T., et al., "Modulated Filter Banks with Arbitrary System Delay: Efficient Implementations and the Time-Varying Case", IEEE Transactions on Signal Processing, vol. 48, No. 3, Mar. 2000, pp. 737-748.

Schuller, Gerald D.T., et al., "New Framework for Modulated Perfect Reconstruction Filter Banks", IEEE Transactions on Signal Processing, vol. 44, No. 8, Aug. 1996, pp. 1941-1953.

"Text of ISO/IEC 14496-3:2001/FDAM1, Bandwidth Extension, ISO/IEC 14496-3:2001/FDAM I", 64. MPEG Meeting; Mar. 10, 2003-Mar. 14, 2003; Pattaya; (Motion Picture Expert Group or ISO/IEC JTC1/SC29/WG11), No. N5570, Mar. 28, 2003 (Mar. 28, 2003), XP030012750, Mar. 28, 2003, 127 pp.

Schuller, Gerald, "A Low Delay Filter Bank For Audio Coding With Reduced Pre-Echoes", 99th AES Convention Internet Citation, Oct. 6, 1995, XP008052986, Retrieved from the Internet: URL:http://www.idmt.fraunhofer.de/abteilungen_gruppen/schuller/AES95-GS.pdf [retrieved on Oct. 6, 1995] * p. 3, para 2-p. 6, para 2.1, p. 8, para 3; figures 2,3, 14 pp.

Siclet, Cyrille, et al., "Biorthogonal filter banks with nearly optimal time-frequency localization", 2000 Ioth European Signal Processing Conference, IEEE, Sep. 4, 2000 (Sep. 4, 2000), XP032756120, ISBN: 978-952-15-0443-3, 4 pp.

Geiger, et al.; "Enhanced MPEG-4 Low Delay AAC-Low Bitrate High Quality Communication"; May 2007; 122nd Audio Engineering Society Convention, XP009092156.

Schuller, Gerald; "Time-Varying Filter Banks with Low Delay for Audio Coding"; Sep. 1998; 105th Audio Engineering Society Convention; XP002469868.

Lutzky, M. et al.; "Structural Analysis of Low Latency Audio Coding Schemes"; Oct. 7-10, 2005; Audio Engineering Society Convention Paper, Presented at the 119th Convention, XP002469869.

Florencio D. A.F.; "On the Use of Asymmetric Windows for Reducing the Time Delay in Real-Time Spectral Analysis"; Apr. 14-17, 1991; IEEE Acoustics, Speech, and Signal Processing, vol. 5, pp. 3261-3264, XP010043720.

Schuller, et al.; "Modulated Filter Banks with Arbitrary System Delay: Efficient Implementations and the Time-Varying Case"; Mar. 2000; IEEE Transactions on Signal Processing, vol. 48, No. 3, pp. 737-748, XP011058898.

PCT International Search Report for parallel patent application No. PCT/EP2007/009200, date mailed Mar. 5, 2008.

Ekstrand, P.; "Bandwidth Extension of Audio Signals by Spectral Band Replication"; Nov. 15, 2002; proc. 1st IEEE Benelux Workshop on Model based Processing and coding of Audio (MPCA-2002); Leuven, Belgium.

(56) References Cited

OTHER PUBLICATIONS

European Patent Office communication, dated Jul. 29, 2009, for parallel application No. 07819259.8-1522.
English Translation of Russian Decision to Grant, dated Jun. 8, 2010, in parallel Russian Patent Application No. 2008137468/09(048204), 7 pages.
Malaysian Office Action, dated Jun. 30, 2010, in parallel Malaysian Patent Application No. PI 20083406, 3 pages.

* cited by examiner

FIG 9A

```
        function [y, state] = ldfb80 (x, state)
S400
        % update buffer
        state (640-64+(1:64)) = x;
S410
        % apply window
        win_ana = ldfb80_win;
S420
        % assumes latest samples aligned to the right side of buffer
        x_win_orig = state.*win_ana;
S430
        % prepare stack
        x_stack = reshape (x_win_orig,128,5);
S440
        % sign change
        x_stack(:,2:2:4)) = -x_stack(:,(2:2:4));
S450
        % collapse stack
        x_stack = sum(-x_stack(end:-1:1,:),2)';
S460
        % Odd FFT of windowed data
        temp = fft( x_stack.*exp(-1i*pi*(0:128-1)/128));

        % post twiddle
S470
        m = (64+1) /2
        y = 2*conj (temp (1:64) .*exp(-2i*pi*((0:64-1)+0.5)*m/128));
S480
        % shift buffer
        state (1:640-64) = state (64+(1:640-64));
```

FIG 9B

```
        function [y, state] = ldfb80_32 (x, state)
S400'
        % update buffer
        state (320-32+(1:32)) = x;
S412
        % apply window
        win_ana = ldfb80_win();
S420    win_ana = (win_ana (1:2:end) + win_ana (2:2:end))/2;

        % assumes latest samples aligned to the right side of buffer
S430'   x_win_orig = state.*win_ana;

        % prepare stack
S440    x_stack = reshape (x_win_orig,64,5);

        % sign change
S450    x_stack(:,(2:2:4)) = -x_stack(:,(2:2:4));

        % collapse stack
S460'   x_stack = sum(-x_stack(end:-1:1,:),2)';

        % Odd FFT of windowed data
        temp = fft( x_stack.*exp(-1i*pi*(0:64-1)/64));
S470'
        % post twiddle
        m = (32+1) /2
S480'   y = 2*conj (temp (1:32) .*exp(-2i*pi*((0:32-1)+0.5)*m/64));

        % shift buffer
        state (1:320-32) = state (32+(1:320-32));
```

FIG 10A

```
function [y, state] = ldfb80 (x, state)
S500
% pre twiddling
m = (64+1) / 2;
temp = 0.5*conj (x).*exp( (2i*pi*((0:64-1)+0.5)*m/128) );

S510
% Odd symmetry
temp = [temp conj (temp (64:-1:1))];

S520
% Odd FFT
y_knl = real (ifft ( temp ) .* exp(i*pi*(0:128-1)/128));

% expand data; alternating sign flip
S530
y_knl = -y_knl (128:-1:1);
tmp = [y_knl -y_knl y_knl -y_knl y_knl]';

S540
% synthesis window
win_ana = ldfb80_win;
win_syn = win_ana(end:-1:1);

S550
% apply window
tmp = tmp.*win_sys;

S560
% update buffer
state (640-64+(1:64)) = 0;
state = state + tmp;

S570
% get output
y = state(1:64);

S580
% shift buffer
state (1:640-64) = state (64+1:640);
```

FIG 10B

```
                function [y, state] = ldfb80_32 (x, state)
S500'
                % pre twiddling
                m = (32+1) / 2;
                temp = 0.5*conj (x).*exp( (2i*pi*((0:32-1)+0.5)*m/64) );

S510'           % odd symmetry
                temp = [temp conj (temp (32:-1:1))];

S520'           % Odd FFT
                y_knl = real (ifft ( temp ) .* exp(i*pi*(0:64-1)/64));

                % expand data; alternating sign flip
S530'           y_knl = -y_knl (64:-1:1);
                tmp = [y_knl -y_knl y_knl -y_knl y_knl]';

S542            % synthesis window
                win_ana = ldfb80_win;
                win_syn = win_ana(end:-1:1);
                win_syn = (win_syn(1:2:end)+win_syn(2:2:end))/2;
S550
                % apply window
                tmp = tmp.*win_sys;
S560'
                % update buffer
                state (320-32+(1:32)) = 0;
S570'           state = state + tmp;

                % get output
S580'           y = state(1:32);

                % shift buffer
                state (1:320-64) = state (32+1:320);
```

FIG 14A

| Codec | Delay Source | delay [samples] | delay [ms] |
|---|---|---|---|
| AAC-LD +SBR | MDCT/IMDCT/<br>dual-rate<br>QMF<br>SBR-Overlap | 960.2<br>577<br>384 | 40<br>12<br>8 |
| | | 2881 | 60 |
| AAC-ELD | LD-MDCT/LD-IMDCT/<br>dual-rate<br>CLDFB<br>SBR-Overlap | 720.2<br>64<br>0 | 30<br>1<br>- |
| | | 1504 | 31 |

FIG 14B

| | Delay [samples] | Delay [ms] | Overall delay [ms] |
|---|---|---|---|
| LD-MDCT + LD-IMDCT | 720*2 samples | 30 ms | |
| QMF | 2*288= 576 samples | 12 ms | 42 ms |
| CLDFB | 2*32= 64 samples | 1.3 ms | 31.3 ms |

APPARATUS AND METHOD FOR GENERATING AUDIO SUBBAND VALUES AND APPARATUS AND METHOD FOR GENERATING TIME-DOMAIN AUDIO SAMPLES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application is a U.S. National Phase entry of PCT Application No. PCT/EP2007/009200 filed 23 Oct. 2007, which claims priority to U.S. Provisional Patent Application No. 60/862,954 filed 25 Oct. 2006.] *This application is a divisional reissue application of Ser. No. 17/845,375, and is also a reissue application of issued U.S. Pat. No. 8,438,015, issued May 7, 2013, which is a U.S. National Phase entry of PCT Application No. PCT/EP2007/009200 filed 23 Oct. 2007, which claims priority to U.S. Provisional Patent Application No. 60/862,954 filed 25 Oct. 2006.*

*More than one reissue application has been filed for the reissue of U.S. Pat. No. 8,438,015, the first being reissue application Ser. No. 17/845,375. Additionally, reissue applications Ser. Nos. 17/845,407, 17/845,435, 17/845,465, 17/845,503, 17/845,520, 17/845,564, 17/845,580, 17/845,607, and 17/845,632, were filed, all of which are divisional reissues of U.S. Pat. No. 8,438,015.*

BACKGROUND OF THE INVENTION

Embodiments of the present invention relate to an apparatus and method for generating audio subband values, an apparatus and a method for generating time-domain audio samples and systems comprising any of the aforementioned apparatuses, which can for instance be implemented in the field of modern audio encoding, audio decoding or other audio transmission-related applications.

Modern digital audio processing is typically based on coding schemes which enable a significant reduction in terms of bit rates, transmission bandwidths and storage space compared to a direct transmission or storage of the respective audio data. This is achieved by encoding the audio data on the sender side and decoding the encoded data on the receiver side before, for instance, providing the decoded audio data to a listener or to a further signal processing.

Such digital audio processing systems can be implemented with respect to a wide range of parameters, typically influencing the quality of the transmitted or otherwise processed audio data, on the one hand, and computational efficiency, bandwidths and other performance-related parameters, on the other hand. Very often, higher qualities necessitate higher bit rates, an increased computational complexity and a higher storage requirement for the corresponding encoded audio data. Hence, depending on the application in mind, factors as allowable bit rates, an acceptable computational complexity and acceptable amounts of data have to be balanced with a desirable and achievable quality.

A further parameter, which is especially important in real-time applications such as a bi-directional or a mono-directional communication, the delay imposed by the different coding schemes may also play an important role. As a consequence, the delay imposed by the audio encoding and decoding poses a further constraint in terms of the previously mentioned parameters when balancing the needs and the costs of different coding schemes having a specific field of application in mind. As such digital audio systems can be applied in may different fields of applications ranging form ultra-low quality transmission to a high-end-transmission, different parameters and different constraints are very often imposed on the respective audio systems. In some applications, a lower delay may for instance necessitate a higher bit rate and, hence, an increased transmission bandwidth compared to an audio system with a higher delay, as comparable quality level.

However, in many cases, compromises may have to be taken in terms of different parameters such as bit rate, computational complexity, memory requirements, quality and delay.

SUMMARY

According to an embodiment, an apparatus for generating audio subband values in audio subband channels may have: an analysis windower for windowing a frame of time-domain audio input samples being in a time sequence extending from an early sample to a later sample using an analysis window function including a sequence of window coefficients to acquire windowed samples, the analysis window function including a first number of window coefficients derived from a larger window function including a sequence of a larger second number of window coefficients, wherein the window coefficients of the window function are derived by an interpolation of window coefficients of the larger window function; and wherein the second number is an even number; and a calculator for calculating the audio subband values using the windowed samples.

According to another embodiment, an apparatus for generating time-domain audio samples may have: a calculator for calculating a sequence of intermediate time-domain samples from audio subband values in audio subband channels, the sequence including earlier intermediate time-domain samples and later time-domain samples; a synthesis windower for windowing the sequence of intermediate time-domain samples using a synthesis window function including a sequence of window coefficients to acquire windowed intermediate time-domain samples, the synthesis window function including a first number of window coefficients derived from a larger window function including a sequence of a larger second number of window coefficients, wherein the window coefficients of the window function are derived by an interpolation of window coefficients of the larger window function; and wherein the second number is even; and an overlap-adder output stage for processing the windowed intermediate time-domain samples to acquire the time-domain samples.

According to another embodiment, a method for generating audio subband values in audio subband channels may have the steps of: windowing a frame of time-domain audio input samples being in a time sequence extending from an early sample to a later sample using an analysis window function to acquire windowed samples, the analysis window function including a first number of window coefficients derived from a larger window function including a sequence of a larger second number of window coefficients, wherein the window coefficients of the window function are derived by an interpolation by window coefficients of the larger window function; and wherein the second number is an even number; and calculating the audio subband values using the windowed samples.

According to another embodiment, a method for generating time-domain audio samples may have the steps of: calculating a sequence of intermediate time-domain samples from audio subband values in audio subband channels, the sequence including earlier intermediate time-domain samples and later intermediate time-domain samples; windowing the sequence of intermediate time-domain samples using a synthesis window function to acquire windowed time-domain samples, the synthesis window function including a first number of window coefficients derived from a larger window function including a sequence of a larger second number of window coefficients, wherein the window coefficients of the window function are derived by an interpolation of window coefficients of the larger window function; and wherein the second number is even; and overlap-adding the windowed time-domain samples to acquire the time-domain samples.

Another embodiment may have a program with a program code for executing a method for generating audio subband values in audio subband channels, the method including: windowing a frame of time-domain audio input samples being in a time sequence extending from an early sample to a later sample using an analysis window function to acquire windowed samples, the analysis window function including a first number of window coefficients derived from a larger window function including a sequence of a larger second number of window coefficients, wherein the window coefficients of the window function are derived by an interpolation by window coefficients of the larger window function; and wherein the second number is an even number; and calculating the audio subband values using the windowed samples, when running on a processor.

Another embodiment may have a program with a program code for executing a method for generating time-domain audio samples, the method including: calculating a sequence of intermediate time-domain samples from audio subband values in audio subband channels, the sequence including earlier intermediate time-domain samples and later intermediate time-domain samples; windowing the sequence of intermediate time-domain samples using a synthesis window function to acquire windowed time-domain samples, the synthesis window function including a first number of window coefficients derived from a larger window function including a sequence of a larger second number of window coefficients, wherein the window coefficients of the window function are derived by an interpolation of window coefficients of the larger window function; and wherein the second number is even; and overlap-adding the windowed time-domain samples to acquire the time-domain samples, when running on a processor.

BRIEF DESCRIPTION OF THE DRAWINGS

Embodiments of the present invention will be detailed subsequently referring to the appended drawings, in which:

FIG. 7b illustrates a step of the embodiment of the method shown in FIG. 7a;

FIG. 9a shows a possible implementation of a comparative example of a method for generating audio subband values;

FIG. 9b shows a possible implementation of an embodiment of a method for generating audio subband values;

FIG. 10a shows a possible implementation of a comparative example of a method for generating time-domain samples;

FIG. 10b shows a further possible implementation of an embodiment of a method for generating time-domain samples;

FIG. 14a shows a table illustrating different contributions to the delay of a conventional AAC-LD+SBR codec and an AAC-ELD codec comprising an embodiment of the present invention;

FIG. 14b shows a further table comprising details concerning the delay of different components of different codecs;

FIG. 15b shows a close-up of the frequency response shown in FIG. 15a;

FIG. 16b shows a close-up of the frequency responses shown in FIG. 16a;

DETAILED DESCRIPTION OF THE INVENTION

Figure 1:
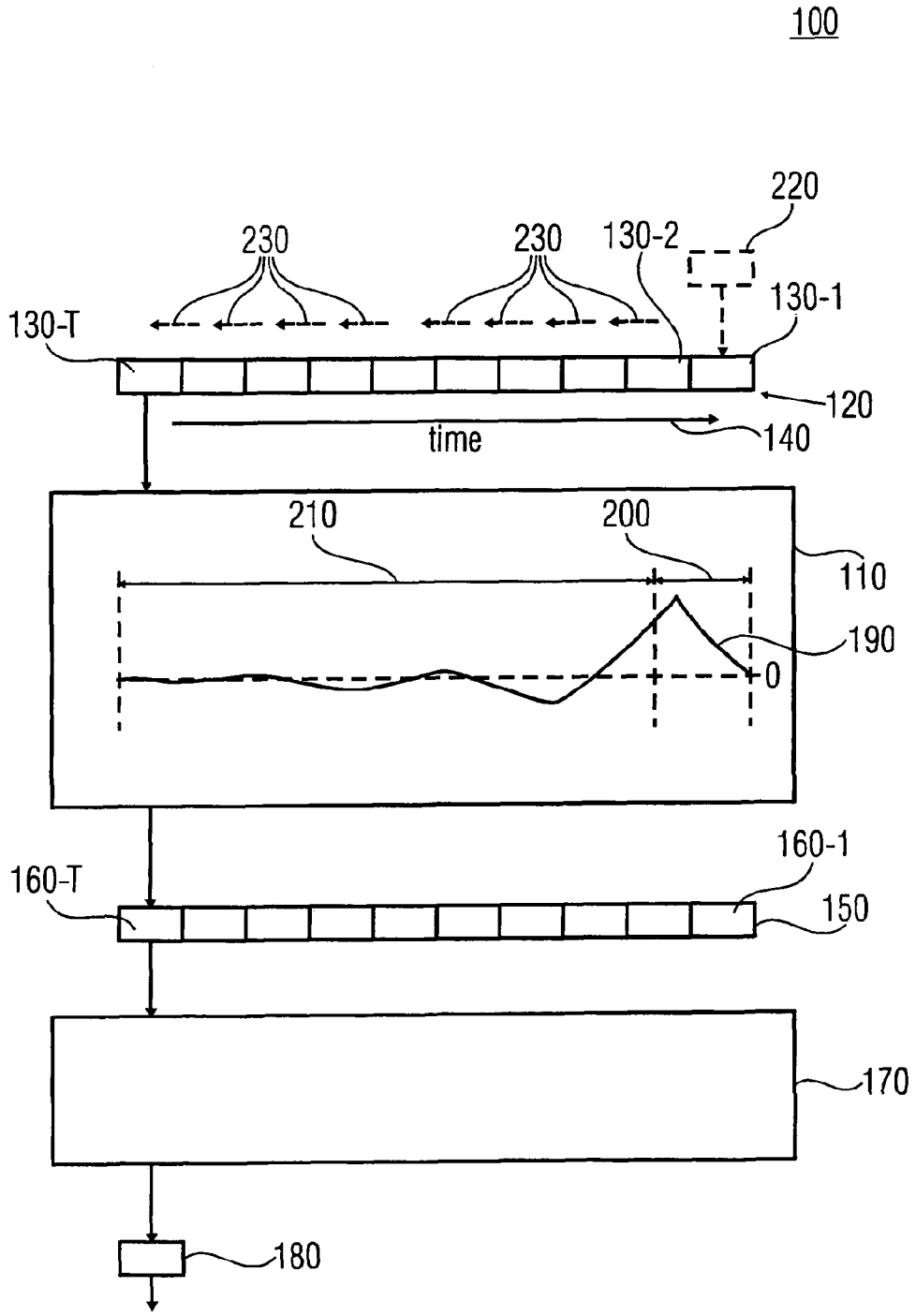
FIG. 1 shows a block diagram of an embodiment of an apparatus for generating audio subband values.

FIGS. 1 to 19 show block diagrams and further diagrams describing the functional properties and features of different embodiments of apparatuses and methods for generating audio subband values, of apparatuses and methods for generating time-domain samples and systems comprising at least one of the aforementioned apparatuses or methods. However, before describing a first embodiment of the present invention in more detail, it should be noted that embodiments of the present invention can be implemented in hardware and in software. Hence, implementations described in terms of block diagrams of hardware implementations of respective embodiments can also be considered as flowcharts of an appropriate embodiment of a corresponding method. Also, a flowchart describing an embodiment of the present invention can be considered to be a block diagram of a corresponding hardware implementation.

In the following, implementations of filterbanks will be described, which can be implemented as an analysis filterbank or a synthesis filterbank. An analysis filterbank is an apparatus for generating audio subband values in audio subband channels based on time-domain audio (input) samples being in a time sequence extending from an early sample to a later sample. In other words, the term analysis filterbank can be synonymously used for an embodiment of the present invention in the form of an apparatus for generating audio subband values. Accordingly, a synthesis filterbank is a filterbank for generating time-domain audio samples from audio subband values in audio subband channels. In other words, the term synthesis filterbank can be used synonymously for an embodiment according to the present invention in the form of an apparatus for generating time-domain audio samples.

Both, an analysis filterbank and a synthesis filterbank, which are also referred to summarizing as filterbanks, may for instance be implemented as modulated filterbanks. Modulated filterbanks, examples and embodiments of which will be outlined in more detail below, are based on an oscillations having frequencies which are based on or derived from center frequencies of corresponding subbands in the frequency-domain. The term "modulated" refers in this context to the fact that the aforementioned oscillations are used in context with a window function or a prototype filter function, depending on the concrete implementation of such a modulated filterbank. Modulated filterbanks can in principle be based on real-valued oscillations such as a harmonic oscillation (sine-oscillation or cosine-oscillation) or corresponding complex-valued oscillations (complex exponential oscillations). Accordingly, the modulated filterbanks are referred to as real modulated filterbanks or complex filter modulated filterbanks, respectively.

In the following description, embodiments of the present invention in the form of complex modulated low-delay filterbanks and real modulated low-delay filterbanks and corresponding methods and software implementations will be described in more detail. One of the main applications of such modulated low-delay filterbanks is an integration into a low-delay spectral band replication system (SBR), which currently is based on using a complex QMF filterbank with a symmetric prototype filter (QMF=Quadrature Mirror Filter).

As will become apparent in the framework of the present description, an implementation of low-delay filterbanks according to embodiments of the present invention will provide the advantage of an improved trade-off between computational complexity, frequency response, temporal noise spreading and (reconstruction) quality. Furthermore, an improved trade-off between delay and reconstruction quality is achievable based on an approach to make use of so-called zero-delay techniques to extend the filter impulse response of the respective filterbanks without introducing additional delay. A lower delay at a predefined quality level, a better quality at a predefined delay level or a simultaneous improvement of both the delay and the quality, can be achieved by employing an analysis filterbank or a synthesis filterbank according to an embodiment of the present invention.

Embodiments of the present invention are based on the finding that these improvements can be achieved by employing an interpolation scheme to obtain a window function having a first number of window coefficients based on a window function having a larger second number of window coefficients. By employing an interpolation scheme, an improved distribution of energy values of the window coefficients of the window functions can be achieved. This leads in many cases to an improved aliasing level and an improvement with respect to the audio quality. For instance, when the larger window function comprises an even number of window coefficients, an interpolation scheme may be useful.

The computational complexity increases only slightly by employing an interpolation scheme. However, this slight increase is not only outweighed by the improvement concerning the quality but also by the resulting savings concerning the reduced memory usage when comparing the situation with two separate window functions being stored independently. While the interpolation can be carried out in one or a few cycles of the clock signal of a processor in an implementation, in many cases leading to an insignificant delay and increased computational complexity, the additional memory requirement may be extremely important in many applications. For instance, in the case of mobile applications, the memory may be limited, especially when long window functions having a significant number of window coefficients are employed.

Moreover, embodiments according to the present invention can be used in context with a new window function for any of the two filterbanks described above, further improving the aforementioned trade-offs. The quality and/or the delay can further be improved in the case of an analysis filterbank by employing an analysis window function comprising a sequence of window coefficients, which comprises a first group comprising a first consecutive portion of the sequence of window coefficients and the second group of window coefficients comprising a second consecutive portion of the sequence of window coefficients. The first portion and the second portion comprise all window coefficients of the window function. Moreover, the first portion comprises less window coefficients than the second portion but an energy value of the window coefficients in the first portion is higher than an energy value of the window coefficients of the second portion. The first group of window coefficients is used for windowing later time-domain samples and the second group of window coefficients is used for windowed earlier time-domain samples. This form of the window function provides the opportunity of processing time-domain samples with window coefficients having higher energy values earlier. This is a result of the described distribution of window coefficients to the two portions and their application to the sequence of time-domain audio samples. As a consequence, employing such a window function can reduce the delay introduced by the filterbank at a constant quality level or enables an improved quality level based on a constant delay level.

Accordingly, in the case of an embodiment of the present invention in the form of an apparatus for generating time-domain audio samples and a corresponding method, a synthesis windower may use a synthesis window function, which comprises a sequence of window coefficients ordered correspondingly in a first (consecutive) portion and (consecutive) second portion. Also in the case of a synthesis window function, an energy value or an overall energy value of a window coefficient in the first portion is higher than an energy value or an overall energy value of a window coefficient of a second portion, wherein the first portion comprises less window coefficients than the second portion. Due to this distribution of the window coefficients among the two portions and the fact that the synthesis windower uses the first portion of windower coefficients for windowing later time-domain samples and the second portion of window coefficients for windowing earlier time-domain samples, the previously described effects and advantages also apply to a synthesis filterbank or a corresponding embodiment of a method.

Detailed descriptions of synthesis window functions and analysis window functions employed in the framework of some embodiments of the present invention will be described later in more detail. In many embodiments of the present invention, the sequence of window coefficients of the synthesis window function and/or of the analysis window function comprise exactly the first group and the second group of window coefficients. Moreover, each of the window coefficients of the sequence of window coefficients belongs exactly to one of the first group and the second group of window coefficients.

Each of the two groups comprises exactly one portion of the sequence of window coefficients in a consecutive manner. In the present description, a portion comprises a consecutive set of window coefficients according to the sequence of the window coefficients. In embodiments according to the present invention, each of the two groups (first and second group) comprises exactly one portion of the sequence of the window coefficients in the above-explained manner. The respective groups of window coefficients do not comprise any window coefficients, which do not belong to the exactly one portion of the respective group. In other word, in many embodiments of the present invention, each of the first and the second group of window coefficients comprises only the first portion and the second portion of window coefficients without comprising further window coefficients.

In the framework of the present description, a consecutive portion of the sequence of window coefficients is to be understood as a connected set of window coefficients in the mathematical sense, wherein the set does not lack window coefficients compared to the sequence of window coefficients, which would be lying in a range (e.g. index range) of the window coefficients of the respective portion. As a consequence, in many embodiments of the present invention, the sequence of window coefficients is divided exactly into two connected portions of window coefficients, which form each one of the first or the second groups of window coefficients. In these cases, each window coefficient comprised in the first group of window coefficients is either arranged before or after each of the window coefficients of the second group of window coefficients with respect to the overall sequence of the window coefficients.

In yet other words, in many embodiments according to the present invention the sequence of window coefficients is divided exactly into two groups or portions without leaving any window coefficients out. According to the sequence of the window coefficients, which also represents also an order of these, each of the two groups or portions comprise all window coefficients up to (but excluding) or beginning from (including) a border window coefficient. As an example, the first portion or first group may comprise window coefficients having indices from 0 to 95 and from 96 to 639 in the case of a window function comprising 640 window coefficients (having indices of 0 to 639). Here, the border window coefficient would be that corresponding to index 96. Naturally, other examples are also possible (e.g. 0 to 543 and 544 to 639).

The detailed exampled implementation of an analysis filterbank described in the following provides a filter length covering 10 blocks of input samples while causing a system delay of only 2 blocks, which is the corresponding delay as introduced by a MDCT (modified discrete cosine transform) or a MDST (modified discrete sine transform). One difference is due to the longer filter length covering 10 blocks of input samples compared to an implementation of a MDCT or MDST that the overlap is increased from 1 block in the case of MDCT and MDST to an overlap of 9 blocks. However, further implementations can also be realized covering a different number of blocks of input samples, which are also referred to as audio input samples. Moreover, other trade-offs can also be considered and implemented.

FIG. 1 shows a block diagram of an analysis filterbank 100 as an embodiment of an apparatus for generating audio subband values in audio subband channels. The analysis filterbank 100 comprises an analysis windower 110 for windowing a frame 120 of time-domain audio input samples. The frame 120 comprises T blocks 130-1, . . . , 130-T blocks of time-domain audio (input) samples, wherein T is a positive integer and equal to 10 in the case of the embodiment shown in FIG. 1. However, the frame 120 may also comprise a different number of blocks 130.

Both, the frame 120 and each of the blocks 130 comprises time-domain audio input samples in a time sequence extending from an early sample to a later sample according to a time line as indicated by an arrow 140 in FIG. 1. In other words, in the illustration as shown in FIG. 1, the further the time-domain audio sample, which in this case is also a time-domain audio input sample, is to the right, the later the corresponding time-domain audio sample is with respect to the sequence of the time-domain audio sample.

The analysis windower 110 generates based on the sequence of time-domain audio samples windowed samples in the time-domain, which are arranged in a frame 150 of windowed samples. According to the frame 120 of time-domain audio input samples, also the frame of windowed samples 150 comprises T blocks of windowed samples 160-1, . . . , 160-T. In embodiments of the present invention each of the blocks of windowed samples 160 comprises the same number of windowed samples as the number of time-domain audio input samples of each block 130 of time-domain audio input samples. Hence, when each of the blocks 130 comprises N time-domain input audio samples, the frame 120 and the frame 150 each comprise T·N samples. In this case, N is a positive integer, which may, for instance, acquire the values of 32 or 64. For T=10, the frames 120, 150 each comprise 320 and 640, respectively, in the case above.

The analysis window 110 is coupled to a calculator 170 for calculating the audio subband values based on the windowed samples provided by the analysis windower 110. The audio subband values are provided by the calculator 170 as a block 180 of audio subband values, wherein each of the audio subband values corresponds to one audio subband channel. In an embodiment, also the block 180 of audio subband values comprises N subband values.

Each of the audio subband channels corresponds to a characteristic center frequency. The center frequencies of the different audio subband channels may, for instance, be equally distributed or equally spaced with respect to the frequency bandwidth of the corresponding audio signal as described by the time-domain audio input samples provided to the analysis filterbank 100.

The analysis windower 110 is adapted to windowing the time-domain audio input samples of the frame 120 based on an analysis window function comprising a sequence of window coefficients having a first number of window coefficients to obtain the windowed samples of the frame 150. The analysis window 110 is adapted to performing the windowing of the frame of time-domain audio samples 120 by multiplying the values of the time-domain audio samples with the window coefficients of the analysis window function. In other words, the windowing comprises and element-wise multiplying of the time-domain audio samples with a corresponding window coefficient. As both, the frame 120 of time-domain audio samples and the window coefficients comprise a corresponding sequence, the element-wise multiplication of the window coefficients and the time-domain audio samples is carried out according to the respective sequences, for instance, as indicated by a sample and window coefficient index.

Figure 3:
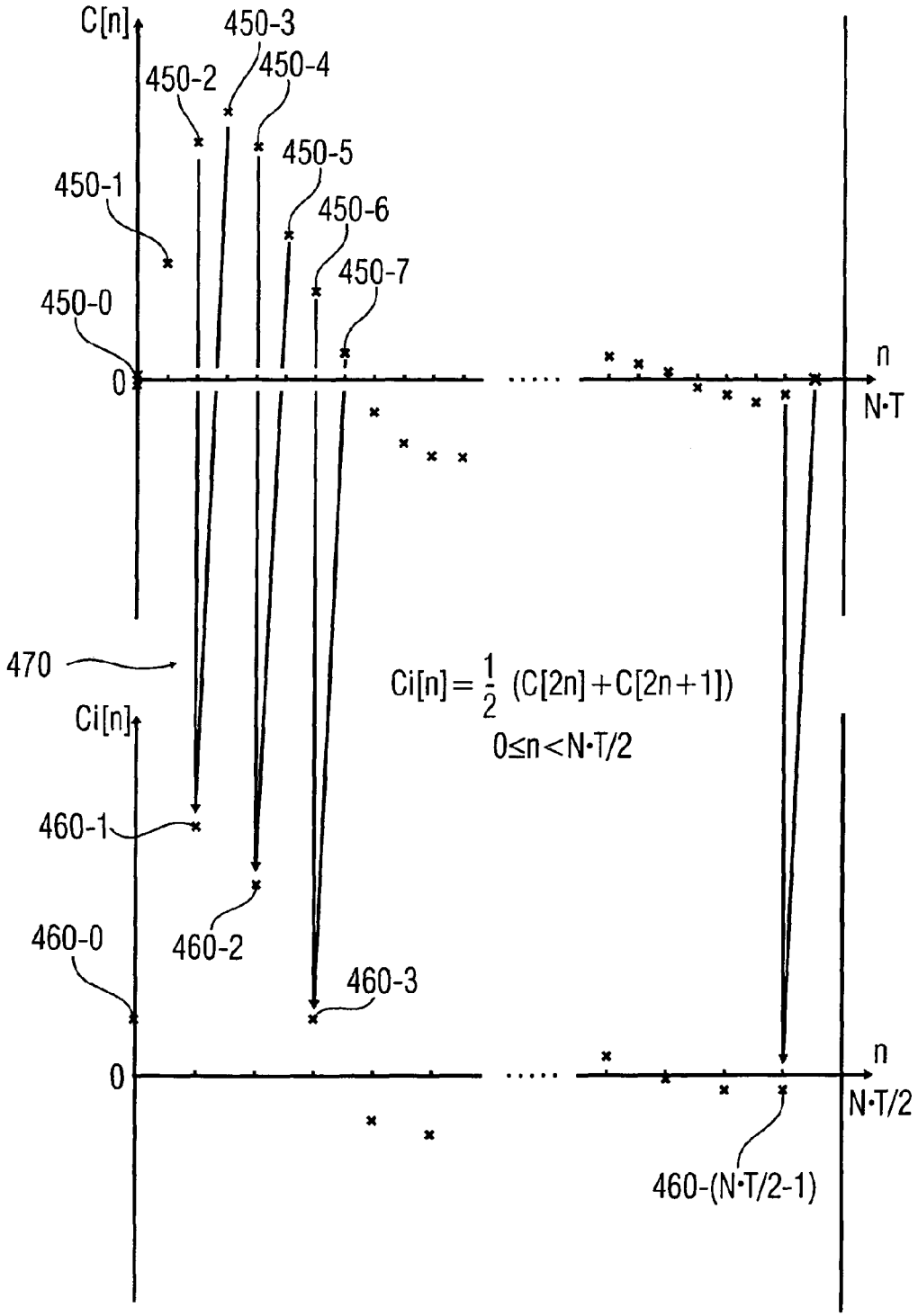
FIG. 3 illustrates the concept of interpolating window coefficients according to an embodiment of the present invention.
Figure 4:
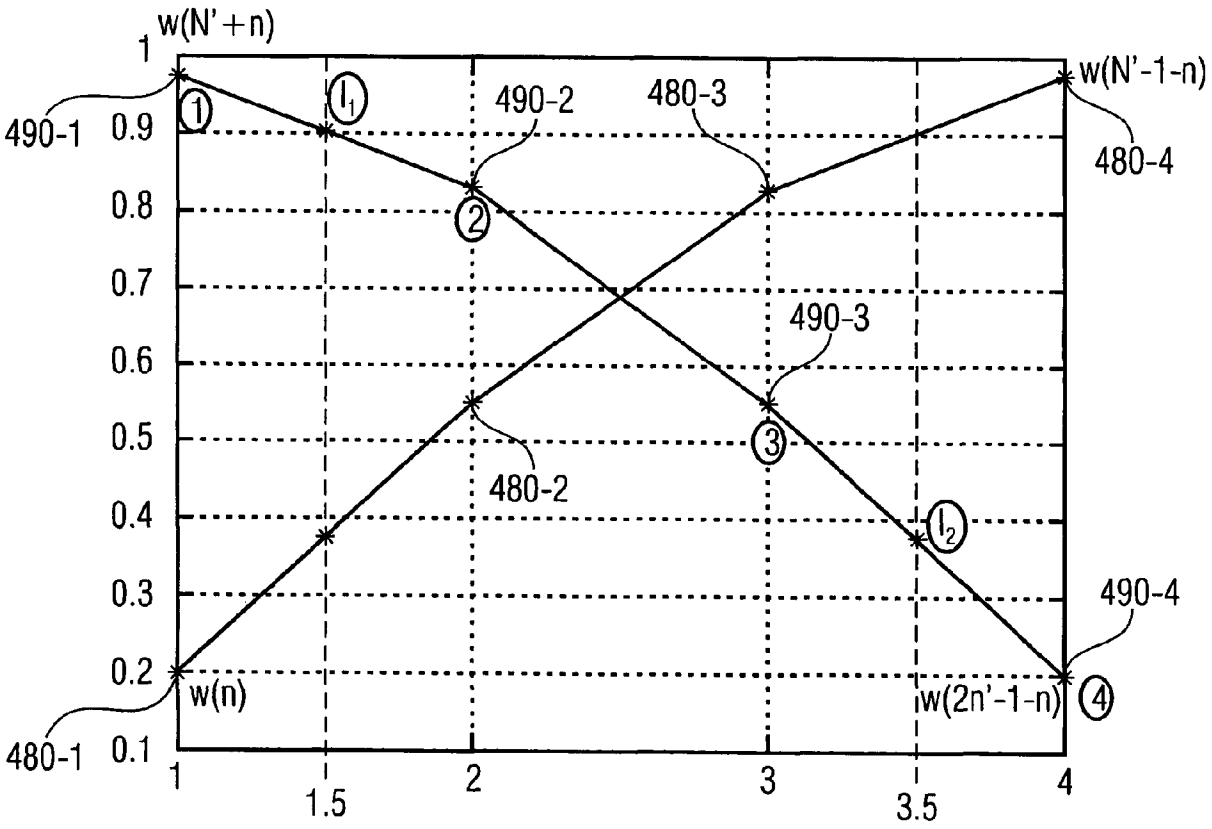
FIG. 4 illustrates interpolating window coefficients in the case of a sine window function.

In embodiments of the present invention, the window functions used for windowing the frame of time-domain audio input samples is generated based on a larger window function comprising a larger second number of window coefficients by employing an interpolation scheme as, for instance, outlined in the context of FIGS. 3 and 4. The larger window function typically comprises an even number of window coefficients and may, for instance, be asymmetric with respect to the sequence of window coefficients. Also symmetric window functions may be employed.

The window function 190 used for windowing the frame 120 of time-domain input samples is, for instance, obtained by the analysis windower 110 or the filterbank 100 interpolating the window coefficients of the larger window function. In embodiments according to the present invention, this is carried out, for instance, by interpolating consecutive window coefficients of the larger window function. Here a linear, a polynomial or a spline-based interpolation scheme may be employed.

When, for instance, each window coefficient of the larger window function is used once to generate a window coefficient of the window function and the second number is even, the number of window coefficients of the window function 190 (first number) is half the second number. Such an interpolation may be based on a linear interpolation, an example of which will be outlined in the context of equation (15) later. However, also other interpolation schemes may be employed as outlined.

In embodiments of the present invention in the form of an analysis filterbank 100 as shown in FIG. 1, the analysis window function, as well as the synthesis window function in the case of a synthesis filterbank, may for instance comprise real-valued windowed coefficients only. In other words, each of the window coefficients attributed to a window coefficient index is a real value.

The window coefficients together form the respective window function, an example of which is shown in FIG. 1 as an analysis window function 190. In the following, window functions will be considered, which allow a reduction of the delay when used in the context of the described filterbanks. However, embodiments of the present invention are not limited to such low-delay window functions.

The sequence of window coefficients forming the analysis window function 190 comprises a first group 200 and a second group 210 of window coefficients. The first group 200 comprises a first consecutive and connected portion of the window coefficients of the sequence of window coefficients, whereas the second group 210 comprises a consecutive and connected second portion of a window coefficient. Together with the first portion in the first group 200, they form the whole sequence of window coefficients of the analysis window function 190. Moreover, each window coefficient of the sequence of window coefficients belongs either to the first portion or the second portion of window coefficients so that the whole analysis window function 190 is made up by the window coefficient of the first portion and the second portion. The first portion of window coefficients is, hence, identical to the first group 200 of window coefficients and the second portion is identical to the second group 210 of window coefficients as indicated by the corresponding arrows 200, 210 in FIG. 1.

The number of window coefficients in the first group 200 of the first portion of window coefficients is smaller than the number of window coefficients in the second group of the second portion of window coefficients. However, an energy value or a total energy value of the window coefficients in the first group 200 is higher than an energy value or total energy value of the window coefficients in the second group 210. As will be outlined later, an energy value of a set of window coefficients is based on a sum of the squares of the absolute values of the corresponding window coefficients.

In embodiments according to the present invention, the analysis window function 190 as well as a corresponding synthesis window function may be therefore asymmetric with respect to the sequence of window coefficients or an index of a window coefficient. Based on a definition set of window coefficient indices over which the analysis window function 190 is defined, the analysis window function 190 is asymmetric, when for all real numbers n a further real number $n_0$ exists so that the absolute value of window coefficient corresponding to the window coefficient of the window coefficient index $(n_0-n)$ is not equal to the absolute value of the window coefficient corresponding to the window coefficient index $(n_0+n)$, when $(n_0-n)$ and $(n_0+n)$ belong to the definition set.

Moreover, as also schematically shown in FIG. 1, the analysis window function 190 comprises sign changes at which the product of two consecutive window coefficients is negative. More details and further features of possible window functions according to embodiments of the present invention will be discussed in more detail in the context of FIGS. 11 to 19.

As indicated earlier, the frame of windowed samples 150 comprises a similar block structure with individual blocks 160-1, . . . , 160-T as the frame 120 of individual time-domain input samples. As the analysis windower 110 is adapted to windowing the time-domain audio input samples by multiplying these values with the window coefficients of the analysis window function 190, the frame 150 of windowed samples is also in the time-domain. The calculator 170 calculates the audio subband values, or to be more precise, the block 180 of audio subband values using the frame 150 of windowed samples and performs a transfer from the time-domain into the frequency-domain. The calculator 170 can therefore be considered to be a time/frequency converter, which is capable of providing the block 180 of audio subband values as a spectral representation of the frame 150 of windowed samples.

Each audio subband value of the block 180 corresponds to one subband having a characteristic frequency. The number of audio subband values comprised in the block 180 is also sometimes referred to as a band number.

In many embodiments according to the present invention, the number of audio subband values in block 180 is identical to the number of time-domain audio input samples of each of the blocks 130 of the frame 120. In the case that the frame 150 of windowed samples comprises the same block-wise structure as the frame 120 so that each of the blocks 160 of windowed samples also comprise the same number of windowed samples as the block of these time-domain audio input samples 130, the block 180 of audio subband values naturally also comprises the same number as the block 160.

The frame 120 can optionally be generated, based on a block of fresh time-domain audio input samples 220 by shifting the blocks 130-1, . . . , 130-(T−1) by one block in the opposite direction of the arrow 140 indicating the time-direction. Thereby, a frame 120 of time-domain audio input samples to be processed is generated by shifting the (T−1) latest blocks of a directly preceding frame 120 of time-domain audio samples by one block towards the earlier time-domain audio samples and by adding the fresh block 220 of fresh time-domain audio samples as the new block 130-1 comprising the latest time-domain audio samples of the present frame 120. In FIG. 1 this is also indicated by a series of dashed arrows 230 indicating shifting the blocks 130-1, . . . , 130-(T−1) in the opposite direction of the arrow 140.

Due to this shifting of the blocks 130 in the opposite direction of the time as indicated by arrow 140, a present frame 120 to be processed, comprises the block 130-(T−1) of the directly preceding frame 120 as the new block 130-T. Accordingly, the blocks 130-(T−1), . . . , 130-2 of the present frame 120 to be processed are equal to the block 130-(T−2), . . . , 130-1 of the directly preceding frame 120. The block 130-T of the directly preceding frame 120 is discarded.

As a consequence, each time-domain audio sample of the fresh block 220 will be processed T-times in the framework of T consecutive processings of T consecutive frames 120 of time-domain audio input samples. Hence, each time-domain audio input sample of the fresh block 220 contributes, not only to T different frames 120, but also to T different frames 150 of windowed samples and T blocks 180 of audio subband values. As indicated before, in an embodiment according to the present invention, the number of blocks T in the frame 120 is equal to 10, so that each time-domain audio sample provided to the analysis filterbank 100 contributes to 10 different blocks 180 of audio subband values.

In the beginning, before a single frame 120 is processed by the analysis filterbank 100, the frame 120 can be initialized to a small absolute value (below a predetermined threshold), for instance the value 0. As will be explained in more detail below, the shape of the analysis window function 190 comprises a center point or a "center of mass", which typically corresponds to or lies between two window coefficient indices of the first group 200.

As a consequence, the number of fresh blocks 220 to be inserted into the frame 120 is small, before the frame 120 is filled at least to a point so that portions of the frame 120 are occupied by non-vanishing (i.e. non-zero-valued) values which correspond to window coefficients having a significant contribution in terms of their energy values. Typically, the number of blocks to be inserted into frame 120 before a "meaningful" processing can begin, is 2 to 4 blocks depending on the shape of the analysis window function 190. Hence, the analysis filterbank 100 is capable of providing blocks 180 faster than a corresponding filterbank employing, for instance, a symmetric window function. As typically the fresh blocks 220 are provided to the analysis filterbank 100 as a whole, each of the fresh blocks corresponds to a recording or sampling time, which is essentially given by the length of the block 220 (i.e. the number of time-domain audio input samples comprised in block 220) and the sampling rate or sampling frequency. Therefore, analysis window function 190, as incorporated into an embodiment of the present invention, leads to a reduced delay before the first and the following blocks 180 of audio subband values can be provided or output by the filterbank 100.

As a further option, the apparatus 100 can be capable of generating a signal or incorporating a piece of information concerning the analysis window function 190 used in generating the frame 180 or concerning a synthesis window function to be used in the framework of a synthesis filterbank. Thus, the analysis filter function 190 can, for instance, be a time- or index-reversed version of the synthesis window function to be used by the synthesis filterbank.

Figure 2A:
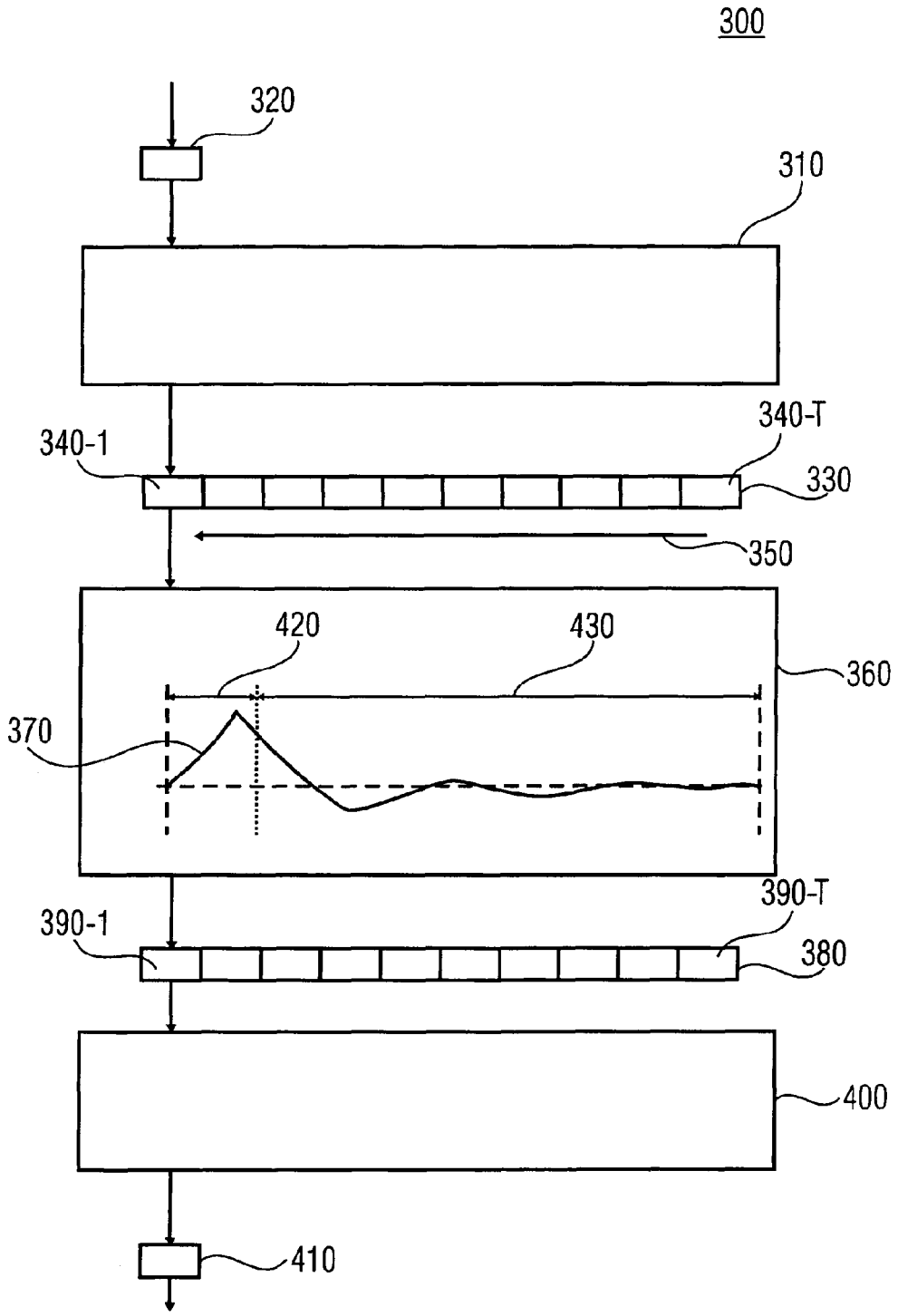
FIG. 2a shows a block diagram of an embodiment of an apparatus for generating time-domain audio samples.

FIG. 2a shows a block diagram of an embodiment of an apparatus 300 for generating time-domain audio samples based on the block of audio subband values. As previously explained, an embodiment of the present invention in the form of an apparatus 300 for generating time-domain audio samples is often also referred to as a synthesis filterbank 300 as the apparatus is capable of generating time-domain audio samples, which can in principle be played back, based on audio subband values which comprise spectral information concerning an audio signal. Hence, the synthesis filterbank 300 is capable of synthesizing time-domain audio samples based on audio subband values, which can for instance be generated by a corresponding analysis filterbank 100.

FIG. 2a shows a block diagram of the synthesis filterbank 300 comprising a calculator 310 to which a block 320 of audio subband values (in the frequency-domain) is provided. The calculator 310 is capable of calculating a frame 330 comprising a sequence of intermediate time-domain samples from the audio subband values of the block 320. The frame 330 of intermediate time-domain samples comprises in many embodiments according to the present invention also a similar block structure as for instance the frame 150 of windowed samples of the analysis filterbank 100 of FIG. 1. In these cases, the frame 330 comprises blocks 340-1, . . . , 340-T blocks of intermediate time-domain samples.

The sequence of intermediate time-domain samples of the frame 330, as well as each block 340 of intermediate time-domain samples comprise an order according to the time as indicated by an arrow 350 in FIG. 2a. As a consequence, the frame 330 comprises an early intermediate time-domain sample in block 340-T and a latest intermediate time-domain sample in block 340-1, which represent the first and the last intermediate time-domain sample for the frame 330, respectively. Also each of the blocks 340 comprises a similar order. As a consequence, in embodiments of a synthesis filterbank the terms "frame" and "sequence" can often be used synonymously.

The calculator 310 is coupled to a synthesis windower 360 to which the frame 330 of intermediate time-domain samples is provided. The synthesis windower is adapted to windowing the sequence of intermediate time-domain samples using a synthesis window function 370 schematically depicted in FIG. 2a. As an output, the synthesis windower 360 provides a frame 380 of windowed intermediate time-domain samples, which may also comprise a block-wise structure of blocks 390-1, . . . , 390-T.

The frames 330 and 380 may comprise T blocks 340 and 390, respectively, wherein T is a positive integer. In an embodiment according to the present invention in the form of a synthesis filterbank 300, the number of blocks T is equal to 10. However, in different embodiments, also different numbers of blocks may be comprised in one of the frames. To be more precise, in principle the number of blocks T may be larger or equal to 3, or larger than or equal to 4, depending on the circumstances of the implementation and the previously explained trade-offs for embodiments according to the present invention comprising a block-wise structure of frames for both a synthesis filterbank 100 and a synthesis filterbank 300.

The synthesis windower 360 is coupled to an overlap-adder output stage 400, to which the frame 380 of windowed intermediate time-domain samples is provided. The overlap-adder output stage 400 is capable of processing the windowed intermediate time-domain samples to obtain a block 410 of time-domain samples. The block 410 of the time-domain (output) samples can then for instance be provided to further components for further processing, storing or transforming into audible audio signals.

The calculator 310 for calculating the sequence of time-domain samples comprised in the frame 330 is capable of transferring data from the frequency-domain into the time-domain. Therefore, the calculator 310 may comprise a frequency/time converter capable of generating a time-domain signal of the spectral representation comprised in the block 320 of audio subband values. As was explained in the context of the calculator 170 of the analysis filterbank 100 shown in FIG. 1, each of the audio subband values of the block 320 corresponds to an audio subband channel having a characteristic center frequency.

In contrast to this, the intermediate time-domain samples comprised in the frame 330 represent in principle information in the time-domain. The synthesis windower 360 is capable and adapted to windowing the sequence of intermediate time-domain samples comprised in the frame 330 using the synthesis window function 370 as schematically depicted in FIG. 2a.

As already outlined in the context of FIG. 1, the synthesis windower 360 also uses a synthesis window function 370, which is obtained by interpolation of a larger window function comprising a second number of window coefficients. The second number is, hence, larger than a first number of window coefficients of the synthesis window function 370 used for windowing the intermediate time-domain samples of the frame 330.

The synthesis window function 370 may, for instance, be obtained by the synthesis windower 360 or the filterbank 300 (the apparatus) performing one of the previously outlined interpolation schemes. The window coefficients of the synthesis window function may, for instance, be generated based on a linear, a polynomial or a spline-based interpolation. Moreover, in embodiments according to the present invention the interpolation may be based on using consecutive window coefficients of the larger window function. When each window coefficient of the larger window function is used exactly once, the window function 370 comprising the (smaller) first number of window coefficients may for instance comprise exactly half the number of window coefficients of the larger window function, when the second number is even. In other words, in this case the second number may be twice the first number. However, also other interpolation scenarios and schemes may be implemented in the framework of embodiments of the present invention.

In the following, the case of a so-called low-delay window function will be considered more closely. As indicated earlier, embodiments according to the present invention are by far not limited to these window functions. Also other window functions, such as symmetric window functions, may be used.

The synthesis window function 370 comprises a sequence of window coefficients, which also comprises a first group 420 and a second group 430 of window coefficients as previously explained in the context of the window function 190 with a first group 200 and a second group 210 of window coefficients.

The first group 420 of window coefficients of the synthesis window function 370 comprises a first consecutive portion of the sequence of window coefficients. Similarly, the second group 430 of coefficients also comprises a second consecutive portion of the sequence of window coefficients, wherein the first portion comprises less window coefficients than the second portion and wherein an energy value or total energy value of the window coefficients in the first portion is higher than the corresponding energy value of the window coefficients of the second portion. Further features and properties of the synthesis window function 370 may be similar to the corresponding features and properties of the analysis window function 190 as schematically depicted in FIG. 1. As a consequence, reference is hereby made to the corresponding description in the framework of the analysis window function 190 and the further description of the window functions with respect to FIGS. 11 to 19, wherein the first group 200 corresponds to the first group 420 and the second group 210 corresponds to the second group 430.

For instance the portions comprised in the two groups 420, 430 of window coefficients typically each form a consecutive and connected set of window coefficients together comprising all window coefficients of the sequence of window coefficients of the window function 370. In many embodiments according to the present invention, the analysis window function 190 as depicted in FIG. 1 and the synthesis window function 370 as depicted in FIG. 2a are based on each other. For instance, the analysis window function 190 may be a time-reversed or index-reversed version of the synthesis window function 370. However, also other relations between the two window functions 190, 370 may be possible. It may be advisable to employ a synthesis window function 370 in the framework of the synthesis windower 360, which is related to the analysis window function 190, which was employed in the course of generating (optionally before further modifications) of the block 320 of audio subband vales provided to the synthesis filterbank 300.

As outlined in the context of FIG. 1, the synthesis filterbank 300 in FIG. 2a may optionally be adapted such that the incoming block 320 may comprise additional signals or additional pieces of information concerning the window functions. As an example, the block 320 may comprise information concerning the analysis window function 190 used for generating the block 320 or concerning the synthesis window function 370 to be used by the synthesis windower 360. Hence, the filterbank 300 may be adapted to isolating the respective information and to provide these to the synthesis windower 360.

The overlap-adder output stage 400 is capable of generating the block 410 of time-domain samples by processing the windowed intermediate time-domain samples comprised in the frame 380. In different embodiments according to the present invention, the overlap-adder output stage 4000 may comprise a memory for temporarily storing previously received frames 380 of windowed intermediate time-domain samples. Depending on implementational details, the overlap-adder output stage 400 may for instance comprise T different storage positions comprised in the memory for storing an overall number of T frames 380 of windowed intermediate time-domain samples. However, also a different number of storage positions may be comprised in the overlap-adder output stage 400 as necessitated. Moreover, in different embodiments according to the present invention, the overlap-adder output stage 400 may be capable of providing the block 410 of time-domain samples based on a single frame 380 of intermediate time-domain samples alone. Embodiments of different synthesis filterbanks 300 will be explained in more detail later.

Figure 2B:
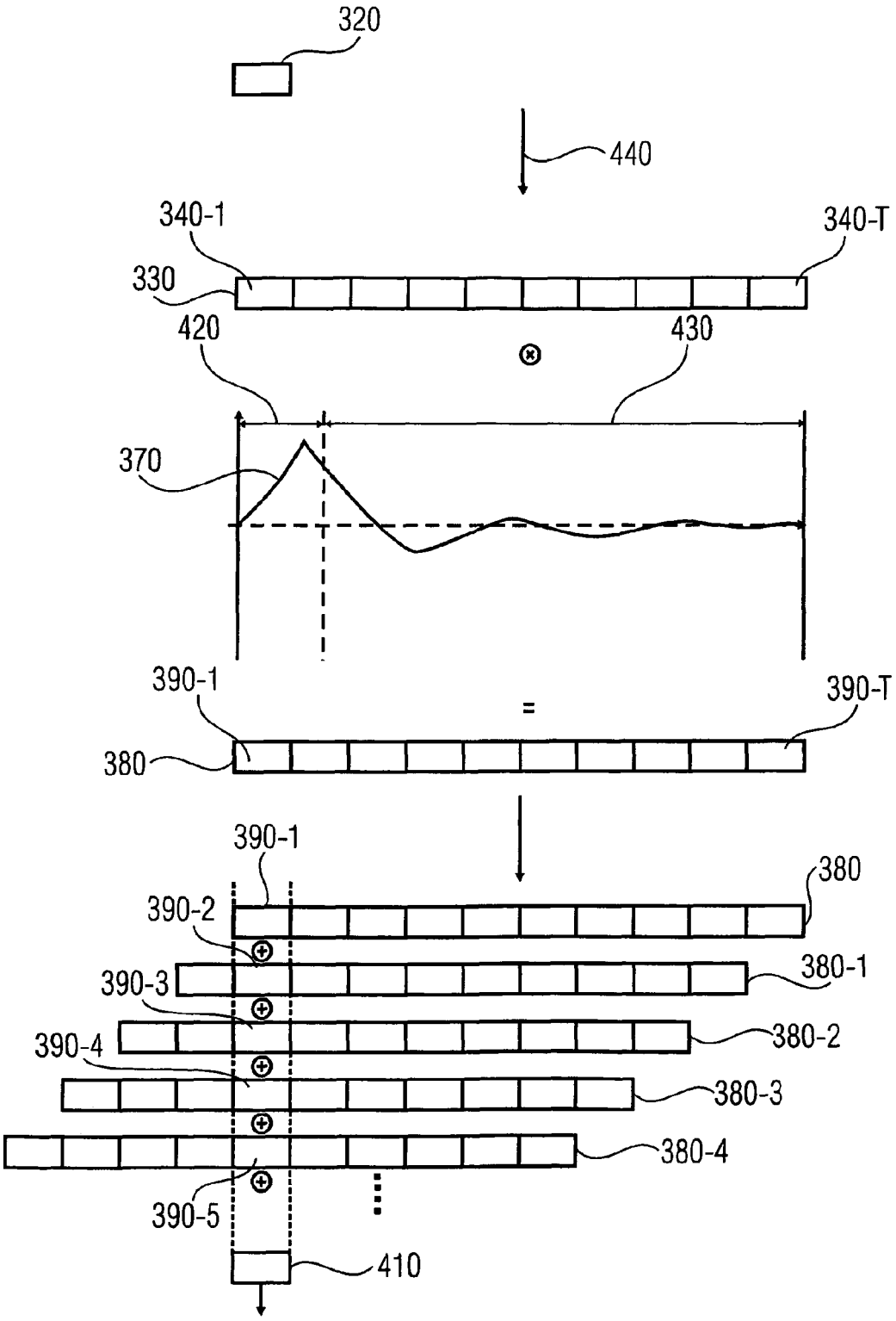
FIG. 2b illustrates a functional principle according to an embodiment of the present invention in the form of an apparatus for generating time-domain samples.

FIG. 2b illustrates a functional principle according to an embodiment of the present invention in the form of a synthesis filterbank 300, in which the generation of the window function 370 by interpolation is not focused on for the sake of simplicity only.

The block 320 of audio subband values is first transferred from the frequency-domain into the time-domain by the calculator 310, which is illustrated in FIG. 2b by an arrow 440. The resulting frame 320 of intermediate time-domain samples comprising the blocks 340-1, . . . , 340-T of intermediate time-domain samples is then windowed by the synthesis windower 360 (not shown in FIG. 2b) by multiplying the sequence of intermediate time-domain samples of the frame 320 with the sequence of window coefficients of the synthesis window function 370 to obtain the frame 380 of windowed intermediate time-domain samples. The frame 380 again comprises the blocks 390-1, . . . , 390-T of windowed intermediate time-domain samples, together forming the frame 380 of windowed intermediate time-domain samples.

In the embodiment shown in FIG. 2b of an inventive synthesis filterbank 300, the overlap-adder output stage 400 is then capable of generating the block 410 of time-domain output samples by adding for each index value of the time-domain audio samples of the block 410, the windowed intermediate time-domain samples of one block 390 of different frames 380. As illustrated in FIG. 2b, the time-domain audio samples of the block 410 are obtained by adding for each audio sample index one windowed intermediate time-domain sample of block 390-1 of the frame 380, processed by the synthesis windower 360 in the current round and as previously described, the corresponding intermediate time-domain sample of the second block 390-2 of a frame 380-1 processed immediately before frame 380 and stored in a storage position in the overlap-adder output stage 400. As illustrated in FIG. 2b, further corresponding windowed intermediate time-domain samples of further blocks 390 (e.g. block 390-3 of frame 380-2, block 390-4 of frame 380-3, block 390-5 of frame 380-4) processed by the synthesis filterbank 300 before may be used. The frames 380-2, 380-3, 380-4 and optionally further frames 380 have been processed by the synthesis filterbank 300 in previous rounds. The frame 380-2 has been immediately processed before the frame 380-1 and, accordingly, frame 380-3 was immediately generated before frame 380-2 and so on.

The overlap-adder output stage 400 as employed in the embodiment is capable of summing up for each index of the block 410 of time-domain (output) samples T different blocks 390-1, . . . , 390-T of windowed intermediate time-domain samples from T different frames 380, 380-1, 380-(T−1). Hence, apart from the first T blocks processed, each of the time-domain (output) samples of the block 410 is based on T different blocks 320 of audio subband values.

As in the case of the embodiment of the present invention an analysis filterbank 100 described in FIG. 1, due to the form of the synthesis window function 370, the synthesis filterbank 300 offers the possibility of quickly providing the block 410 of time-domain (output) samples. This is also a consequence of the form of the window function 370. As The first group 420 of window coefficients correspond to a higher energy value and comprise less window coefficients than the second group 430, the synthesis windower 360 is capable of providing "meaningful" frames 380 of windowed samples when the frame 330 of intermediate time-domain samples is filled so that at least the window coefficients of the first group 420 contribute to the frame 380. The window coefficients of the second group 430 exhibit a smaller contribution due to their smaller energy value.

Therefore, when at the beginning, the synthesis filterbank 300 is initialized with 0, the provision of blocks 410 can in principle, be started when only a few blocks 320 of audio subband values have been received by the synthesis filterbank 300. Therefore, also the synthesis filterbank 300 enables significant delay reduction compared to the synthesis filterbank having for instance a symmetric synthesis window function.

As indicated earlier, the calculators 170 and 310 of the embodiments shown in FIGS. 1 and 2a can be implemented as real-valued calculators generating or being capable of processing real-valued audio subband values of the blocks 180 and 320, respectively. In these cases, the calculators may for instance be implemented as real-valued calculators based on harmonic oscillating functions such as the sine-function or the cosine-function. However, also complex-valued calculators can be implemented as the calculators 170, 310. In these cases the calculators may for instance be implemented on the basis of complex exponential-functions or other harmonic complex-valued functions. The frequency of the real-valued or complex-valued oscillations usually depends on the index of the audio subband value, which is sometimes also referred to as the band index or the subband index of the specific subband. Moreover, the frequency may be identical or depend on the center frequency of the corresponding subband. For instance, the frequency of the oscillation may be multiplied by a constant factor, shifted with respect to the center frequency of the corresponding subband or may be depending on a combination of both modifications.

A complex-valued calculator 170, 310 may be constructed or implemented based on real-value calculators. For instance, for a complex-valued calculator an efficient implementation can in principle be used for both, the cosine- and the sine-modulated part of a filterbank representing the real and the imaginary part of a complex-valued component. This means that it is possible to implement both, the cosine-modulated part and the sine-modulated part based on, for instance, the modified DCT-IV- and DST-IV-structures.

Moreover, further implementations might employ the use of a FFT (FFT=Fast Fourier Transform) optionally being implemented jointly for both, the real part and the part of the complex-modulated calculators using one FFT or instead using one separate FFT stage for each transform.

Mathematical Description

The following sections will describe an example of the embodiments of an analysis filterbank and the synthesis filterbank with multiple overlaps of 8 blocks to the part, which do not cause further delay, as explained above, and one block to the future, which causes the same delay as for a MDCT/MDST-structure (MDCT=Modified Discrete Cosine Transform; MDST=Modified Discrete Sine Transform). In other words, in the following example, the parameter T is equal to 10.

First, a description of a complex-modulated low-delay analysis filterbank will be given. As illustrated in FIG. 1, the analysis filterbank 100 comprises the transformation steps of an analysis windowing performed by the analysis windower 110 and an analysis modulation performed by the calculator 170. The analysis windowing is based on the equation $$z_{i,n}=w(10N-1-n)\cdot x_{i,n} \text{ for } 0\le n\le 10\cdot N, \tag{1}$$

wherein, $z_{i,n}$ is the (real-valued) windowed sample corresponding to the block index i and the sample index n of the frame 150 shown in FIG. 1. The value $x_{i,n}$ is the (real-valued) time input sample corresponding to the same block index i and sample index n. The analysis window function 190 is represented in equation (1) by its real-valued window coefficients w(n), wherein n is also the window coefficient index in the range indicated in equation (1). As already previously explained, the parameter N is the number of samples in one block 220, 130, 160, 180.

From the arguments of the analysis window function w(10N−1−n) can be seen that the analysis window function represents a flipped version or a time-reversed version of the synthesis window function, which is actually represented by the window coefficient w(n).

The analysis modulation carried out by the calculator 170 in the embodiment shown in FIG. 1, is based on the two equations $$X_{Real,i,k} = 2\cdot\sum_{n=-8N}^{2N-1} z_{i,n}\cos\left(\frac{\pi}{N}(n+n_0)\left(k+\frac{1}{2}\right)\right) \tag{2}$$

and $$X_{Imag,i,k} = 2\cdot\sum_{n=-8N}^{2N-1} z_{i,n}\sin\left(\frac{\pi}{N}(n+n_0)\left(k+\frac{1}{2}\right)\right) \tag{3}$$

for the spectral coefficient index or band index k being an integer in the range of $$0\le k\le N. \tag{4}$$

The values $X_{Real,i,k}$ and $X_{imag,i,k}$ represent the real part and the imaginary part of the complex-valued audio subband value corresponding to the block index i and the spectral coefficient index k of block 180. The parameter $n_0$ represents an index option, which is equal to $$n_0=-N/2+0.5. \tag{5}$$

The corresponding complex-modulated low-delay synthesis filterbank comprises the transformation steps of a synthesis modulation, a synthesis windowing and an overlap-add as will be described.

The synthesis modulation is based on the equation $$x'_{i,n} = \frac{1}{N}\cdot\left[\begin{array}{l}\sum_{k=0}^{N-1} X_{Real,i,k}\cos\left(\frac{\pi}{N}(n+n_0)\left(k+\frac{1}{2}\right)\right)+\\ \sum_{k=0}^{N-1} X_{Imag,i,k}\sin\left(\frac{\pi}{N}(n+n_0)\left(k+\frac{1}{2}\right)\right)\end{array}\right] \tag{6}$$

wherein $x'_{i,n}$ is an intermediate time-domain sample of the frame 330 corresponding to the sample index n and the block index i. Once again the parameter N is an integer indicating the length of the block 320, 340, 390, 410, which is also referred to as transform block length or, due to the block-wise structure of the frames 330, 380, as an offset to the previous block. Also the further variables and parameters have been introduced above, such as the spectral coefficient index k and the offset $n_0$.

The synthesis windowing carried out by the synthesis windower 360 in the embodiment shown in FIG. 2a is based on the equation $$z'_{i,n}=w(n)\cdot x'_{i,n} \text{ for } 0\le n\le 10\cdot N, \tag{7}$$

wherein $z'_{i,n}$ is the value of the windowed intermediate time-domain sample corresponding to the sample index n and the block index i of the frame 380.

The transformation stamp of the overlap-add is based on the equation $$out_{i,n}=z'_{i,n}+z'_{i-1,n+N}+z'_{i-2,n+2N}+z'_{i-3,n+3N}+z'_{i-4,n+4N}+z'_{i-5,n+5N}+z'_{i-6,n+6N}+z'_{i-7,n+7N}+z'_{i-8,n+8N}+z'_{i-9,n+9N}, \tag{8}$$

for $0\le n<N$ wherein $out_{i,n}$ represents the time-domain (output) sample corresponding to the sample index n and the block index i. Equation (8), hence illustrates the overlap-add operation as carried out the overlap-adder output stage 400 as illustrated in the lower part of FIG. 2b.

However, embodiments according to the present invention are not limited to complex-modulated low-delay filterbanks allowing for an audio signal processing with one of these filterbanks. A real-valued implementation of a low-delay filterbank for an enhanced low-delay audio coding can also be implemented. As a comparison, for instance, equations (2) and (6) in terms of a cosine-part reveals, the cosine-contribution of the analysis modulation and the synthesis modulation show a comparable structure when considering that of a MDCT. Although the design method in principle allows an extension of the MDCT in both directions concerning time, only an extension of E (=T−2) blocks to the past is applied here, where each of the T blocks comprises N samples. The frequency coefficient $X_{i,k}$ of band k and block i inside an N-channel or N-band analysis filterbank can be summarized by $$X'_{i,k} = -2\sum_{n=-E\cdot N}^{2N-1} w_a(n)\cdot x(n)\cdot\cos\left(\frac{\pi}{N}\left(n+\frac{1}{2}-\frac{N}{2}\right)\left(k+\frac{1}{2}\right)\right) \tag{9}$$

for the spectral coefficient index k as defined by equation (4). Here, once again n is a sample index and $w_a$ is the analysis window function.

For the sake of completeness, the previously given mathematical description of the complex-modulated low-delay analysis filterbank can be given in the same summarizing form as equation (9) by exchanging the cosine-function with the complex-valued exponential-function. To be more precise, with the definition and variables given above, the equations (1), (2), (3) and (5) can be summarized and extended according to $$X'_{i,k} = -2\sum_{n=-E\cdot N}^{2N-1} w_a(n)\cdot x(n)\cdot \exp\left(j\cdot\frac{\pi}{N}\left(n+\frac{1}{2}-\frac{N}{2}\right)\left(k+\frac{1}{2}\right)\right), \tag{10}$$

wherein in contrast to the equations (2) and (3), the extension of 8 blocks into the past has been replaced by the variable E(=8).

The steps of the synthesis modulation and the synthesis windowing, as described for the complex case in equations (6) and (7), can be summarized in the case of a real-valued synthesis filterbank. The frame 380 of windowed intermediate time-domain samples, which is also referred to as the demodulated vector, is given by $$z'_{i,n} = -\frac{1}{N}\sum_{k=0}^{N-1} w_s(n)\cdot X_{i,k}\cos\left(\left(\frac{\pi}{N}\left(n+\frac{1}{2}-\frac{N}{2}\right)\left(k+\frac{1}{2}\right)\right)\right), \tag{11}$$

wherein $z'_{i,n}$ is the windowed intermediate time-domain sample corresponding to the band index i and the sample index n. The sample index n is once again an integer in the range of $$0\le n\le N(2+E)=N\cdot T \tag{12}$$

and $w_s(n)$ is the synthesis window, which is compatible with the analysis window $w_a(n)$ of equation (9).

The transformation step of the overlap-add is then given by $$x'_{i,n} = \sum_{l=(E+1)}^{0} z'_{i+l,n-l\cdot N} \tag{13}$$

wherein $x'_{i,n}$ is the reconstructed signal, or rather a time-domain sample of the block 410 as provided by the overlap-add output stage 400 shown in FIG. 2a.

For the complex-valued synthesis filterbank 300, the equations (6) and (7) can be summarized and generalized with respect to the extension of E(=8) blocks to the path according to $$z'_{i,n} = -\frac{1}{N}\sum_{k=0}^{N-1} w_s(n)\cdot \mathrm{Re}\left(X_{i,k}\exp\left(-j\cdot\left(\frac{\pi}{N}\left(n+\frac{1}{2}-\frac{N}{2}\right)\left(k+\frac{1}{2}\right)\right)\right)\right), \tag{14}$$

wherein $j=\sqrt{-1}$ is the imaginary unit. Equation (13) represents the generalized from of equation (8) and is also valid for the complex-valued case.

As a direct comparison of equation (14) with equation (7) shows, the window function w(n) of equation (7) is the same synthesis window function as $w_s(n)$ of equation (14). As outlined before, the similar comparison of equation (10) with the analysis window function coefficient $w_a(n)$ with equation (1) shows that the analysis window function is the time-reversed version of the synthesis window function in the case of equation (1).

As both, an analysis filterbank 100 as shown in FIG. 1 and a synthesis filterbank 300 as shown in FIG. 2a offer a significant improvement in terms of a trade-off between the delay on the one hand and the quality of the audio process on the other hand, the filterbanks 100, 300 are often referred to as low-delay filterbanks. The complex-valued version thereof is sometimes referred to as complex-low-delay filterbank, which is abbreviated by CLDFB. Under some circumstances, the term CLDFB is not only used for the complex-valued version but also for the real-valued version of the filterbank.

As the previous discussion of the mathematical background has shown, the framework used for implementing the proposed low-delayed filterbanks utilizes a MDCT- or IMDCT-like (IMDCT=Inverse MDCT) structure, as known from the MPEG-4 Standard, using an extended overlap. The additional overlap regions can be attached in a block-wise fashion to the left as well as to the right side of the MDCT-like core. Here, only the extension to the right side (for the synthesis filterbank) is used, which works from past samples only and therefore does not cause any further delay.

The inspection of the equations (1), (2) and (14) has shown that the processing is very similar to that of a MDCT or IMDCT. By only slight modifications comprising a modified analysis window function and synthesis window function, respectively, the MDCT or IMDCT is extended to a modulated filterbank that is able to handle multiple overlaps and is very flexible concerning its delay. As for instance, equations (2) and (3) have shown the complex version is in principle obtained by simply adding a sine-modulated to the given cosine-modulation.

Interpolation

As outlined in the context of FIGS. 1 and 2a, both, the analysis windower 110 and the synthesis windower 360 or the respective filterbanks 100, 300 are adapted to windowing the respective frames of time-domain samples by multiplying each of the respective time-domain audio samples with an individual window coefficient. Each of the time-domain samples is, in other words, multiplied by an (individual) window coefficient, as for instance equations (1), (7), (9), (10), (11), and (14) have demonstrated. As a consequence, the number of window coefficients of the respective window function is typically identical to the number of respective time-domain audio samples.

However, under certain implementational circumstances, it may be advisable to implement a window function having a larger second number of window coefficients compared to the actual window function having a smaller first number of coefficients, which is actually used during the windowing of the respective frame or sequence of time-domain audio samples. This may for instance be advisable in the case when memory requirements of a specific implementation may be more valuable than computational efficiency. A further scenario in which a downsampling of the window coefficients might become useful is in the case of the so-called dual rate approach, which is for instance employed in the framework of SBR systems (SBR=Spectral Band Replication). The concept of SBR will be explained in more detail in the context of FIGS. 5 and 6.

In such a case, the analysis windower 110 or the synthesis windower 360 may be further adapted such that the respective window function used for windowing the time-domain audio samples provided to the respective windower 110, 360 is derived by an interpolation of window coefficients of the larger window function having a larger second number of window coefficients.

The interpolation can for instance be carried out by a linear, polynomial or spline-based interpolation. For instance, in the case of the linear interpolation, but also in the case of a polynomial or spline-based interpolation, the respective windower 100, 360 may then be capable of interpolating the window coefficients of the window function used for windowing based on two consecutive window coefficients of the larger window function according to a sequence of the window coefficients of the larger window function to obtain one window coefficient of the window function.

Especially in the case of an even number of time-domain audio samples and window coefficients, an implementation of an interpolation as previously described, results in a significant improvement of the audio quality. For instance, in the case of an even number N·T of time-domain audio samples in one of the frames 120, 330, not using an interpolation, for instance, a linear interpolation, will result in severe aliasing effects during the further processing of the respective time-domain audio samples.

FIG. 3 illustrates an example of a linear interpolation based on a window function (an analysis window function or a synthesis window function) to be employed in context with frames comprising N·T/2 time-domain audio samples. Due to memory restraints or other implementational details, the window coefficients of the window function itself are not stored in a memory, but a larger window function comprising N T window coefficients are stored during appropriate memory or are available otherwise. FIG. 3 illustrates in the upper graph, the corresponding window coefficients c(n) as a function of the window coefficient indices n in the range between 0 and N·T−1.

Based on a linear interpolation of two consecutive window coefficients of the window function having the larger number of window coefficients, as depicted in the upper graph of FIG. 3, an interpolated window function is calculated based on the equation $$ci[n] = \frac{1}{2}(c[2n] + c[2n+1]) \quad \text{for } 0 \le n < N \cdot T/2. \tag{15}$$

The number of interpolated window coefficients ci(n) of the window function to be applied to a frame having N·T/2 time-domain audio samples comprise half the number of window coefficients.

To illustrate this further, in FIG. 3 window coefficients 450-0, . . . , 450-7 are shown in the upper part of FIG. 3 corresponding to a window coefficient c(0), . . . , c(7). Based on these window coefficients and the further window coefficients of the window function, an application of equation (15) leads to the window coefficients ci(n) of the interpolated window function depicted in the lower part of FIG. 3. For instance, based on the window coefficients 450-2 and 450-3, the window coefficient 460-1 is generated based on equation (15), as illustrated by the arrows 470 in FIG. 3. Accordingly, the window coefficient 460-2 of the interpolated window function is calculated based on the window coefficient 450-4, 450-5 of the window function depicted in the upper part of FIG. 3. FIG. 3 shows the generation of further window coefficients ci(n).

To illustrate the aliasing cancellation achievable by the interpolated downsampling of the window function, FIG. 4 illustrates the interpolating of the window coefficients in the case of a sine window function, which can, for instance, be employed in a MDCT. For the sake of simplicity, the left half of the window function and the right half of the window function are drawn over each other. FIG. 4 shows a simplified version of a sine window, comprising only 2·4 window coefficients or points for a MDCT having a length of 8 samples.

FIG. 4 shows four window coefficients 480-1, 480-2, 480-3 and 480-4 of the first half of the sine window and four window coefficients 490-1, 490-2, 490-3 and 390-4 of the second half of the sine window. The window coefficient 490-1, . . . , 490-4 corresponds to the window coefficient indices 5, . . . , 8. The window coefficients 490-1, . . . , 490-4 correspond to the second half of the length of the window function such that to the indices given N'=4 is to be added to obtain the real indices.

To reduce or even to achieve the cancellation of the aliasing effects as described before, the window coefficient should fulfill the condition $$w(n)\cdot(N'-1-n)=w(N'+n)\cdot w(2N'-1-n) \tag{16}$$

as good as possible. The better relation (16) is fulfilled, the better the alias suppression or alias cancellation is.

Assuming the situation that a new window function having half the number of window coefficients is to be determined for the left half of the window function, the following problem arises. Due to the fact that the window function comprises an even number of window coefficients (even numbered downsampling), without employing an interpolation scheme as outlined in FIG. 3, the window coefficients 480-1 and 480-3 or 480-2 and 480-4 correspond to only one aliasing value of the original window function or original filter.

This leads to an unbalanced proportion of spectral energy and leads to an unsymmetrical redistribution of the center point (center of mass) of the corresponding window function. Based on the interpolation equation (15) for the window coefficient w(n) of FIG. 4, the interpolated values $I_1$ and $I_2$ fulfill the aliasing relation (16) far better, and will hence lead to a significant improvement concerning the quality of the processed audio data.

However, by employing an even more elaborate interpolation scheme, for instance a spline-based or another similar interpolation scheme, might even result in window coefficients, which fulfill the relation (16) even better. A linear interpolation is in most cases sufficient and enables a fast and efficient implementation.

The situation in the case of a typical SBR system employing a SBR-QMF filterbank (QMF=Quadrature Mirror Filter), a linear interpolation or another interpolation scheme does not need to be implemented as the SBR-QMF prototype filter comprises an odd number of prototype filter coefficients. This means that the SBR-QMF prototype filter comprises a maximum value with respect to which the downsampling can be implemented so that the symmetry of the SBR-QMF prototype filter remains intact.

Figure 5:
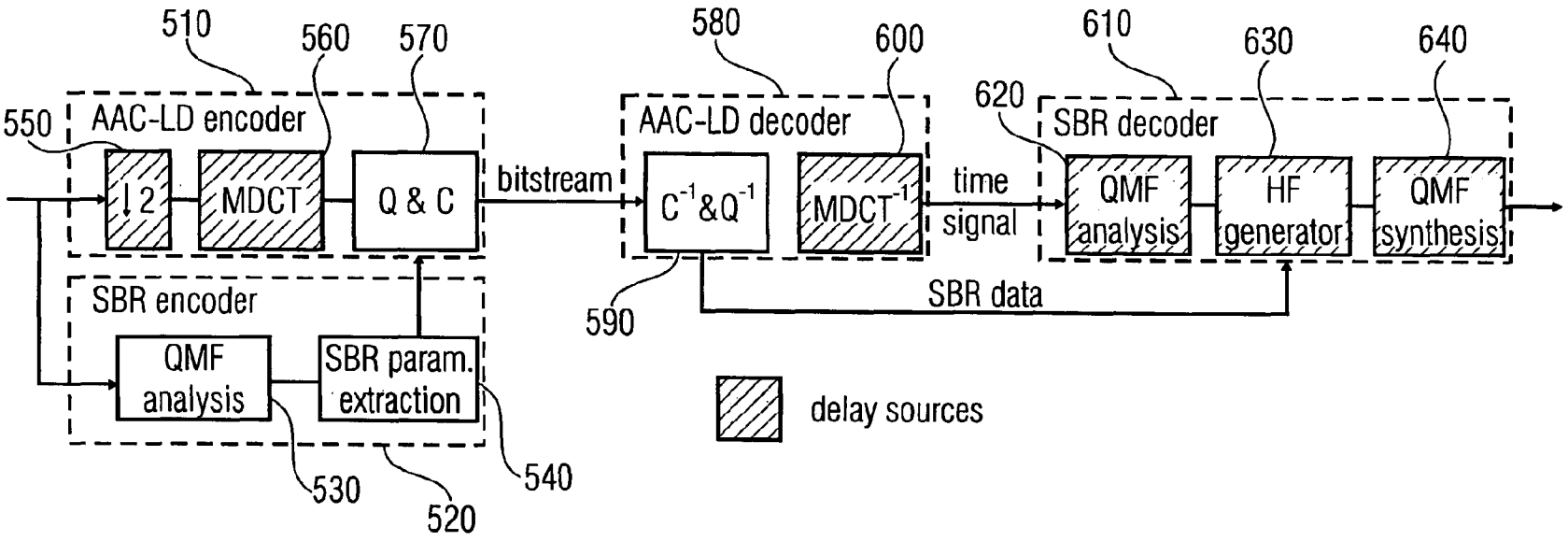
FIG. 5 shows a block diagram of an embodiment of the present invention comprising a SBR decoder and a SBR encoder.
Figure 6:
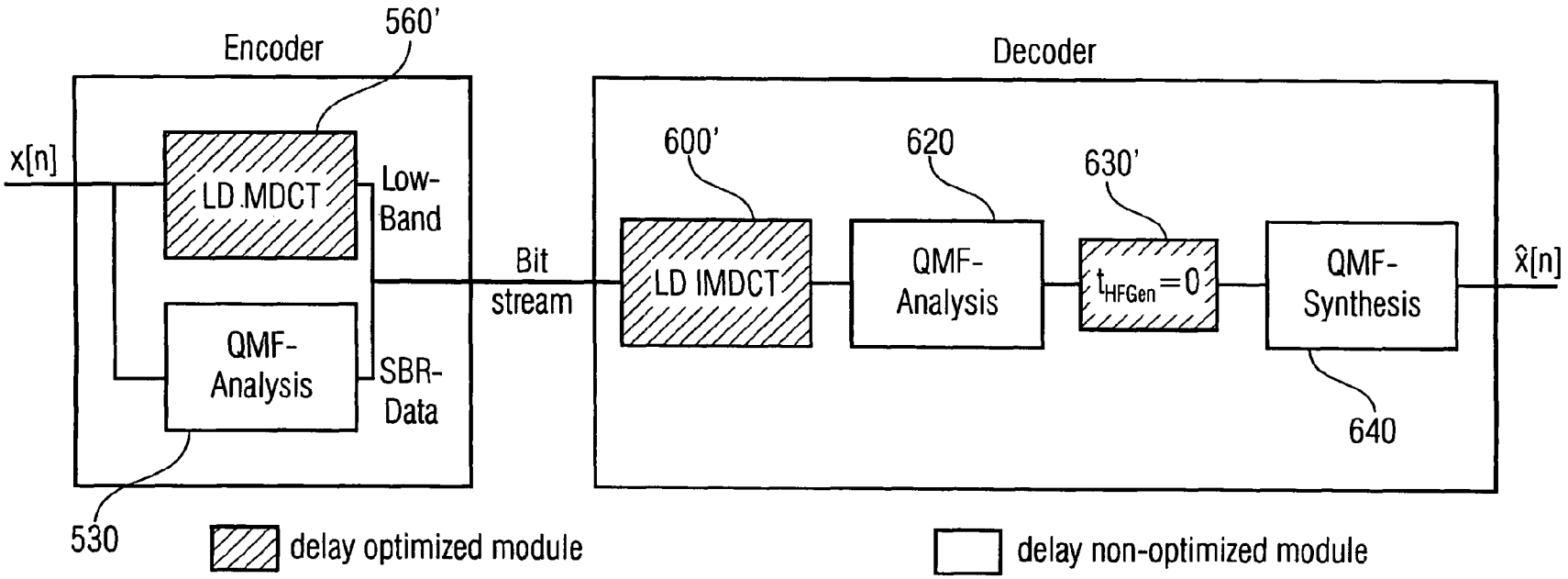
FIG. 6 illustrates the delay sources of a SBR system.

In FIGS. 5 and 6, a possible application for embodiments according to the present invention in the form of both, an analysis filterbank and a synthesis filterbank will be described. One important field of application is a SBR system or SBR tool (SBR=Spectral Band Replication). However, further applications of embodiments according to the present invention may come from other fields, in which a need for spectral modifications (e.g. gain modifications or equalizations) exists, such as spatial audio object coding, low-delay parametric stereo coding, low-delayed spatial/surround coding, frame loss concealment, echo cancellation or other corresponding applications.

The basic idea behind SBR is the observation that usually a strong correlation between the characteristics of a high frequency range of a signal, which will be referred to as the so-called highband signal, and the characteristics of the lowband frequency range, further referred to as the lowband or lowband signals, of the same signal is present. Thus, a good approximation for the representation of the original input signal highband can be achieved by a transposition from the lowband to the highband.

In addition to the transposition, the reconstruction of the highband incorporates shaping of spectral envelope, which comprises an adjustment of the gains. This process is typically controlled by a transmission of the highband spectral envelope of the original input signal. Further guidance information sent from the encoder control further synthesis modules, such as an inverse filtering, a noise and sine addition in order to cope with audio material when transposition alone might not be sufficient. Corresponding parameters comprise the parameters "noise highband" for the addition of noise and the parameter "tonalities highband" for the sine addition. These guidance information is usually referred to as SBR data.

The SBR process can be combined with any conventional waveform or codec by means of a pre-process at the encoder side and the post-process at the decoder side. The SBR encodes the high frequency portion of an audio signal at a very low cost whereas the audio codec is used to code the lower frequency portion of the signal.

At the encoder side, the original input signal is analyzed, the highband spectral envelope and its characteristics in relation to the lowband are encoded and the resulting SBR data is multiplexed with a bitstream from the codec for the lowband. At the decoder side, the SBR data is first demultiplexed. The decoding process is organized generally into steps. First, the core decoder generates the lowband and, second, the SBR decoder operates as a post processor using the decoded SBR data to guide the spectral band replication process. A full bandwidth output signal is then obtained.

To obtain a coding efficiency as high as possible, and to keep the computational complexity low, SBR enhanced codecs are often implemented as so-called dual rate systems. Dual rate means that the band limited core codec is operating at half the external audio sampling rate. In contrast, the SBR part is processed at the full sampling frequency.

FIG. 5 shows a schematic block diagram of a SBR system 500. The SBR system 500 comprises for instance an AAC-LD encoder (AAC-LD=Advanced Audio Codec Low-delay) 510 and a SBR encoder 520 to which the audio data to be processed are provided in parallel. The SBR encoder 520 comprises an analysis filterbank 530, which is shown in FIG. 5 as QMF analysis filterbank. The analysis filterbank 530 is capable of providing subband audio values corresponding to subbands based on the audio signals provided to the SBR system 500. These subband audio values are then provided to a SBR parameter extraction module 540, which generates the SBR data as previously described, for instance comprising the spectral envelope for the highband, the highband noise parameter and the highband tonality parameter. These SBR data are then provided to the AAC-LD encoder 510.

The AAC-LD encoder 510 is in FIG. 5 shown as a dual rate encoder. In other words, the encoder 510 operates at half the sampling frequency compared to the sampling frequency of the audio data provided to the encoder 510. To facilitate this, the AAC-LD encoder 510 comprises a downsampling stage 550, which optionally may comprise a low pass filter to avoid distortions caused by, for instance, a violation of the Nyquist-Shannon Theory. The downsampled audio data as output by the downsampling stage 550 are then provided to an encoder 560 (analysis filterbank) in the form of a MDCT filterbank. The signals provided by the encoder 560 are then quantized and coded in the quantization and coding stage 570. Moreover, the SBR data as provided by the SBR parameter extraction module 540 is also encoded to obtain a bitstream, which will then be output by the ACC-LD encoder 510. The quantization and coding stage 570 can, for instance, quantize the data according to the listing properties of the human ear.

The bitstream is then provided to an AAC-LD decoder 580, which is part of the decoder side to which the bitstream is transported. The AAC-LD decoder comprises a decoding and dequantization stage 590, which extracts the SBR data from the bitstream and the dequantized or requantized audio data in the frequency-domain representing the lowband. The lowband data are then provided to a synthesis filterbank 600 (inverse MDCT filterbank). The inverse MDCT stage ($MDCT^{-1}$) 600 converts the signals provided to the inverse MDCT stage from the frequency-domain into the time-domain to provide a time signal. This time-domain signal is then provided to SBR decoder 610, which comprises an analysis filterbank 620, which is shown in FIG. 5 as a QMF analysis filterbank.

The analysis filterbank 620 performs a spectral analysis of the time signal provided to the analysis filterbank 620 representing the lowband. These data are then provided to a high frequency generator 630, which is also referred to as a HF generator. Based on the SBR data provided by the AAC-LD coder 580 and its decoding and dequantization stage 590, the HF generator 630 generates the highband based on the lowband signals provided by the analysis filterbank 620. Both, the lowband and the highband signals are then provided to a synthesis filterbank 640, which transfers the lowband and highband signals from the frequency-domain into the time-domain to provide a time-domain audio output signal form the SBR system 500.

For the sake of completeness, it should be noted that in many cases the SBR system 500 as shown in FIG. 5 is not implemented in this way. To be more precise, the AAC-LD encoder 510 and the SBR encoder 520 are usually implemented on the encoder side, which is usually implemented separately from the decoder side comprising the AAC-LD decoder 580 and the SBR decoder 610. In other words, the system 500 shown in FIG. 5 essentially represents the connection of two systems, namely an encoder comprising the aforementioned encoders 510, 520 and a decoder comprising the aforementioned decoders 580, 610.

Embodiments according to the present invention in the form of analysis filterbanks 100 and synthesis filterbanks 300 may for instance be implemented in the system 500 shown in FIG. 5, as a replacement of the analysis filterbank 530, the analysis filterbank 620 and the synthesis filterbank 640. In other words, synthesis or analysis filterbanks of the SBR components of the system 500 may, for instance, be replace by corresponding embodiments according to the present invention. Moreover, the MDCT 560 and the inverse MDCT 600 may also be replaced by low-delay analysis and synthesis filterbanks, respectively. In this case, if all the described replacements have been implemented, the so-called enhanced low-delay AAC codec (codec=coder-decoder) will be realized.

The enhanced low-delay AAC (AAC-ELD) aims at combining the low-delay features of an AAC-LD (Advanced Audio Codec-Low-delay) with a high coding efficiency of HE-AAC (High Efficiency Advanced Audio Codec) by utilizing SBR with AAC-LD. The SBR decoder 610 acts in this scenario as a post-processor, which is supplied after the core decoder 580 including a complete analysis filterbank and a synthesis filterbank 640. Therefore, the components of the SBR decoder 610 add further decoding delay, which is illustrated in FIG. 5 by the shading of the components 620, 630, 540.

In many implementations of SBR systems 500, the lower frequency part or lowband ranges typically from 0 kHz to typically 5-15 kHz and is coded using a waveform coder, referred to as core codec. The core codec may for instance be one of the MPEG audio codec family. Additionally, a reconstruction of the high frequency part or highband is accomplished by a transition of the lowband. The combination of SBR with a core coder is in many cases implemented as a dual rate system, where the underlying AAC encoder/decoder is operated at half the sampling rate of the SBR encoder/decoder.

The majority of the control data is used for the spectral envelope representation, which has a varying time and frequency resolution to be able to control the SBR process as best as possible with as little bitrate overhead as possible. The other control data mainly strives to control the tonal-to-noise ratio of the highband.

As shown in FIG. 5, the output from the underlying AAC decoder 580 is typically analyzed with a 32-channel QMF filterbank 620. Then, the HF-generator module 630 recreates the highband by patching QMF subbands from the existing lowband to the highband. Furthermore, inverse filtering is done on a per subband basis, based on the control data obtained from the bitstream (SBR data). The envelope adjuster modifies the spectral envelope of the regenerated highband and adds additional components such as noise and sinusoids are added according to the control data in the bitstream. Since all operations are done in the frequency-domain (also known as QMF or subband domain), the final step of the decoder 610 is a QMF synthesis 640 to retain a time-domain signal. For instance, in the case that the QMF analysis on the encoder side is done on a 32 QFM subband system for 1024 time-domain samples, the high frequency reconstruction results in 64-QMF subbands upon which the synthesis is done producing 2048 time-domain samples, so that an upsampling by a factor of 2 is obtained.

In addition, the delay of the core coder 510 is doubled by operating at half of the original sampling rate in the dual rate mode, which gives rise to additional sources of delay in both, the encoder and the decoder process of a AAC-LD in combination with SBR. In the following, such delay sources are examined and their associated delay is minimized.

FIG. 6 shows a simplified block diagram of the system 500 shown in FIG. 5. FIG. 6 concentrates on delay sources in the encoder/decoder process using SBR and low-delay filterbanks for coding. Comparing FIG. 6 with FIG. 5, the MDCT 560 and the inverse MDCT 600 have been replaced by delay optimized modules, the so-called low-delay MDCT 560' (LD MDCT) and the low-delay inverse MDCT 600' (LD IMDCT). Moreover, the HF-generator 630 has also been replaced by a delay optimized module 630'.

Apart from the low-delay MDCT 560' and the low-delay inverse MDCT 600', a modified SBR framing and a modified HF generator 630' are employed in the system shown in FIG. 6. In order to avoid delay by different framing of a core coder/decoder 560, 600 and the respective SBR modules, the SBR framing is adapted to fit the framing length of 480 or 512 samples of the AAC-LD. Furthermore, the variable time grid of the HF generator 630, which implies 384 samples of delay, is restricted regarding the spreading of SBR data over adjacent AC-LD frames. Thus, the only remaining sources of delay in the SBR module are the filterbanks 530, 620 and 640.

According to the situation depicted in FIG. 6, representing a partial implementation of the AAC-ELD codec, some delay optimizations have already been implemented including the use of a low-delay filterbank in the AAC-LD core and the removal of a previously mentioned SBR overlap. For further delay improvements, the remaining modules need to be investigated. FIG. 6 shows the delay sources in the encoder/decoder process using SBR and the low-delay filterbanks called LD-MDCT and LD-IMDCT here. Compared to FIG. 5, in FIG. 6 every box represents a delay source, wherein the delay optimize modules are drawn in a shaded manner. The like modules have not been optimized for low-delay so far.

Figure 7A:
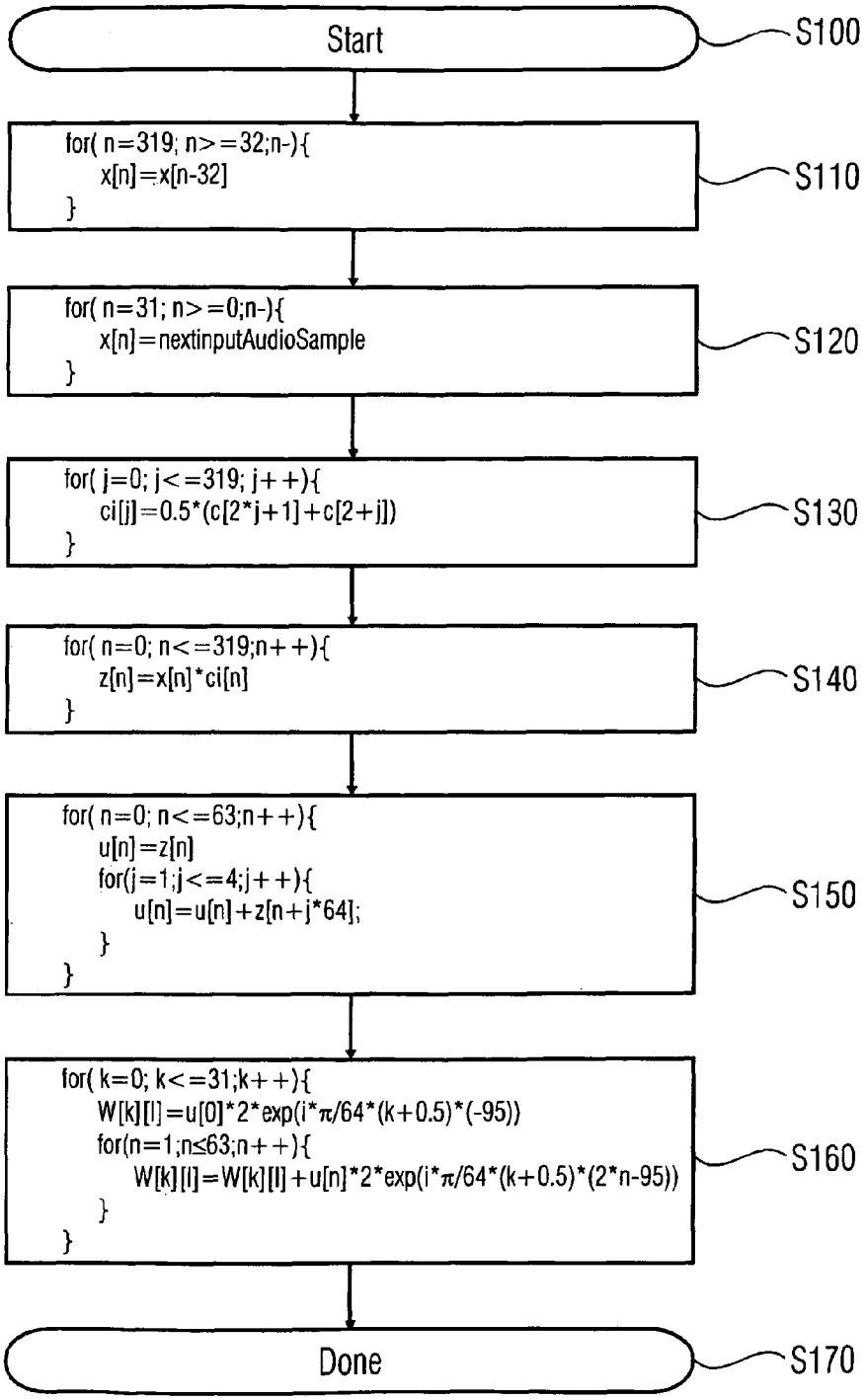
FIG. 7a shows a flowchart of an embodiment of a method for generating audio subband values.

FIG. 7a illustrates a flowchart comprising a C- or C++-pseudo code to illustrate an embodiment according to the present invention in the form of an analysis filterbank or a corresponding method for generating audio subband values in audio subband channels. To be even more precise, FIG. 7a represents a flowchart of a complex-valued analysis filterbank for 32 bands.

As outlined before, the analysis filterbank is used to split the time-domain signal, for instance output from the core coder into N=32 subband signals. The output from the filterbank, the subband samples or audio subband values, are in the case of a complex-valued analysis filterbank complex-valued and thus oversampled by a factor of 2, compared to a real-value filterbank. The filtering involves and comprises the following steps, wherein an array x(n) comprises exactly 320 time-domain samples. The higher the index of the samples n into the array is, the older the samples are.

After a start of the embodiments of the method in step S100, first, the samples in the array x(n) are shifted by 32 positions in step S110. The oldest 32 samples are discarded and 32 new samples are stored in positions 31 to 0 in step S120. As shown in FIG. 7a, the incoming time-domain audio samples are stored in positions corresponding to a decreasing index n in the range of 31 to 0. This results in a time-reversal of the samples stored in the corresponding frame or vector so that reversing the index of the window function to obtain the analysis window function based on the (equally long) synthesis window function has already been taken care of.

During a step S130, window coefficients ci(j) are obtained by a linear interpolation of the coefficients c(j) based on equation (15). The interpolation is based on a block size (block length or number of subband values) of N=64 values and based on a frame comprising T=10 blocks. Hence, the index of the window coefficients of the interpolated window function are in the range between 0 and 319 according to equation (15). The window coefficients c(n) are given in the table in Annex 1 of the description. However, depending on implementational details, to obtain the window coefficients based on the values given in the tables in the Annexes 1 and 3, additional sign changes with respect to the window coefficients corresponding to the indices 128 to 255 and 384 to 511 (multiplication with factor (−1)) should be considered.

In these cases, the window coefficients w(n) or c(n) to be used may be obtained according to $$w(n)=w_{table}(n)\cdot s(n) \tag{16a}$$

with the sign switching function s(n) according to $$s(n)=\begin{cases}-1 & \text{for } 128\le n\le 255 \text{ and } 284\le n\le 511\\ +1 & \text{else}\end{cases} \tag{16b}$$

for n=0 to 639, wherein $w_{table}(n)$ are the values given in the tables in the Annexes.

However, the window coefficients do not need to be implemented according to the table in Annex 1 to obtain, for instance, the already described reduction of delay. To achieve this reduction of delay, while maintaining the quality level of the processed audio data, or to achieve another trade-off, the window coefficients c(n) for the window coefficient index n in the range between 0 and 639, may fulfill one of the sets of relations as given in one of the Annexes 2 to 4. Moreover, it should be noted that also other window coefficients c(n) may be employed in embodiments according to the present invention. Naturally, also other window functions comprising a different number of window coefficients than 320 or 640 can be implemented, although the tables in the Annexes 1 to 4 only apply to window functions having 640 window coefficients.

The linear interpolation according to S130 leads to a significant quality improvement and aliasing effects reduction or cancellation in the case of a window function comprising an even number of window coefficients. It should further be noted that the complex unit is not j as in the equations (1), (2) and (16), but is denoted by $i=\sqrt{-1}$.

In step S140, the samples of the array x(n) are then multiplied element-wise by the coefficients ci(n) of the interpolated window.

In step S150, the windowed samples are summed up according to the equation given in the flowchart in FIG. 7a to create the 64-element array u(n). In step S160, 32 new subband samples or audio subband values W(k,l) are calculated according to the matrix operation Mu, wherein the element of the matrix M are given by $$M(k, n) = 2 \cdot \exp\left(\frac{i \cdot \pi \cdot (k + 0.5) \cdot (2 \cdot n - 95)}{64}\right), \quad \begin{cases} 0 \le k < 32 \\ 0 \le n < 64 \end{cases}, \tag{17}$$

wherein exp( ) denotes the complex exponential function and, as previously mentioned, i is the imaginary unit. Before the loop of a flowchart ends with step S170, each of the subband values W(k,l) (=W[k][l]) may be output, which corresponds to the subband sample l in the subband having the index k. In other words, every loop in the flowchart shown in FIG. 7a produces 32 complex-valued subband values, each representing the output from one filterbank subband.

Figure 7B:
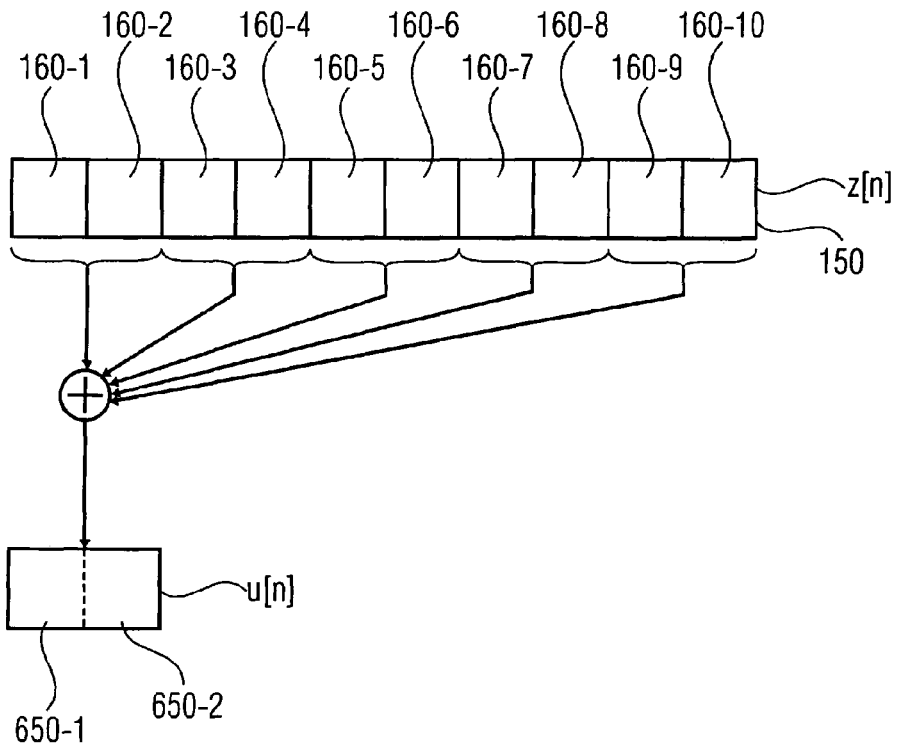

FIG. 7b illustrates the step S150 of collapsing the frame 150 of windowed time-domain audio samples comprising 10 blocks 160-1, . . . , 160-10 of windowed time-domain audio samples z(n) to the vector u(n) by a 5-fold summing of two blocks of the frame 150 each. The collapsing or retracting is done on an element-wise basis so that the windowed time-domain audio samples corresponding to the same sample index inside each of the blocks 160-1, 160-3, 160-5, 160-7 and 160-9 are added to obtain the corresponding value in the first blocks 650-1 of the vector u(n). Accordingly, based on the blocks 160-2, 160-4, 160-6, 160-8 and 160-10 the corresponding elements of the vector u(n) in block 160-2 are generated in step S150.

A further embodiment according to the present invention in the form of an analysis filterbank can be implemented as a 64-band complex low-delay filterbank. The processing of this complex low-delay filterbank as an analysis filterbank is basically similar to the analysis filterbank as described in the context of FIG. 7a. Due to the similarities and basically the same processing as described in the context of FIG. 7a, the differences between the described complex analysis filterbank for 32 bands of FIG. 7a and the complex analysis filterbank for 64 subbands will be outlined here.

Figure 7C:
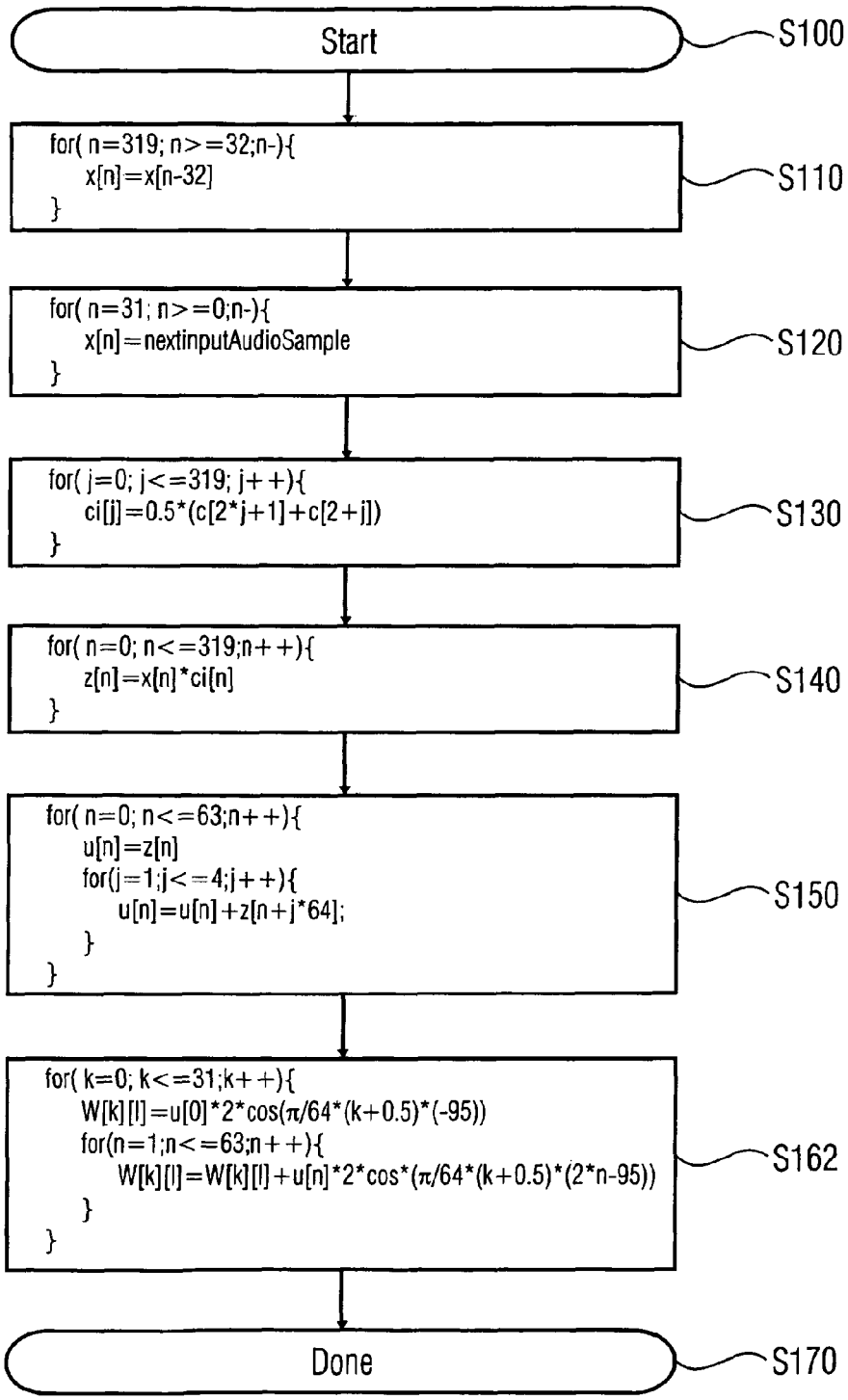
FIG. 7c shows a flowchart of an embodiment of a method for generating audio subband values.

In contrast to the 32-subband comprising analysis filterbank as shown in FIG. 7a, the vector of frame x(n) comprises, in the case of a 64-band analysis filterbank 640 elements having indices from 0-639. Hence, the step S110 is modified such that the samples in the array x(n) are shifted by 64 positions, wherein the oldest 64 samples are discarded. In step S120 instead of 32 new samples, 64 new samples are stored in the positions 63 to 0. As shown in FIG. 7c, the incoming time-domain audio samples are stored in positions corresponding to a decreasing index n in the range of 63 to 0. This results in a time-reversal of the samples stored in the corresponding frame or vector so that reversing the index of the window function to obtain the analysis window function based on the (equally long) synthesis window function has already been taken care of.

As the window c(n) used for windowing the elements of the vector of frame x(n), comprises typically 640 elements, the step S130 of linearly interpolating the window coefficients to obtain the interpolated windows ci(n) can be omitted.

Then, during step S140, the samples of the array x(n) are multiplied or windowed by use of the sequence of window coefficients c(n), which are once again based on the values in the table in Annex 1. In the case of the window coefficient c(n) are those of the synthesis window function, the windowing or multiplication of the array x(n) by the window c(n) is carried out according to the equation $$z(n)=x(n)\cdot c(n) \tag{18}$$

for an=0, . . . , 639. Once again, to achieve the low-delay properties of the window function, it is not necessitated to implement the window function exactly according to the window coefficients based on the values given in the table of Annex 1. For many applications, an implementation in which the window coefficients fulfill either set of relations as given in the tables in the Annexes 2 to 4 will be sufficient to achieve an acceptable trade-off between quality and a significant reduction of the delay. However, depending on implementational details, to obtain the window coefficients based on the values given in the tables in the Annexes 1 and 3, additional sign changes with respect to the window coefficients corresponding to the indices 128 to 255 and 384 to 511 (multiplication with factor (−1)) should be considered according to equations (16a) and (16b).

Step S150 of the flowchart shown in FIG. 7a is then replaced by a summing of the samples of the vector of frame z(n) according to the equation $$u(n) = \sum_{j=0}^{5} (n + j \cdot 128) \tag{19}$$

to create the 128-element array u(n).

Step S160 of FIG. 7a is then replaced by a step in which 64 new subband samples are calculated according to the matrix operation Mu, wherein the matrix elements of the matrix M are given by $$M(k, n) = 2 \cdot \exp\left(\frac{i \cdot \pi \cdot (k + 0.5) \cdot (2 \cdot n - 191)}{128}\right), \tag{20}$$

-continued $$\begin{cases} 0 \le k < 64 \\ 0 \le n < 128 \end{cases},$$

wherein exp( ) denotes the complex exponential function and i is as explained, the imaginary unit.

FIG. 7c illustrates a flowchart according to an embodiment of the present invention in the form of real-valued analysis filterbank for 32 subband channels. The embodiment as illustrated in FIG. 7c does not differ significantly from the embodiment shown in FIG. 7a. The main difference between the two embodiments is that step S160 of calculating the new 32 complex-valued subband audio values is replaced in the embodiment shown in FIG. 7c by a step S162 in which 32 real-valued subband audio samples are calculated according to a matrix operation $M_r u$, wherein the elements of the matrix $M_r$ are given by $$M_r(k, n) = 2 \cdot \cos\left(\frac{i \cdot \pi \cdot (k + 0.5) \cdot (2 \cdot n - 95)}{64}\right), \quad (21)$$

$$\begin{cases} 0 \le k < 32 \\ 0 \le n < 64 \end{cases},$$

As a consequence, every loop in the flowchart produces 32 real-valued subband samples wherein W(k,l) corresponds to the subband audio sample 1 of the subband k.

The real-valued analysis filterbank can for instance be employed in the framework of a low-power mode of a SBR system, as shown in FIG. 5. The low-power mode of the SBR tool differs from the high quality SBR tool mainly with respect to the fact that real-valued filterbanks are employed. This reduces the computational complexity and the computational effort by a factor of 2, so that the number of operations per time unit are essentially reduced by a factor of 2 as no imaginary part is necessitated to be calculated.

The proposed new filterbanks according to the present invention are fully compatible with the low-power mode of SBR systems. Thus, with filterbanks according to the present invention, SBR systems can still run both in the normal mode or high-quality mode with complex filterbanks and in the low-power mode with real-valued filterbanks. The real-valued filterbank may, for instance, be derived from the complex filterbank by using only the real-values (cosine-modulated contributions) and omitting the imaginary values (sine-modulated contributions).

Figure 8A:
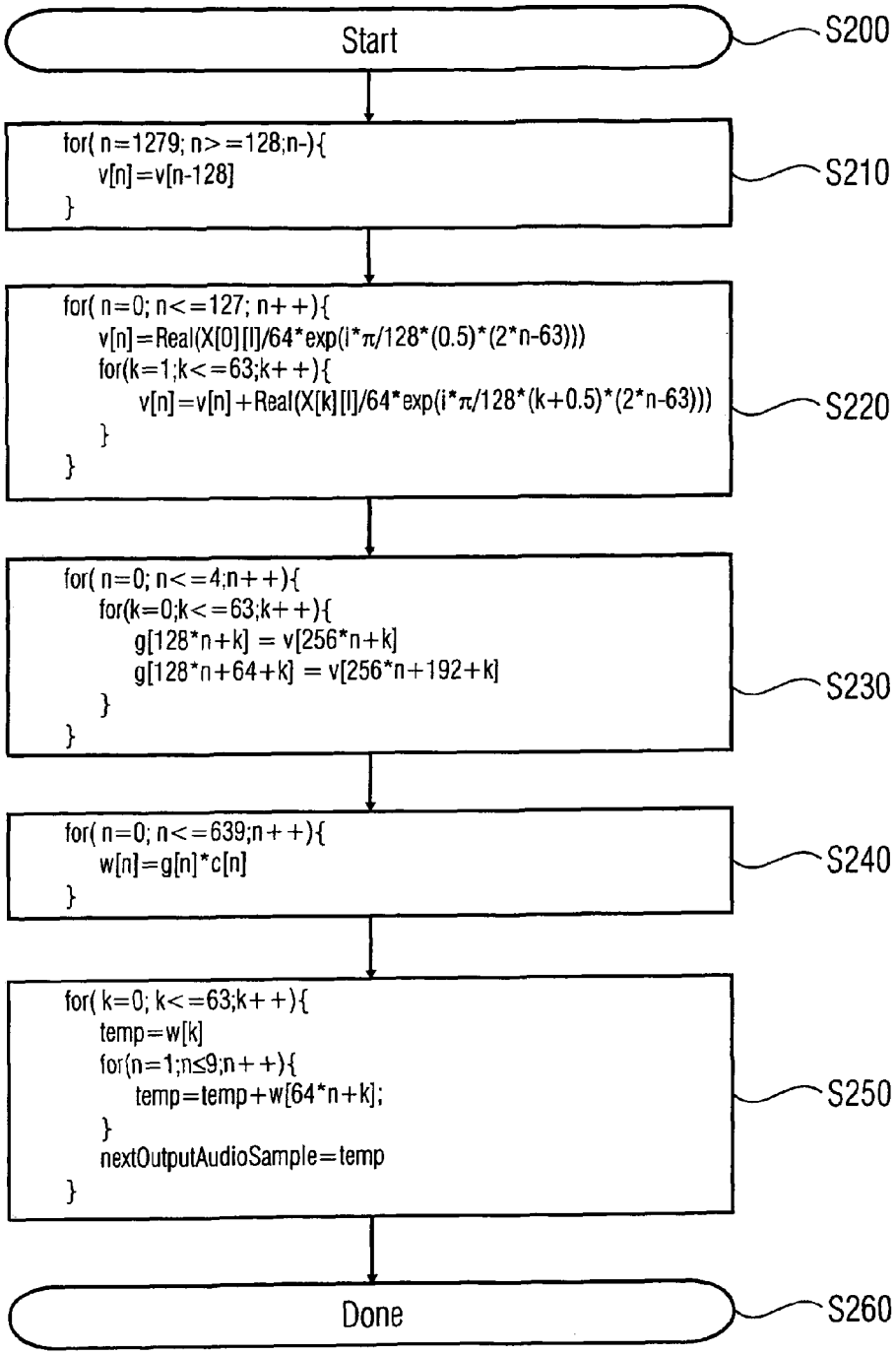
FIG. 8a shows a flowchart of a comparative example of a method for generating time-domain samples.

FIG. 8a shows a flowchart according to a comparative example of the present invention in the form of a complex-valued synthesis filterbank for 64 subband channels. As previously outlined, the synthesis filtering of the SBR-processed subband signals is achieved using a 64-subband synthesis filterbank. The output from the filterbank is a block of real-valued time-domain samples as outlined in the context of FIG. 1. The process is illustrated by the flowchart in FIG. 8a, which also illustrates a comparative example in the form of a method for generating time-domain audio samples.

The synthesis filtering comprises after a start (step S200), the following steps, wherein an array v comprises 1280 samples. In step S210, the samples in the array v are shifted by 128 positions, wherein the oldest 128 samples are discarded. In step S220, the 64 new complex-valued audio subband values are multiplied by a matrix N, wherein the matrix elements N(k,n) are given by $$N(k, n) = \frac{1}{64} \exp\left(\frac{i \cdot \pi \cdot (k + 0.5) \cdot (2 \cdot n - 63)}{128}\right), \quad (22)$$

$$\begin{cases} 0 \le k < 64 \\ 0 \le n < 128 \end{cases},$$

wherein exp( ) denotes the complex exponential function and is the imaginary unit. The real part of the output from this operation is stored in the position 0-127 of array v, as illustrated in FIG. 8a.

In step S230, the samples, which are now in the time-domain are extracted from the array v according to the equation given in FIG. 8a to create a 640-element array g(n). In step S240, the real-valued samples in the time-domain of array g are multiplied by the window coefficient c(n) to produce an array w, wherein the window coefficients are once again the window coefficients based on the values given in the table in Annex 1.

However, as outlined before, the window coefficients do not need to be exactly based on the values given in table of Annex 1. It is in different comparative examples sufficient, if the window coefficients satisfy one of the sets of relations as given in the tables of Annexes 2 to 4, to achieve the desired low-delay property of the synthesis filterbank. Moreover, as explained in the context of the analysis filterbank, also other window coefficients may be utilized in the framework of the synthesis filterbank. However, depending on implementational details, to obtain the window coefficients based on the values given in the tables in the Annexes 1 and 3, additional sign changes with respect to the window coefficients corresponding to the indices 128 to 255 and 384 to 511 (multiplication with factor (−1)) should be considered.

In step S250, 64 new output samples are calculated by a summation of samples from the array w(n) according to the last step and the formula given in the flowchart of FIG. 8a, before one loop of a flowchart ends in step S260. In the flowchart as shown in FIG. 8a, X[k] [l] (=X(k,l)) corresponds to audio subband value l in the subband having the index k. Every new loop as depicted in FIG. 8a produces 64 time-domain, real-valued audio samples as an output.

The implementation as shown in FIG. 8a of a complex-valued analysis filterbank for 64 bands does not necessitate an overlap/add buffer comprising several storage positions as explained in the context of the embodiment shown in FIG. 2b. Here, the overlap-add buffer is "hidden" in the vectors v and g, which is calculated based on the values stored in the vector v. The overlap-add buffer is implemented in the framework of these vectors with these indices being larger than 128, so that the values correspond to values from previous or past blocks.

Figure 8B:
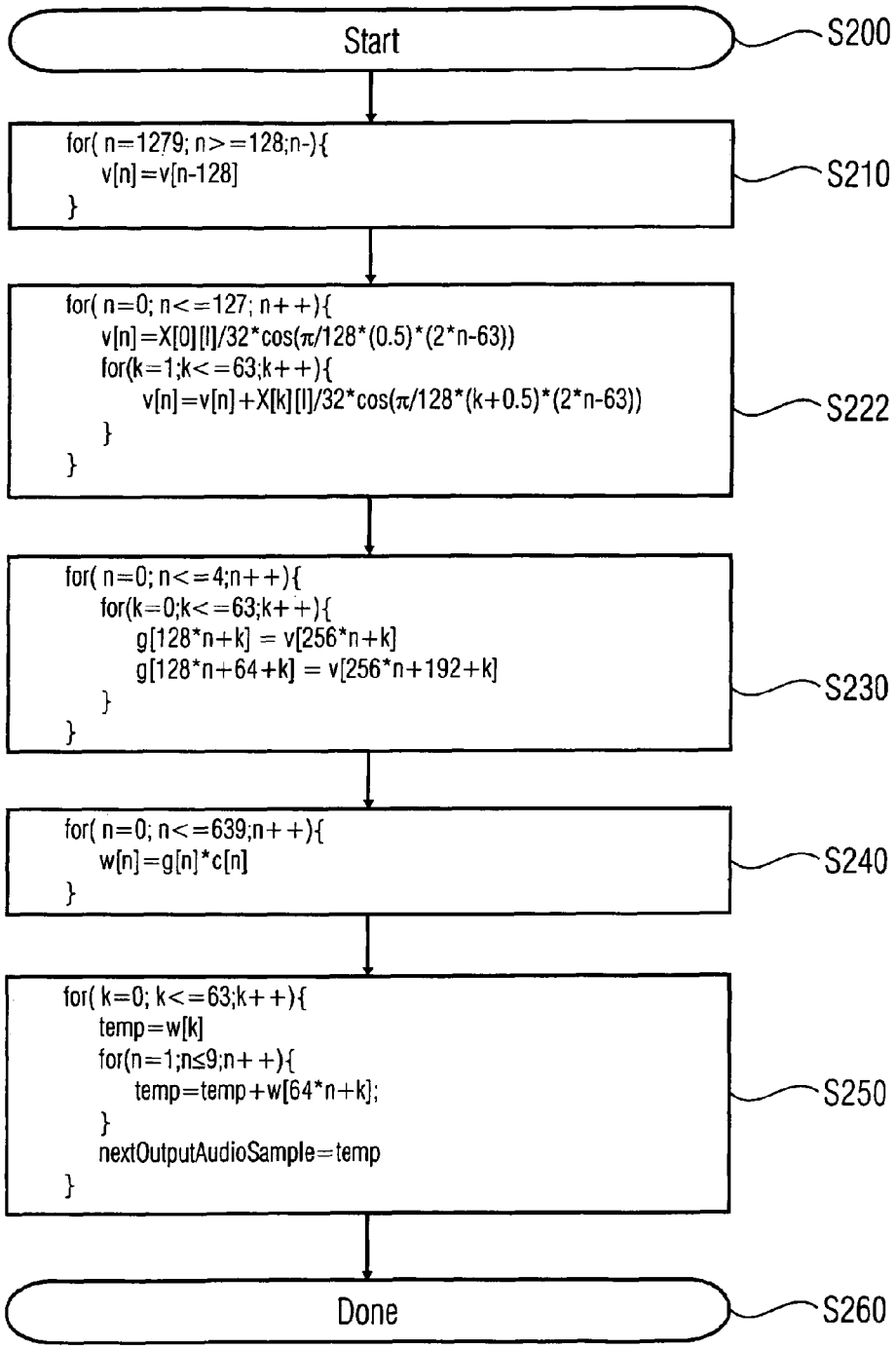
FIG. 8b shows a flowchart of a comparative example of a method for generating time-domain samples.

FIG. 8b illustrates a flowchart of a real-valued synthesis filterbank for 64 real-valued audio subband channels. The real-valued synthesis filterbank according to FIG. 8b can also implemented in the case of a low-power SBR implementation as a corresponding SBR filterbank.

The flowchart of FIG. 8b differs form the flowchart of FIG. 8a, mostly with respect to step S222, which replaces S220 of FIG. 8a. In step S222, the 64 new real-valued audio subband values are multiplied by a matrix $N_r$, wherein the elements of the matrix $N_r(k,n)$ are given by $$N_r(k, n) = \frac{1}{32} \cos\left(\frac{\pi \cdot (k + 0.5) \cdot (2 \cdot n - 63)}{128}\right), \quad (23)$$

-continued $$\begin{cases} 0 \le k < 64 \\ 0 \le n < 128 \end{cases},$$

wherein the output from this operation is once again stored in the positions 0-127 of the array v.

Apart from these modifications, the flowchart as shown in FIG. 8b in the case of a real-valued synthesis filterbank for the low-power SBR mode, does not differ from the flowchart as shown in FIG. 8a of the complex-valued synthesis filterbank for the high quality SBR mode.

Figure 8C:
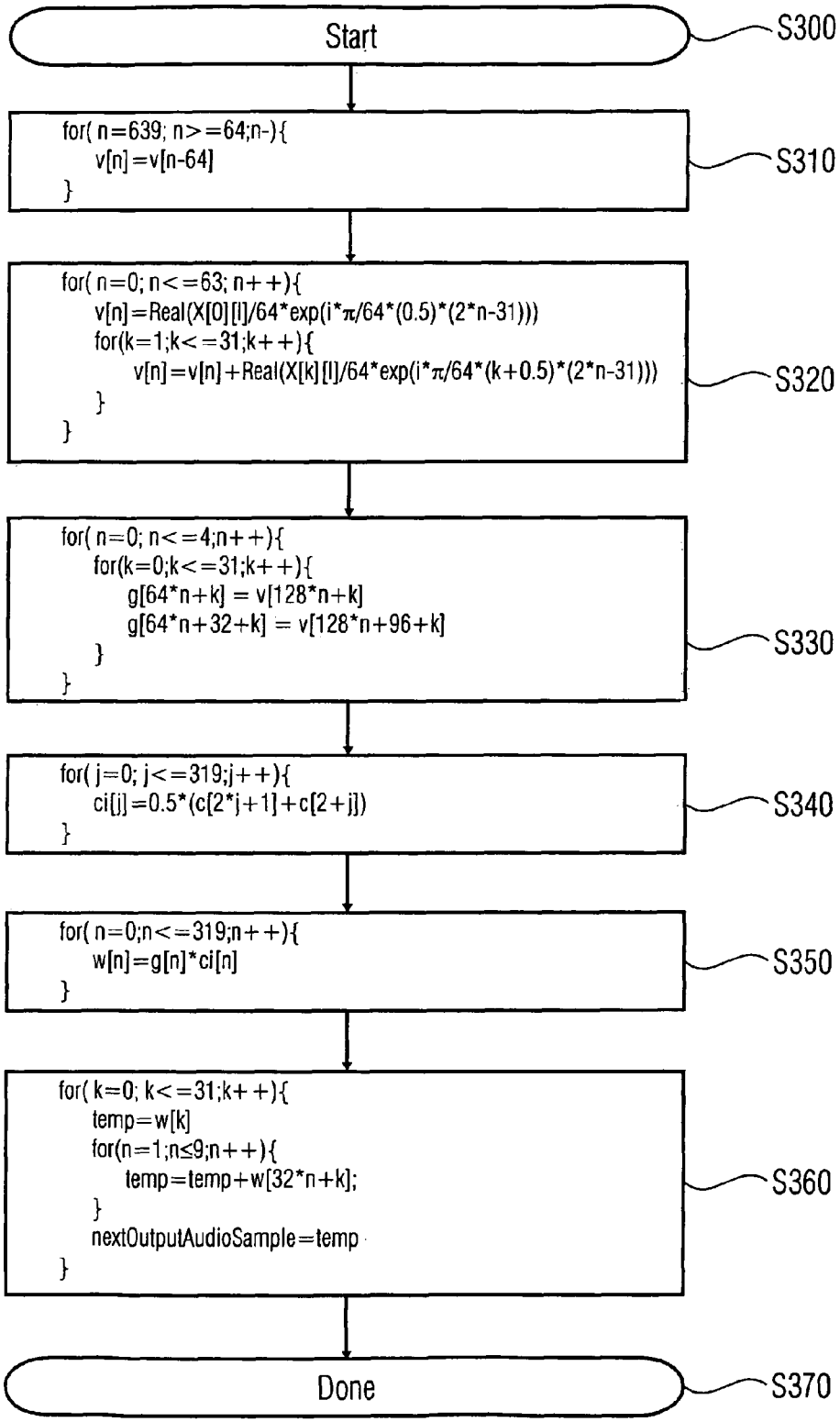
FIG. 8c shows a flowchart of an embodiment of a method for generating time-domain samples.

FIG. 8c illustrates a flowchart according to an embodiment of the present invention in the form of a downsampled complex-valued synthesis filterbank and the appropriate method, which can for instance be implemented in a high-quality SBR implementation. To be more precise, the synthesis filterbank as described in FIG. 8c relates to a complex-valued synthesis filterbank capable of processing complex-valued audio subband values for 32 subband channels.

The downsampled synthesis filtering of the SBR-process subband signals is achieved using a 32-channel synthesis filterbank as illustrated in FIG. 8c. The output from the filterbank is a block of real-valued time-domain samples. The process is given in the flowchart of FIG. 8c. The synthesis filtering comprises after a start (step S300), the following steps, wherein an array v comprises 640 real-valued time-domain samples.

In step S310, the samples in the array v are shifted by 64 positions, wherein the oldest 64 samples are discarded. Then, in step S320, the 32 new complex-valued subband samples or complex-valued audio subband values are multiplied by a matrix N, the elements of which are given by $$N(k, n) = \frac{1}{64}\exp\left(\frac{i \cdot \pi \cdot (k + 0.5) \cdot (2 \cdot n - 31)}{64}\right), \quad \begin{cases} 0 \le k < 32 \\ 0 \le n < 64 \end{cases}, \tag{24}$$

wherein exp( ) denotes the complex exponential function and i is again the imaginary unit. The real part of the output from this operation is then stored in the positions 0-63 of array v.

In step S330, the samples are extracted from vector v according to the equation given in the flowchart of FIG. 8c to create a 320-element array g. In step S340, the window coefficients ci(n) of an interpolated window function are obtained by a linear interpolation of the coefficients c(n) in accordance with equation (15), wherein the index n is once again in the range between 0 and 319 (N=64, T=10 for equation (15)). As illustrated before, the coefficients of a window function c(n) are based on the values given in the table of Annex 1. Moreover, to achieve the low-delay property as illustrated earlier, the window coefficients c(n) do not need to be exactly the figures given in the table of Annex 1. It is sufficient if the window coefficients c(n) fulfill at least one set of relations as given in the Annexes 2 to 4. However, depending on implementational details, to obtain the window coefficients based on the values given in the tables in the Annexes 1 and 3, additional sign changes with respect to the window coefficients corresponding to the indices 128 to 255 and 384 to 511 (multiplication with factor (−1)) should be considered according to equations (16a) and (16b). Moreover, also different window functions comprising different window coefficients c(n) can naturally be employed in embodiments of the present invention.

In step S350, the samples of the array g are multiplied by the interpolated window coefficient ci(n) of the interpolated window function to obtain the windowed time-domain sample w(n).

Then, in step S360, 32 new output samples are calculated by a summation of samples from array w(n) according to the last step S360, before the final step S370 in the flowchart of FIG. 8c.

As indicated earlier, in the flowchart of FIG. 8c, X([k] [l]) (=x(k,l)) corresponds to an audio subband value l in the audio subband channel k. Moreover, every new loop of a flowchart as indicated in FIG. 8c produces 32 real-valued time-domain samples as an output.

Figure 8D:
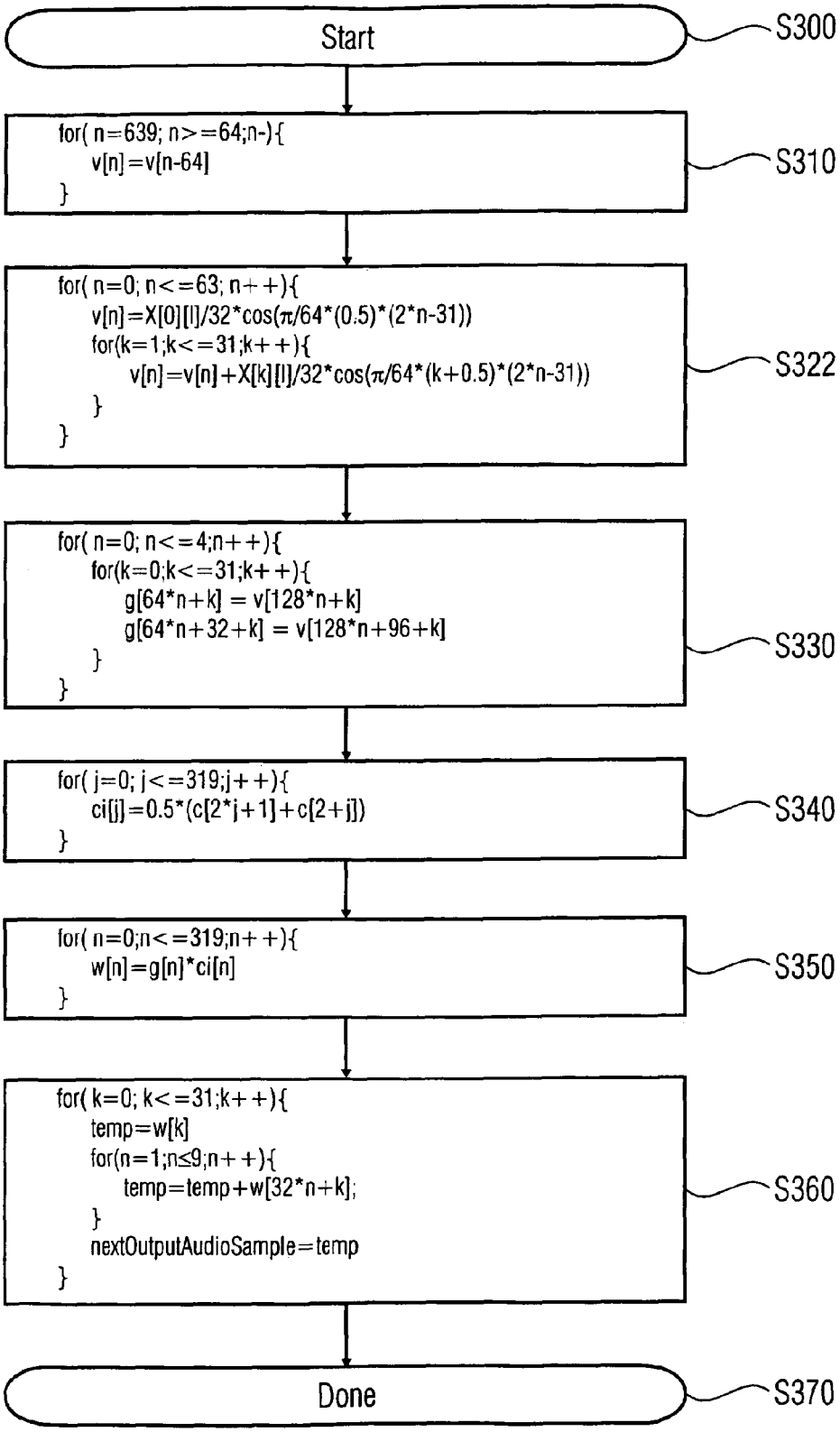
FIG. 8d shows flowchart of another embodiment of a method for generating time-domain samples.

FIG. 8d shows a flowchart of an embodiment according to the preset invention in the form of a downsampled real-valued synthesis filterbank, which can for instance be employed in the case of a low-power SBR filterbank. The embodiment and the flowchart shown in FIG. 8d differs from the flowchart shown in FIG. 8c of the downsampled complex-valued synthesis filterbank only with respect to step S320, which is replaced in the flowchart shown in FIG. 8d by step S322.

In step S322, the 32 new real-valued audio subband values, or subband samples are multiplied by the matrix $N_r$, wherein the elements of the matrix $N_r$ are given by $$N_r(k, n) = \frac{1}{32} \cdot \cos\left(\frac{\pi \cdot (k + 0.5) \cdot (2 \cdot n - 31)}{64}\right), \quad \begin{cases} 0 \le k < 32 \\ 0 \le n < 64 \end{cases}, \tag{25}$$

wherein the output from this operation is stored in the position of 0 to 64 of array v.

FIG. 9a shows an implementation of a comparative example in the form of a method corresponding to a complex-valued analysis filterbank for 64 subbands. FIG. 9a shows an implementation as a MATLAB-implementation, which provides as an output a vector y and a vector "state". The function as defined in this script shown in FIG. 9a is called LDFB80 to which a vector x comprising fresh audio samples and the vector "state" is provided to as an input. The name of the function LDFB80 is an abbreviation for low-delay filterbank for 8 blocks extending into the past and 0 blocks into the future.

In the MATLAB-programming language, the percent sign (%) indicates remarks, which are not carried out, but merely serve the purpose of commenting and illustrating the source code. In the following description, different segments of the source code will be explained with respect to their functions.

In the code sequence S400, the buffer which is represented by the vector "state" is updated in a way such that the content of the vector "state" having the indices 577 to 640 are replaced by the contents of the vector x comprising the fresh time-domain audio input samples. In the code sequence S410, the window coefficients of the analysis window function as stored in the variable LDFB80_win is transferred to the vector win_ana.

In step S420, which assumes that the latest samples are aligned to the right side of the buffer, the actual windowing is performed. In block S420, the content of the vector state is element-wise multiplied (·*) with the elements of the vector win_ana comprising the analysis window function. The output of this multiplication is then stored into the vector x_win_orig.

In step S430, the content of the vector x_win_orig is reshaped to form a matrix of a size of 128·5 elements called x_stack. In step S440, the sign change of the stack x_stack is performed with respect to the second and fourth column of the matrix x_stack.

In step S450, the stack x_stack is collapsed or retracted by summing the elements of x_stack with respect to the second index and simultaneously inverting the order of the elements and transposing the outcome before storing the outcome again to the various x_stack.

In the code segment S460, the transformation from the time-domain into the frequency-domain is carried out by computing a complex Fast Fourier transformation (FFT) of the element-wise multiplied content of the stack x_stack multiplied with the complex exponential function to which the argument $(-i\cdot\pi\cdot n/128)$ is provided, with the indices and in the range from 0 to −127 and the imaginary unit i.

In the code segment S470, a post twiddle is performed by defining the variable m=(64+1)/2 and by calculating the block comprising the audio subband values as a vector y according to the equation $$y(k) = \overline{2\cdot \mathrm{temp}(k)\cdot \exp\left(-2i\cdot\pi\cdot\left(\left(k-1+\frac{1}{2}\right)\cdot\frac{m}{128}\right)\right)}. \tag{26}$$

The index k covers the range of integers from 1-64 in the implementation shown in FIG. 9a. The vector y is then output as the vector or block comprising the audio subband values 180 of FIG. 1. The bar above the second factoring equation (26) as well as the function conj( ) encode segment S417 in FIG. 9a refer to the complex conjugate of the argument of the respective complex number.

In a final code-segment S480, the state-vector is shifted by 64 elements. The state-vector in its shifted form may then be provided to the function LDFB80 as an input again in a further loop of the function.

FIG. 9b shows a MATLAB-implementation according to an embodiment of the present invention in the form of a method corresponding to a complex-valued analysis filterbank for 32 subbands. Accordingly, the function defined is referred to as LDFB80_32 indicating that the implementation represents a low-delay filterbank for 32 subbands based on an additional overlap of 8 blocks into the past and 0 blocks into the future.

The implementation of FIG. 9b differs from the implementation shown in FIG. 9a, only with respect to a few code sequences, as will be outlined in the following description. The code sequences S400, S430, S460, S470 and S480 are replaced by corresponding code sequences S400', S430', S460', S470' and S480' taking into account mainly the fact that the number of subbands, or the number of subband values output by the function LDFB80_32, is reduced by a factor of 2. Accordingly, the step S400' relates to the vector state being updated with respect to the 32 last entries corresponding to the indices 289 to 320 with the corresponding 32 time-domain audio input samples of the fresh block 220 as shown in FIG. 1.

However, the major difference between the implementations as shown in FIGS. 9a and 9b appears in the code sequence S410 of FIG. 9a, which is replaced by a code sequence S412 in the implementation shown in FIG. 9b. The code sequence for S412 of FIG. 9b comprises first a copying of the 640 window coefficients comprising windows stored in the vector LDFB80 win to the local vector win_ana. Then, an interpolation according to equation (15) takes place, in which two consecutive window coefficients represented by the vector elements of the vector win_ana are added and divided by 2 and then stored back in the vector win_ana.

The next code sequence S420 is identical to the code sequence S420 as shown in FIG. 9a, which carries out the actual element-wise multiplication (·*) of the windowing of the values, or elements, of the vector state with the elements of the vector win_ana comprising the interpolated window coefficients of the interpolated window function. The output of this operation is stored in the vector x_win_orig. However, the difference between the code sequence S420 of FIG. 9b and the corresponding code sequence S420 of FIG. 9a, is that in the case of FIG. 9b, not 640 but only 320 multiplications are carried out in the framework of the windowing.

In the code sequence S430' replacing the code sequence S430, the stack x_stack is prepared by reshaping the vector x_win_orig. However, as the vector X_win_orig only comprises 320 elements, compared to the corresponding vector of FIG. 9a comprising 640 elements, the matrix x_stack is only a matrix of 64·5 elements.

The code sequences S440 of the sign change and the code sequence S450 of collapsing the stack are identical in both implementations according to the FIGS. 9a and 9b, apart from the reduced number of elements (320 compared to 640).

In the code sequence S460' replacing the code sequence S460 an odd complex Fast Fourier Transform (FFT) of a window data is carried out, which is quite similar to the transform of code sequence S460 of FIG. 9a. However, once again, due to the reduced number of output audio subband values, the vector temp is provided with the outcome of a Fast Fourier Transform, the element-wise multiplication of the elements of the stack x_stack and the complex exponential function of the argument $(-i\cdot\pi\cdot n/64)$, wherein the index n is in the range between 0 and 63.

Afterwards, in the modified code sequence S470', the post twiddling is performed by defining the variable m=(32+1)/2 and by generating the output vector y according to equation (26), wherein the index k only covers the range from 1 to 32 and wherein the number 128 appearing in the argument of the complex exponential function is substituted by the number 64.

In the final code-sequence S480', the buffer state is shifted by 32 elements in the case of the implementation shown in FIG. 9b, wherein in the corresponding code sequence S480, the buffer is shifted by 64 elements.

FIG. 10a shows a MATLAB-script illustrating an implementation according to a comparative example in the form of a method corresponding to a complex-valued synthesis filterbank for 64 subbands. The script shown in FIG. 10a defines the function ILDFB80 to which the vector x representing the block 320 of audio subband values of FIG. 2a and a state-vector "state" is provided to as input parameters. The name ILDFB80 indicates that the function defined is an inverse low-delay filterbank corresponding to 8 blocks of audio data from the past and 0 blocks from the future. The function provides a vector y and a new or redefined state-vector "state" as an output, wherein the vector y corresponds to the block 410 of time-domain audio samples from FIG. 2a.

In a code sequence S500, a pre-twiddling is performed, in which a variable m=(64+1)/2 as well as a vector temp is defined. The elements temp(n) of the vector temp are defined according to equation $$\text{temp}(n) = \frac{1}{2} \cdot \overline{x(n)} \cdot \exp\left(2i \cdot \pi\left(n - 1 + \frac{1}{2}\right) \cdot \frac{m}{128}\right), \tag{27}$$

wherein the bar above the element of the vector x(n) and the function conj( ) represent the complex conjugate, exp( ) represents the complex exponential function, i represents the imaginary unit and n is an index in the range from 1- to 64.

In the code sequence S510, the vector temp is expended into a matrix comprising in the first column the elements of the vector temp and in the second column, the complex conjugate of the reversed vector temp with respect to the order of the elements as defined by the index of the vector. Hence, in the code sequence S510 an odd symmetry of the matrix temp is established based on the vector temp.

In a code sequence S520 an odd Fast Fourier Transform (FFT) is performed based on the matrix temp. in this code sequence, the real part of the element-wise multiplication of the outcome of the inverse Fourier Transform of the matrix temp with the exponential function having the argument of $(i \cdot \pi/128)$ is performed and outputted to a vector y_knl, wherein the index n is in the range from 0 to 127.

In the code sequence S530, an extension of the data and an alternating sign flip is formed. To achieve this, the order of the elements of the vector y_knl is reversed and at the same time a sign flip if carried out. Then, a matrix tmp is defined, comprising the first, third and fifth column of the vector y_knl, wherein the second and the fourth column comprise the sign flipped vector y_knl.

In a code sequence S540, the window coefficients as stored in the vector LDFB80_win are first copied to the vector win_ana. Then, the synthesis window coefficients are determined based on the analysis window coefficients as stored in the vector win_ana by generating a time reversed version of the analysis window function according to $$\text{win_syn}(n)=\text{win_ana}(N \cdot T-n) \tag{28}$$

wherein N·T is the total number of window coefficients and n is the index of the window coefficients.

In a code sequence S550, the synthesis window is applied to the vector tmp by an element-wise multiplication of the vector with the synthesis window function. In a code sequence S560, the buffer is updated by setting the elements of the vector state with the indices 577 to 640 to 0 and by adding the content of the windowed vector tmp to the state-vector state.

In a code sequence S570, the output vector y comprising the time-domain audio samples is extracted from the state-vector by extracting the elements of the state-vector by extracting the elements of the state-vector with the indices 1 to 64.

In a code sequence S580, the final code sequence of the function as shown in FIG. 10a, the state-vector state is shifted by 64 elements so that the elements with indices from 65 to 640 are copied to the first 576 elements of the vector state.

FIG. 10b shows a MATLAB-script of an implementation according to an embodiment of the present invention in the form of a complex-valued synthesis filterbank for 32 sub-band values. The name of the function as defined by the script shown in FIG. 10b illustrates this as the function defined is called ILDFB80_32 indicating that the function defined is an inverse low-delay filterbank for 32 bands with 8 blocks overlap from the past and 0 blocks overlap from the future.

As discussed with respect to the comparison of the implementation shown in FIGS. 9a and 9b, the implementation according to the script of FIG. 10b is also closely related to the implementation of the 64-subband synthesis filterbank according to FIG. 10a. As a consequence, the same vectors are provided to the function and are output by the function which, however, comprise only half the number of elements compared to the implementation of FIG. 10a. The implementation for a 32-band synthesis filterbank for 32 bands differs from the 64-subband version illustrated in FIG. 10a, mainly with respect to two aspects. The code sequences S500, S510, S520, S53β, S560, S570 and S580 are replaced with code sequences in which the number of elements to be addressed and further number of element-related parameters are divided by 2. Moreover, the code sequence S540 of generating the synthesis window function is replaced by a code sequence S542, in which the synthesis window function is generated as a linearly interpolated synthesis window function according to equation (15).

In the code sequence S500' replacing the code sequence S500, the variable m is defined to be equal to m=(32+1)/2 and the vector temp is defined according to equation (27), wherein the index n only covers the range of 1 to 32 and wherein the factor of 1/128 is replaced by the factor 1/64 in the argument of the exponential-function.

Accordingly, in the code sequence S510' replacing the code sequence S510, the index range only covers the indices of the 32-element comprising the vector temp. In other words, the index only covers the values from 1 to 32. Accordingly, in the code sequence S520' replacing the code sequence S520, the argument of the exponential function is replaced by $(i \cdot \pi \cdot n/64)$, wherein the index n is in the range from 0 to 63. In the framework of the code sequence S530', the index range is also reduced by a factor of 2 compared to the code sequence S530.

The code sequence S542 replacing the code sequence S540 of FIG. 10a also copies the window function as stored in the vector LDFB80_win to the vector win_ana and generates a time-reversed version win_syn according to equation (28). However, the code sequence S542 of the implementation shown in FIG. 10b further comprises an interpolation step according to equation (15), in which for each element of the redefined vector win_syn comprising the window coefficients of the synthesis window function, a linear interpolation of two consecutive window coefficients of the original synthesis window function.

The code sequence S550 of applying the window to the vector tmp and replacing the elements tmp with the windowed version thereof is identical in terms of the code as a direct comparison of the respective code sequences in FIGS. 10a and 10b. However, due to the smaller size of the vector tmp in the implementation of FIG. 10b, during an implementation, only half the number of multiplications is carried out.

Also in the framework of the code sequences S560', S570' and S580' replacing the code sequences S560, S570 and S580, respectively, the indices 640 and 64 are replaced by 320 and 32, respectively. Therefore, these three final code sequences only differ from the code sequences of the implementation shown in FIG. 10a with respect to the size of the vector states tmp and y.

As the embodiments described so far have illustrated, the analysis windower as well as the synthesis windower are adapted to windowing the respective samples in the time-domain comprised in the respective frames by multiplying these on an element-wise basis with window coefficients of a window function.

Before describing a window function, which can be employed for instance as a synthesis window function and as an analysis window function in its time-reversed version more closely, advantages of embodiments according to the present invention will be outlined in more detail, especially in view of an implementation in the framework of a SBR tool or system as shown in FIGS. 5 and 6.

Among the advantages, embodiments according to the present invention and systems comprising more than one embodiment according to the present invention may offer is a significant reduction of the delay according to other filterbanks. However, this low-delay property will be addressed in the context of FIGS. 13 and 14 in more detail. One important aspect in this context is to note that the length of the window function, in other words, the number of window coefficients to be applied to a frame or a block of time-domain samples is independent of the delay.

Embodiments according to the present invention offer the further advantage of improving the quality of the (reconstructed) audio data. The interpolation employed in embodiments according to the present invention offers a significantly reduced aliasing compared to other reduction schemes concerning the number of window coefficients.

Figure 16A:
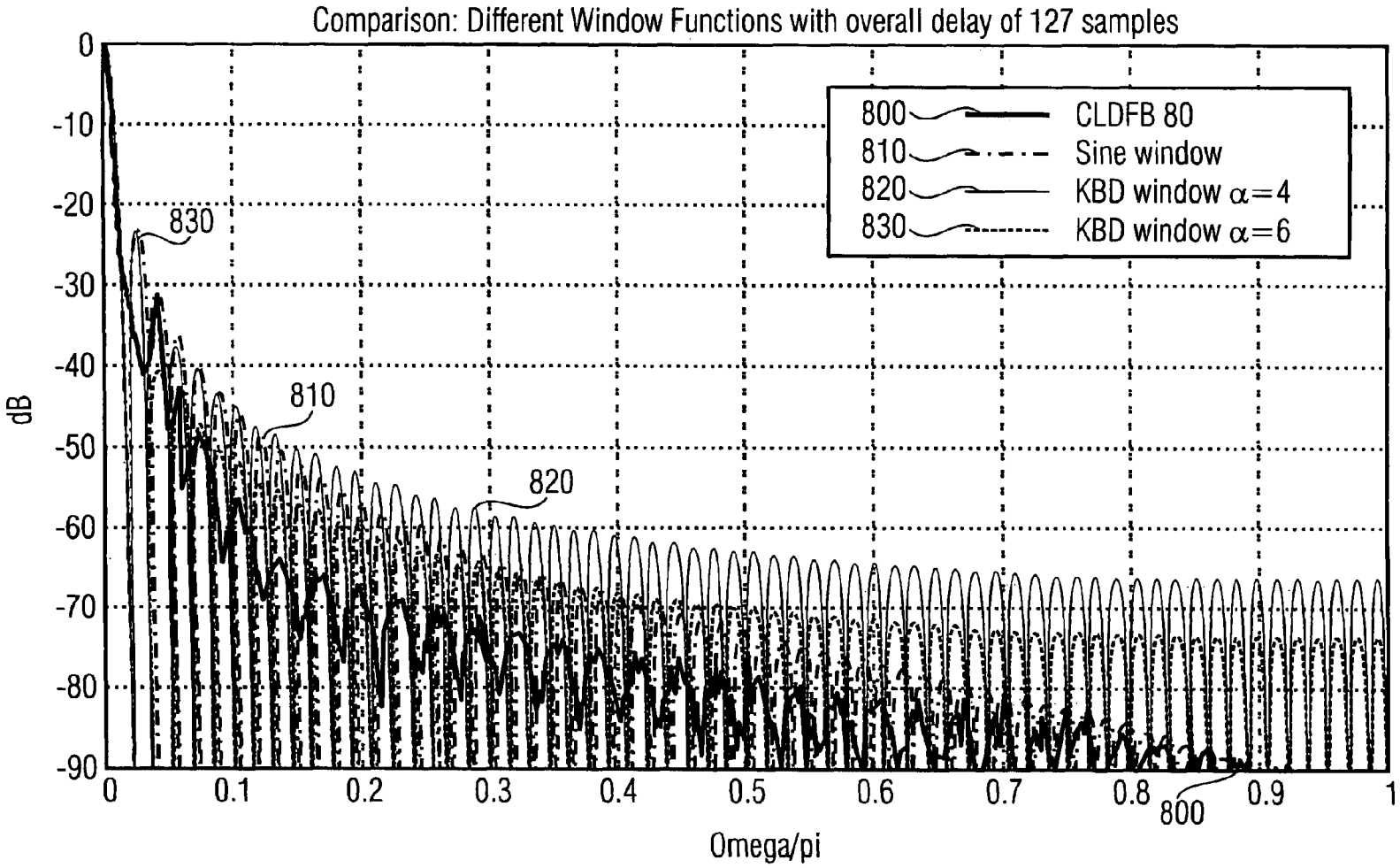
FIG. 16a shows a comparison of the frequency response of 4 different window functions.
Figure 16B:
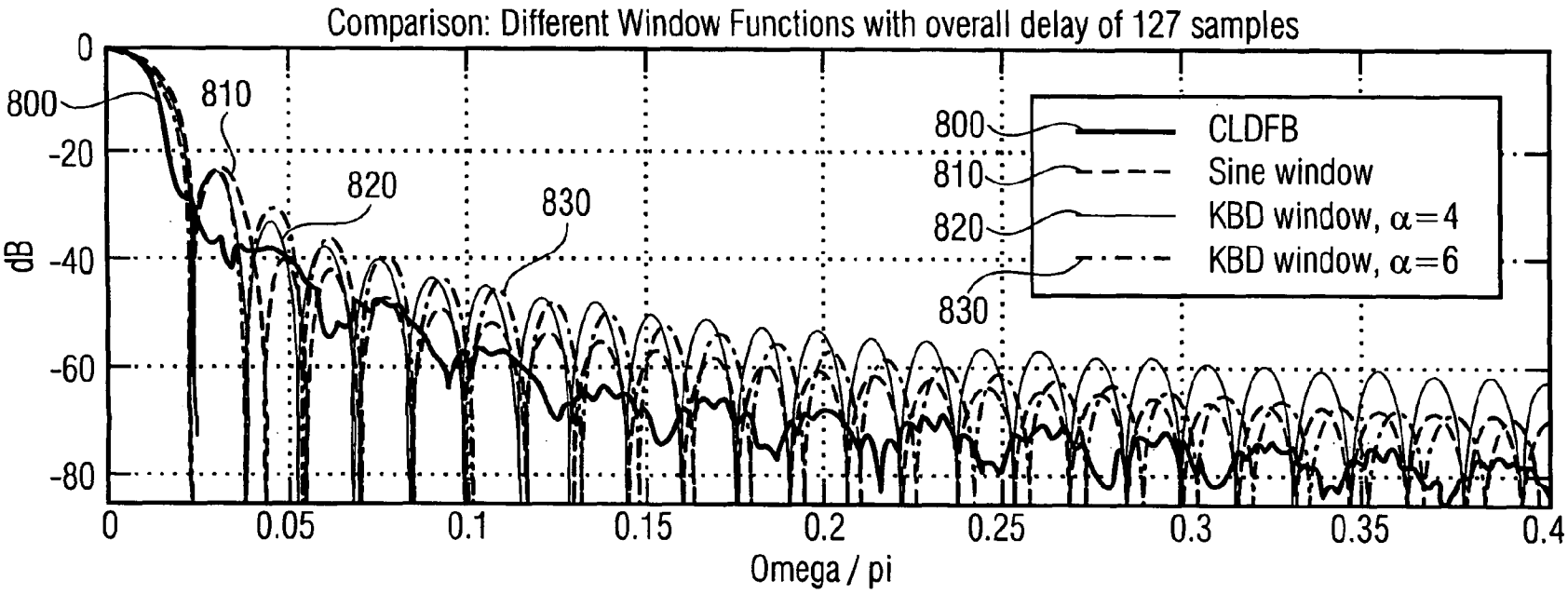
Figure 17:
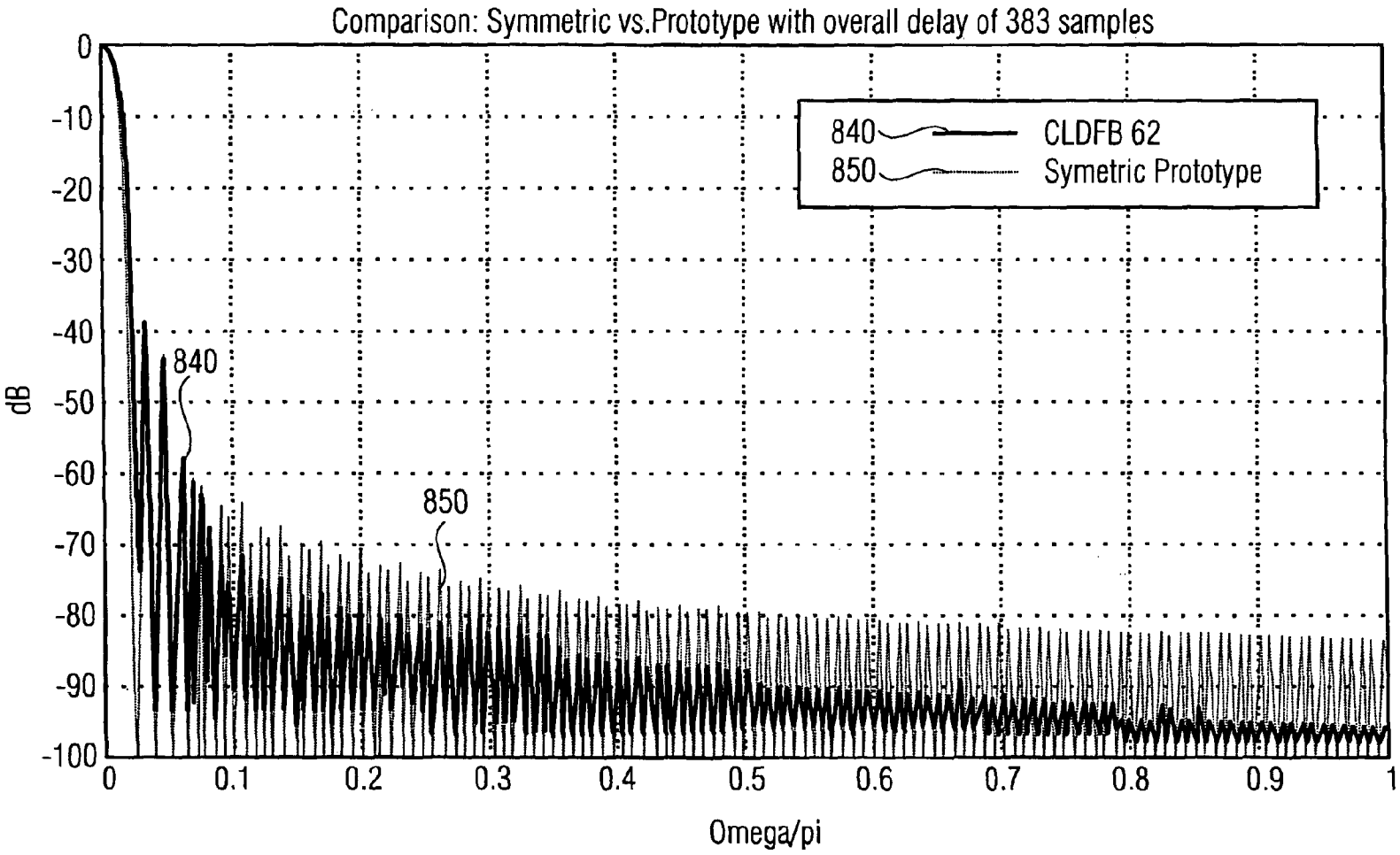
FIG. 17 shows a comparison of a frequency response of two different window functions, one window function according to the present invention and one window function being a symmetric window function.
Figure 18:
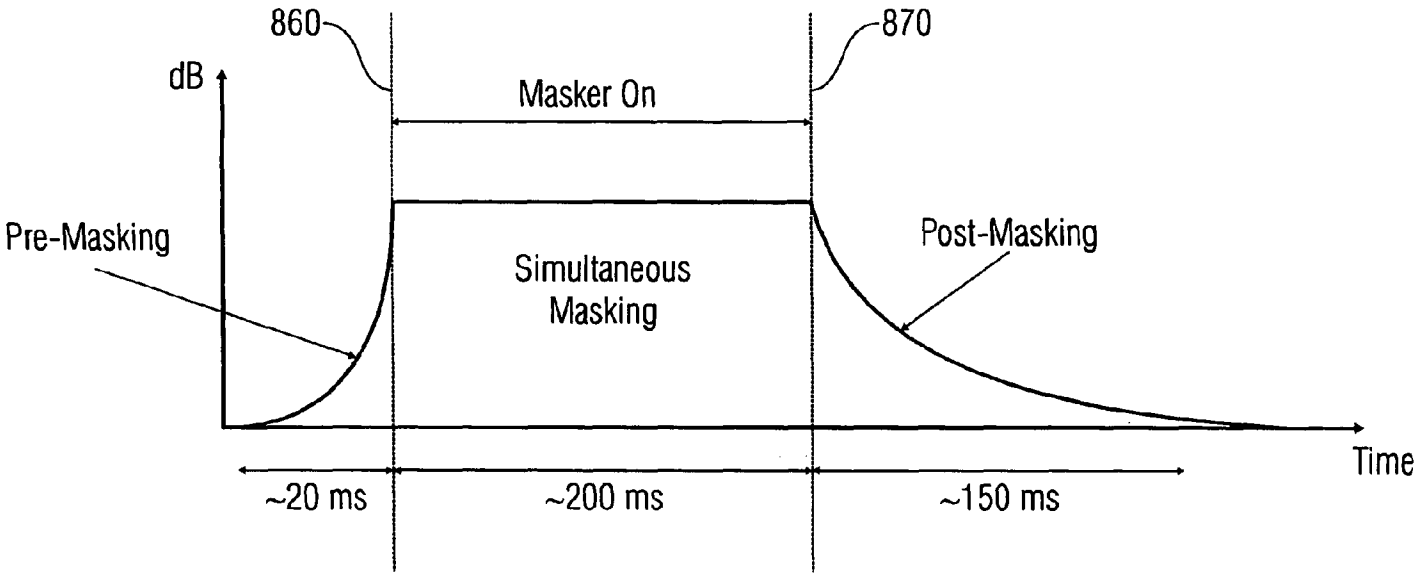
FIG. 18 shows schematically the general temporal masking property of the human ear.

Moreover, as will be outlined in the context of FIGS. 17 and 18 in more detail, in terms of the psychoacoustics, embodiments according to the present invention often make use the temporal masking properties of the human ear better than many other filterbanks. Moreover, as will be more closely outlined in the context of FIGS. 15, 16 and 19, embodiments according to the present invention offer an excellent frequency response.

Also, in many filterbanks according to an embodiment of the present invention, a perfect reconstruction is achievable if an analysis filterbank and the synthesis filterbank are interconnected. In other words, embodiments according to the present invention do not only offer an audibly indistinguishable output compared to the input of such an interconnected set of an analysis filterbank and a synthesis filterbank, but (apart from quantization errors, computational rounding effects and further effects caused by the discretization, an identical output compared to the input.

An integration in the SBR module of filterbanks according to the present invention can easily be achieved. While typically SBR modules operate in the dual-rate mode, the complex-valued low-delay filterbanks according to embodiments of the present invention are capable of providing perfect reconstruction in the single-rate mode, while the original SBR QMF filterbanks are capable of only providing near-perfect reconstruction. In the dual-rate mode, the 32-band version of the impulse response is obtained by linear interpolation also referred to as downsampling of two adjacent taps or window coefficients of the 64-band impulse response or window function as explained in the context of FIG. 3.

In the case of a complex-valued implementation of a filterbank, a significant reduced analyzing (or synthesizing) delay for critically sampled filterbanks can be achieved, in which the sampling or processing frequency corresponds to the border frequency according to the Nyquist-Shannon Theory. In the case of a real-valued implementation of a filterbank, an efficient implementation can be achieved employing optimized algorithms, as for instance illustrated in the context of the MATLAB-implementation shown in FIGS. 9 and 10. These implementations may for instance be employed for the low-power mode of the SBR tool as described in the context of FIGS. 5 and 6.

As outlined in the context of FIGS. 5 and 6, it is possible to achieve a further reduction concerning the delay in the case of an SBR system by using a complex-valued low-delay filterbank according to an embodiment of the present invention. As outlined before, in the SBR decoder 610 as shown in FIG. 5, the QMF analysis filterbank 620 is replaced by a complex low-delay filterbank (CLDFB) according to an embodiment of the present invention. This replacement can be done in a computable way by keeping the number of bands (64), the length of the impulse response (640) and by using a complex modulation. The delay achieved by this tool is minimized to such an extent to achieve an overall delay low enough for a bi-directional communication without sacrificing an achievable quality level.

Compared, for instance, to a system comprising a MDCT and a MDST to form a complex-valued MDCT-like system, an embodiment according to the present invention provides a far better frequency response. Compared to the QMF filterbank, for instance, used in the MPEG-4 SBR today, a system comprising one or more filterbanks according to embodiments of the present invention provides a significantly lower delay.

Even compared to a low-delay QMF filterbank, embodiments according to the present invention offer the advantage of a perfect reconstruction combined with the lower delay. The advantages arising from the perfect reconstruction property in contrast to the near-perfect reconstruction of QMF filterbanks are the following. For near-perfect reconstruction, a high stopband attenuation is needed to attenuate the aliasing to a sufficiently low level. This restricts the possibility of achieving a very low-delay in the filter design. In contrast, employing an embodiment according to the present invention now has the possibility of independently designing the filter so that no high stopband attenuation is needed to attenuate the aliasing to sufficiently low levels. The stopband attenuation has just to be low enough to allow reduced aliasing sufficient for the desired signal processing application. Thus, a better trade-off towards lower delay can be achieved in the filter design.

Figure 11:
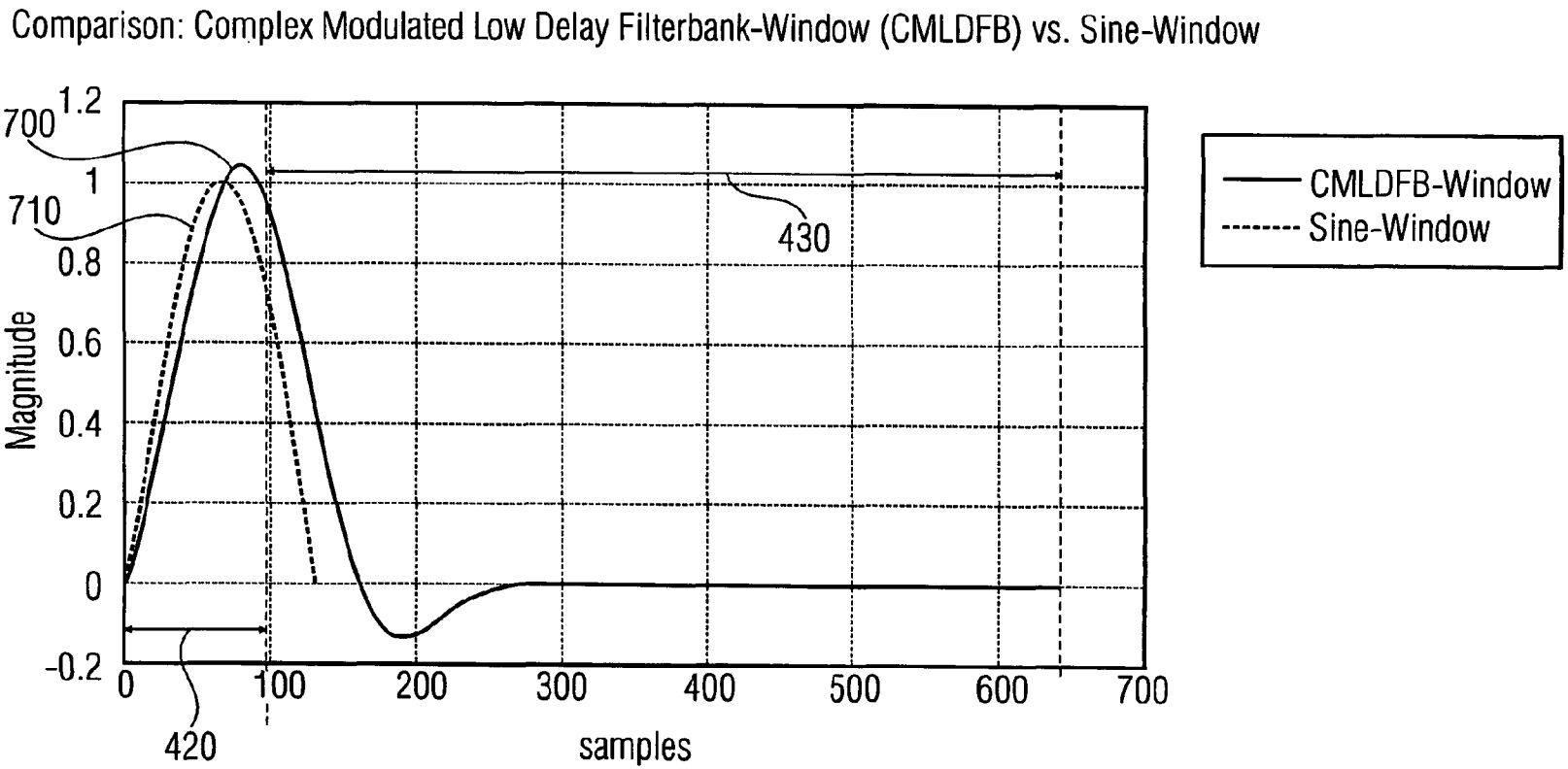
FIG. 11 shows a comparison of a synthesis window function according to an embodiment of the present invention and a sine window function.

FIG. 11 shows a comparison of a window function 700 as can, for instance, be employed in an embodiment according to the present invention along with the sine-window function 710. The window function 700, which is also referred to as a "synthesis" CMLDFB-window (CMLDFB=complex modulated low-delay filterbank), comprises 640 window coefficients based on the values given in the table in Annex 1. Concerning the magnitude of the window functions, it should be noted that general amplification factors or damping factors for adjusting an amplitude of the windowed signal are not considered in the following. Window functions can, for instance, be normalized with respect to a value corresponding to the center of delay, as outlined in the context of FIG. 13, or with respect to a value n=N, n=N−1 or n=N+1, wherein N is the block length and n is the index of the window coefficients. In comparison, the sine-window function 710 is only defined over 128 samples and is, for instance, employed in the case of an MDCT or an MDST module.

However, depending on implementational details, to obtain the window coefficients based on the values given in the tables in the Annexes 1 and 3, additional sign changes with respect to the window coefficients corresponding to the indices 128 to 255 and 384 to 511 (multiplication with factor (−1)) should be considered according to equations (16a) and (16b).

Before discussing the differences of the two window functions 700, 710, it should be noted that both window functions comprise real-valued window coefficients only. Moreover, in both cases, an absolute value of the window coefficient corresponding to an index n=0 is smaller than 0.1. In the case of a CMLDFB-window 700, the respective value is even smaller than 0.02.

Considering the two window functions 700, 710 with respect to their definition sets, several significant differences are evident. Whereas the sine-window function 710 is symmetric, the window function 700 shows an asymmetric behavior. To define this more clearly, the sine-window function is symmetric as a real-valued value $n_0$ exists so that with respect to all real numbers n, so that the window function 710 is defined for $(n_0+n)$ and $(n_0-n)$, the relation $$|w(n_0-n)|=|w(n_0+n)| \tag{29}$$

is fulfilled to a desirable margin ($\epsilon \geq 0$; the absolute value of the difference of the terms on the two sides of equation (29) is smaller than or equal to $\epsilon$), wherein w(n) represents the window coefficient corresponding to the index n. In the case of the sine-window the respective index $n_0$ is exactly in the middle of the two topmost window coefficients. In other words, for the sine-window 710 the index is $n_0=63.5$. The sine-window function is defined for indices n=0, . . . , 127.

In contrast, the window function 700 is defined over the set of indices n=0, . . . , 639. The window function 700 is clearly asymmetric in the sense that for all real-valued numbers $n_0$ at least one real number exists so that $(n_0+n)$ and $(n_0-n)$ belong to the definition set of the window function, for which the inequality $$|w(n_0-n)| \neq |w(n_0+n)| \tag{30}$$

holds to an (almost deliberately) definable margin ($\epsilon \geq 0$; the absolute value of the difference of the terms on the two sides of equation (29) is greater than or equal to $\epsilon$), wherein once again w(n) is the window coefficient corresponding to the index n.

Further differences between the two window functions, which both relate to block sizes of N=64 samples, is that the maximum value of the window function 700 are larger than 1 and is acquired for indices in the range of $$N \leq n \leq 2N \tag{31}$$

for the synthesis window. In the case of the window function 700 shown in FIG. 11, the maximum value acquired is larger than 1.04 acquired at the sample index n=77. In contrast, the maximum values of the sine-window 710 is smaller than or equal to 1, which is acquired at n=63 and n=64.

However, also the window function 700 acquires a value of approximately 1 at sample indices around n=N. To be more precise, the absolute value or the value itself of the window coefficient w(N−1) corresponding to the index n=N−1 is smaller than 1, whereas the absolute value or the value itself of the window coefficient w(N) corresponding to the index n=N is larger than 1. In some embodiments according to the present invention, these two window coefficients obey the relations $$0.99<w(N-1)<1.0$$

$$1.0<w(N)<1.01, \tag{32}$$

which is a result of optimizing the audio quality of the filterbanks according to embodiments of the present invention. In many cases it is desirable to have a window coefficient w(0) comprising an absolute value as small as possible. In this case, a determinant of the window coefficients $$|w(0)\cdot w(2N-1)-w(N-1)\cdot w(N)|\approx 1 \tag{33}$$

should be as close as possible to 1 to achieve an audio quality, which is optimized with respect to the possible parameters. The sign of the determinant as given by equation (33) is, however, freely choosable. As a consequence of the window coefficient w(0) being smaller or approximately 0, the product of w(N−1) w(N) or its absolute values should be as close as possible to +/−1. In this case, the window coefficient w(2N−1) can then be chosen almost freely. Equation (33) is a result of employing the technique of zero-delay matrices as described in "New Framework for Modulated Perfect Reconstruction Filter Banks" by G. D. T. Schuller and M. J. T. Smith, IEEE Transactions on Signal Processing, Vol. 44, No. 8, August 1996.

Figure 13:
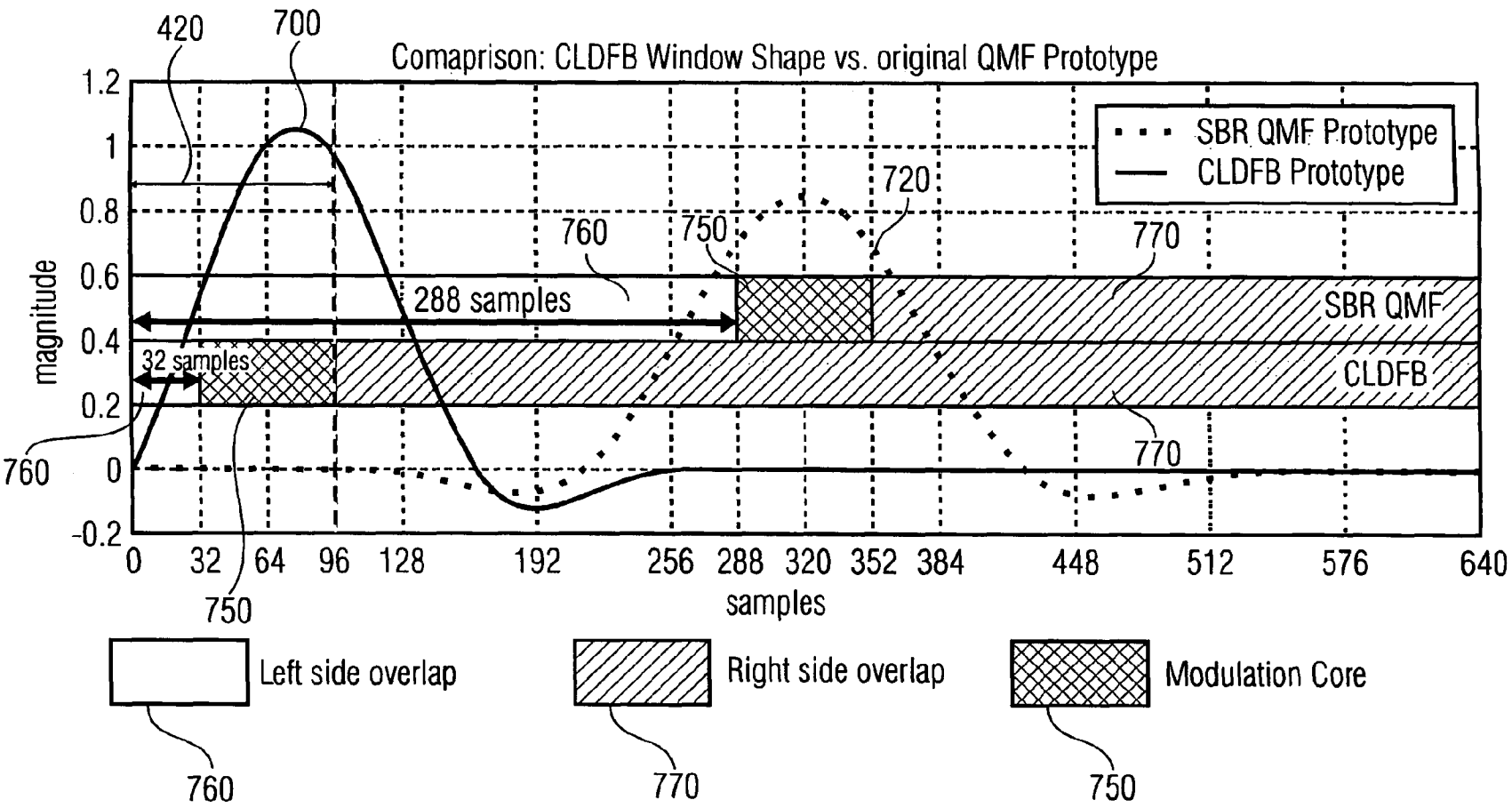
FIG. 13 illustrates the different delays caused by the window function and the prototype filter function shown in FIG. 12.

Furthermore, as will be outlined in more detail in the context of FIG. 13, the window coefficients corresponding to the indices N−1 and N are comprised in the middle of the modulation core and therefore correspond to the sample having a value of approximately 1.0 and which coincides with the delay of the filterbank as defined by the prototype filter function or the window function.

The synthesis window function 700 as shown in FIG. 11 furthermore shows an oscillating behavior with strictly monotonic increasing window coefficients from the window coefficient of the sequence of window coefficients corresponding to the index (n=0) used for windowing the latest time-domain audio sample up to the window coefficient comprising the highest absolute value of all window coefficients of the synthesis window function 700. Naturally, in the case of the time-reversed analysis window function, the oscillating behavior comprises a strictly monotonic decrease of the window coefficients from the window coefficient comprising the highest absolute value of all window coefficients of a corresponding (time-reverse) analysis window function to the window coefficients of the sequence of window coefficients corresponding to an index (n=639) used for windowing the latest time-domain audio sample.

As a consequence of the oscillating behavior, the development of the synthesis window function 700 starts with a window coefficient corresponding to the index n=0 having an absolute value smaller than 0.02 and an absolute value of the window coefficient corresponding to the index n=1 of lower than 0.03, acquiring a value of about 1 at an index n=N, acquiring a maximum value of more than 1.04 at an index according to equation (31), acquiring a further value of approximately 1 at an index n=90 and 91, a first sign change at the index values of n=162 and n=163, acquiring a minimal value of less than −0.1 or −0.12755 at an index of approximately n=3N and a further sign change at index values n=284 and n=285. However, the synthesis window function 700 further may comprise further sign changes at further index values n. When comparing the window coefficients to the values given in the tables in the Annexes 1 and 3, the additional sign changes with respect to the window coefficients corresponding to the indices 128 to 255 and 384 to 511 (multiplication with factor (−1)) should be considered according to equations (16a) and (16b).

The oscillating behavior of the synthesis window function 700 is similar to that of a strongly damped oscillation, which is illustrated by the maximum value of about 1.04 and the minimum value of about −0.12. As a consequence, more than 50% of all window coefficients comprise absolute values being smaller than or equal to 0.1. As outlined in the context of the embodiments described in FIGS. 1 and 2a, the development of the window function comprises a first group 420 (or 200) and a second group 430 (or 210), wherein the first group 420 comprises a first consecutive portion of window coefficients and the second group 430 comprises a consecutive second portion of window coefficients. As already outlined before, the sequence of window coefficients of the window comprises only the first group 420 of window coefficients and the second group of window functions 430, wherein the first group 420 of window coefficients exactly comprises the first consecutive sequence of window coefficients, and wherein the second group 430 exactly comprises the second consecutive portion of window coefficients. Hence, the terms first group 420 and first portion of window coefficients as well as the terms second group 430 and second portion of window coefficients can be used synonymously.

The more than 50% of all window coefficients having absolute values smaller than or equal to 0.1 are comprised in the second group or second portion 430 of window coefficients as a consequence of the strongly damped oscillatory behavior of the window function 700. Moreover, also more than 50% of all window coefficients comprised in the second group or second portion 430 of window coefficients comprise absolute values of less than or equal to 0.01.

The first portion 420 of window coefficients comprises less than one third of all window coefficients of the sequence of window coefficients. Accordingly, the second portion 430 of window coefficients comprises more than two thirds of window coefficients. In the case of a total number of blocks T to be processed in one of the frames 120, 150, 330, 380 of more than four blocks, the first portion typically comprises 3/2·N window coefficients, wherein N is the number of time-domain samples of one block. Accordingly, the second portion comprises the rest of the window coefficients or, to be more precise, (T−3/2)N window coefficients. In the case of T=10 blocks per frame as shown in FIG. 11, the first portion comprises 3/2·N window coefficients, whereas the second portion 210 comprises 8.5·N window coefficients. In the case of a block size of N=64 time-domain audio samples per block, the first portion comprises 96 window coefficients, whereas the second portion comprises 544 window coefficients. The synthesis window function 700 as shown in FIG. 11 acquires a value of approximately 0.96 at the border of the first portion and the second portion at an index of around n=95 or 96.

Despite the number of window coefficients comprised in the first portion 420 and the second portion 430, an energy value or a total energy value of corresponding window coefficients differ significantly from one another. The energy value as defined by $$E = \sum_n |w(n)|^2, \tag{34}$$

wherein w(n) is a window coefficient and the index n over which the sum in equation (34) is evaluated corresponds to the indices of the respective portions 420, 430, the whole set of window coefficients or any other set of window coefficients to which the respective energy values E corresponds. Despite the significant difference of window coefficients, the energy value of the first portion 420 is equal to or higher than ⅔ of the overall energy value of all window coefficients. Accordingly, the energy value of the second portion 430 is smaller than or equal to ⅓ of the overall energy value of all window coefficients.

To illustrate this, the energy value of the first portion 420 of the window coefficients of the window function 700 is approx. 55.85, while the energy value of the window coefficients of the second portion 430 is approx. 22.81. The overall energy value of all window coefficients of the window function 700 is approx. 78.03, so that the energy value of the first portion 420 is approx. 71.6% of the overall energy value, while the energy value of the second portion 430 is approx. 28.4% of the overall energy value of all window coefficients.

Naturally, equation (34) can be stated in a normalized version by dividing the energy value E by a normalization factor $E_0$, which can in principle be any energy value. The normalization factor $E_0$ may, for instance, be the overall energy value of all window coefficients of the sequence of window coefficients calculated according to equation (34).

Based on the absolute values of the window coefficients or based on the energy values of the respective window coefficients, also a center point or a "center of mass" of the sequence of window coefficients can be determined. The center of mass or the center point of the sequence of window coefficients is a real number and typically lies in the range of indices of the first portion 420 of the window coefficients. In the case of the respective frames comprising more than four blocks of time-domain audio samples (T>4), the center of mass $n_{ca}$ based on the absolute values of the window coefficients or the center of mass $n_{ce}$ based on the energy values of the window coefficients is smaller than 3/2·N. In other words, in the case of T=10 blocks per frame, the center of mass lies well within the region of indices of the first portion 200.

The center of mass $n_{ca}$ based on the absolute values of the window coefficients w(n) are defined according to $$n_{ca} = \frac{\sum_{n=0}^{N\cdot T-1} n\cdot|w(n)|}{\sum_{n=0}^{N\cdot T-1} |w(n)|} \tag{35}$$

and the center of mass $n_{ce}$ in view of the energy values of the window coefficients w(n) are defined according to $$n_{ce} = \frac{\sum_{n=0}^{N\cdot T-1} n\cdot|w(n)|^2}{\sum_{n=0}^{N\cdot T-1} |w(n)|^2}, \tag{36}$$

wherein N and T are positive integers indicating the number of time-domain audio samples per block and the number of blocks per frame, respectively. Naturally, the center points according to equations (35) and (36) can also be calculated with respect to a limited set of window coefficients by replacing the limits of the sums above accordingly.

For the window function 700 as shown in FIG. 1, the center of mass $n_{ca}$ based on the absolute values of the window coefficients w(n) is equal to a value of $n_{ca}\approx 87.75$ and the center point or center of mass $n_{ce}$ with respect to the energy values of the window coefficients w(n) is $n_{ce}\approx 80.04$. As the first portion 200 of window coefficients of the window function 700 comprises 96 (=3/2·N; N=64) window coefficients, both center points lie well within the first portion 200 of the window coefficients, as previously outlined.

The window coefficients w(n) of the window function 700 are based on the values given in the table in Annex 1. However, to achieve, for instance, the low-delay property of the filterbank as outlined before, there is no need to implement the window function as precisely as given by the window coefficients in the table of Annex 1. In many cases, it is more than sufficient for the window coefficients of a window function comprising 640 window coefficients to fulfill any of the relations or equations given in the tables of Annexes 2 to 4. The window coefficients or filter coefficients given in the table in Annex 1 represent advantageous values, which might be adapted according to equations (16a) and (16b) in some implementations. However, as indicated, for instance, by the further tables given in the further Annexes, the advantageous values can be varied from the second, third, fourth, fifth digit after the decimal point so that the resulting filters or window functions still have the advantages of embodiments according to the present invention. However, depending on implementational details, to obtain the window coefficients based on the values given in the tables in the Annexes 1 and 3, additional sign changes with respect to the window coefficients corresponding to the indices 128 to 255 and 384 to 511 (multiplication with factor (−1)) should be considered according to equations (16a) and (16b).

Naturally, further window functions comprising a different number of window coefficients can equally be defined and be used in the framework of embodiments according to the present invention. In this context it should be noted that both the number of time-domain audio samples per block and the number of blocks per frame as well as the distribution of the blocks with respect to past samples and future samples can be varied over a wide range of parameters.

Figure 12:
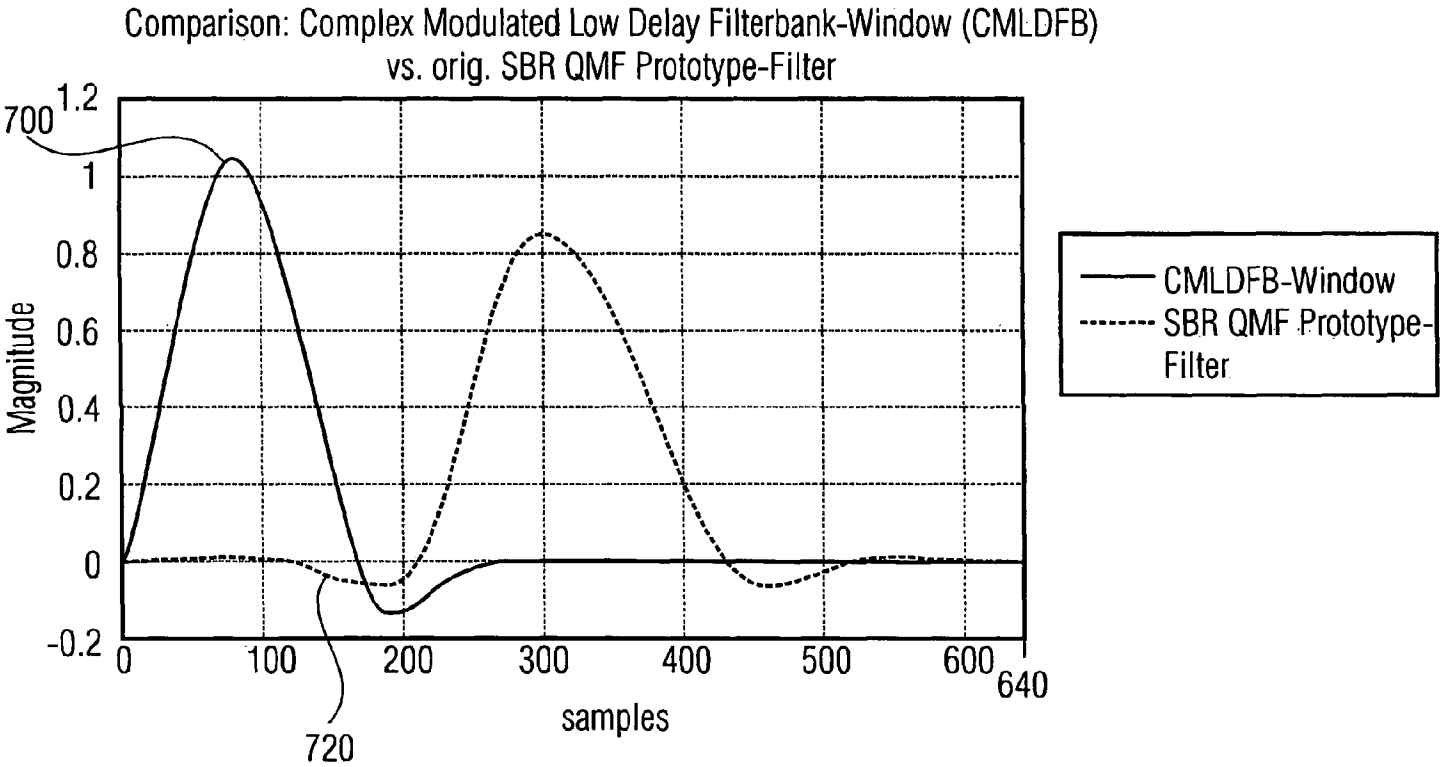
FIG. 12 shows a comparison of a synthesis window function according to an embodiment of the present invention and a SBR QMF prototype filter function.

FIG. 12 shows a comparison of a complex modulated low-delay filterbank window (CMLDFB-window) 700 as shown in FIG. 11 and the original SBR QMF prototype filter 720 as employed, for instance, in the SBR tool according to the MPEG standards. As shown in FIG. 11, the CMLDFB window 700 is once again the synthesis window according to an embodiment of the present invention.

While the window function 700 according to an embodiment of the present invention is clearly asymmetric as defined in the context of equation (30), the original SBR QMF prototype filter 720 is symmetric with respect to the indices n=319 and 320, as the window function 700 as well as the SBR QMF prototype filter 720 are each defined with respect to 640 indices each. In other words, with respect to equation (29) the "index value" $n_0$ representing the index of the symmetry center is given by $n_0$=319.5 in the case of the SBR QMF prototype filter 720.

Moreover, due to the symmetry of the SBR QMF prototype filter 720, also the center point $n_{ca}$ and $n_{ce}$ according to equations (35) and (36), respectively, are identical to the symmetry center $n_0$. The energy value of the SBR QMF prototype filter 720 is 64.00 as the prototype filter is an orthogonal filter. In contrast, the clearly asymmetric window function 700 comprises an energy value of 78.0327 as outlined before.

In the following sections of the description, SBR systems as outlined in the context of FIGS. 5 and 6 will be considered, in which the SBR decoder 610 comprises embodiments according to the present invention in the form of an analysis filterbank as the filterbank 620 and an embodiment according to the present invention in the form of a synthesis filterbank for the synthesis filterbank 640. As will be outlined in more detail, the overall delay of an analysis filterbank according to the present invention employing the window function 700 as shown in FIGS. 11 and 12 comprises an overall delay of 127 samples, whereas the original SBR QMF prototype filter-based SBR tool results in an overall delay of 640 samples.

The replacement of the QMF filterbanks in the SBR module, for instance in the SBR decoder 610, by a complex-valued low-delay filterbank (CLDFB) results in a delay reduction from 42 ms to 31.3 ms without introducing any degradation of audio quality or additional computational complexity. With the new filterbank both, the standard SBR mode (high-quality mode) and the low-power mode employing only real-valued filterbanks, are supported, as the description of embodiments according to the present invention with respect to FIGS. 7 to 10 has shown.

Especially in the field of telecommunication and bidirectional communication, a low-delay is of great importance. While the enhanced low-delay AAC is already capable of achieving a delay low enough for communication applications of 42 ms, its algorithmic delay is still higher than that of the low-delay AAC corecodec, which is capable of achieving delays of down to 20 ms and that of other telecommunication codecs. In the SBR decoder 610, the QMF analysis and synthesis stages still cause a reconstruction delay of 12 ms. A promising approach to reduce that delay is to utilize a low-delay filterbank technique according to an embodiment of the present invention and to replace the current QMF filterbanks by a respective low-delay version according to the embodiments of the present invention. In other words, a further delay reduction is achieved by simply replacing the regular filterbanks used in the SBR module 610 by a complex low-delay filterbank according to the embodiments of the present invention.

For the usage in the SBR module 610, the new filterbanks according to embodiments of the present invention, which are also referred to as CLDFBs, are designed to be as similar to the originally used QMF filterbanks as possible. This includes, for instance, the use of 64 subbands or bands, an equal length of the impulse responses and a compatibility with dual-rate modes as employed in SBR systems.

FIG. 13 illustrates the comparison of the CLDFB window shape 700 according to an embodiment of the present invention and the original SBR QMF prototype filter 720. Furthermore, it illustrates the delay of modulated filterbanks, which can be determined by analyzing the overlap delay introduced by the prototype filter or window function in addition to the framing delay of the modulation core having a length of N samples in the case of a DCT-IV-based system. The situation shown in FIG. 13 refers once again to the case of a synthesis filterbank. The window function 700 and the prototype filter function 720 also represent impulse responses of the synthesis prototype filters of the two filterbanks involved.

With respect to the delay analysis for both the SBR QMF filterbank and the proposed CLDFB according to an embodiment of the present invention, in the analysis and the synthesis only the overlap to the right side and the left side of the modulation core, respectively, adds delay.

For both filterbanks, the modulation core is based on a DCT-IV introducing a delay of 64 samples, which is marked in FIG. 13 as the delay 750. In the case of the SBR QMF prototype filter 720 due to the symmetry the modulation core delay 750 is symmetrically arranged with respect to the center of mass or center point of the respective prototype filter function 720 as indicated in FIG. 13. The reason for this behavior is that the buffer of the SBR QMF filterbank needs to be filled up to a point that the prototype filter function 720 having the most significant contribution in terms of the respective energy values of the prototype filter values will be considered in the processing. Due to the shape of the prototype filter function 720, this necessitates the buffer to be filled up at least to the center point or center of mass of the respective prototype filter function.

To illustrate this further, starting from an all initialized buffer of the corresponding SBR QMF filterbank, the buffer needs to be filled up to a point that a processing of data will result in a processing of significant data, which necessitates the respective window function or prototype filter function to have a significant contribution. In the case of the SBR QMF prototype filter function, the symmetric shape of the prototype filter 720 yields a delay, which is of the order of the center of mass or center point of the prototype filter function.

However, as the delay introduced by the modulation core of the DCT-IV-based system of N=64 for samples is present and the system also comprises a delay of one block, it can be observed that the synthesis prototype for the SBR QMF introduces an overlap delay of 288 samples.

As indicated earlier, in the case of the synthesis filterbanks to which FIG. 13 relates, this additional left-side overlap 760 causes the delay, while the right-side overlap 770 relates to past samples and therefore does not introduce an additional delay in the case of a synthesis filterbank.

In contrast, starting with an all initialized buffer of the CLDFB according to an embodiment of the present invention, the synthesis filterbank as well as the analysis filterbank is capable of providing "meaningful" data sooner compared to the SBR QMF filterbank due to the shape of the window function. In other words, due to the shape of the analysis or synthesis window function 700, samples processed by window functions indicative of the significant contribution is sooner possible. As a consequence, the synthesis prototype or synthesis window function of the CLDFB introduces only an overlap delay of 32 samples taking into account the delay already introduced by the modulation core 750. The first portion 420 or first group 420 of window coefficients of the window function 700 according to an embodiment of the present invention comprises in an embodiment according to the present invention the 96 window coefficients corresponding to the delay caused by the left-side overlap 760 together with the modulation core delay 750.

The same delay is introduced by the analysis filterbank or the analysis prototype function. The reason is that the analysis filterbank is based on the time-reverse version of the synthesis window function or prototype function. Thus, the overlap delay is introduced on the right side comprising the same overlap size as for the synthesis filterbank. Hence, in the case of an original QMF prototype filterbank, also a delay of 288 samples is introduced while for an analysis filterbank according to an embodiment of the present invention only 32 samples are introduced as a delay.

The table shown in FIG. 14a provides an overview of the delay with different modification stages assuming a frame length of 480 samples and a sampling rate of 48 kHz. In a standard configuration comprising an AAC-LD codec along with a standard SBR tool, the MDCT and IMDCT filterbanks in the dual-rate mode cause a delay of 40 ms. Moreover, the QMF tool itself causes a delay of 12 ms. Moreover, due to an SBR-overlap, a further delay of 8 ms is generated so that the overall delay of this codec is in the range of 60 ms.

In comparison an AAC-ELD codec comprising low-delay versions of the MDCT and the IMDCT generate in the dual-rate approach a delay of 30 ms. Compared to the original QMF filterbank of an SBR tool, employing a complex-valued low-delay filterbank according to an embodiment of the present invention will result in a delay of only 1 ms compared to 12 ms of the original QMF tool. By avoiding the SBR-overlap the additional overlap of 8 ms of a straightforward combination of an AAC-LD and the SBR tool can be avoided completely. Therefore, the enhanced low-delay AAC codec is capable of an overall algorithmic delay of 31 ms rather than 60 ms for the straightforward combination previously outlined. Therefore, it can be seen that the combination of the described delay reduction methods indeed results in a total delay saving of 29 ms.

The table in FIG. 14b gives a further overview of the overall codec delay caused by the original and the proposed filterbank versions in a system as shown in FIGS. 5 and 6. The data and values given in FIG. 14b are based on a sampling rate of 48 kHz and a core coder frame size of 480 samples. Due to the dual-rate approach of a SBR system as shown and discussed in FIGS. 5 and 6, the core coder is effectively running at a sampling rate of 24 kHz. Since the framing delay of 64 samples for the modulation core is already introduced by the core coder, it can be subtracted from the standalone delay values of the two filterbanks as described in the context of FIG. 13.

The table in FIG. 14b underlines that it is possible to reduce the overall delay of the enhanced low-delay AAC codec comprising the low-delay versions of the MDCT and the IMDCT (LD MDCT and LD IMDCT). While an overall algorithmic delay of 42 ms is achievable only by employing the low-delay versions of the MDCT and the IMDCT as well as the original QMF filterbanks, by using complex-valued low-delay filterbanks according to embodiments of the present invention instead of the conventional QMF filterbanks, the overall algorithmic delay can be significantly reduced to only 31.3 ms.

To evaluate the quality of the filterbanks according to embodiments of the present invention and systems comprising one or more filterbanks, listening tests have been carried out, from which it can be concluded that filterbanks according to embodiments of the present invention keep the audio quality of AAC-ELD at the same level and do not introduce any degradation, neither for the complex SBR mode nor for the real-valued low-power SBR mode. Thus, the delay-optimized filterbanks according to embodiments of the present invention do not introduce any burden on the audio quality although they are capable of reducing the delay by more than 10 ms. For the transient items it can even be observed that some slight, but not statistically significant improvements are achievable. The above-mentioned improvements have been observed during listening tests of castagnettes and glockenspiels.

In order to further verify that the downsampling in the case of a 32-band filterbank according to an embodiment of the present invention works equally well for the filterbanks according to the present invention compared to QMF filterbanks, the following evaluation was performed. First, a logarithmic sine sweep was analyzed with a downsampled 32-band filterbank, wherein the 32 upper bands, initialized with zeros, were added. Afterwards, the outcome was synthesized by a 64-band filterbank, downsampled again and compared to the original signal. Using a conventional SBR QMF prototype filter results in a signal-to-noise ratio (SNR) of 59.5 dB. A filterbank according to the present invention, however, achieves an SNR value of 78.5 dB, which illustrates that filterbanks according to embodiments of the present invention also perform in the downsampled version at least as well as the original QMF filterbanks.

In order to show that this delay-optimized, non-symmetric filterbank approach as employed in embodiments according to the present invention does provide additional value compared to a classical filterbank with a symmetric prototype, asymmetric prototypes will be compared with symmetric prototypes having the same delay in the following.

Figure 15A:
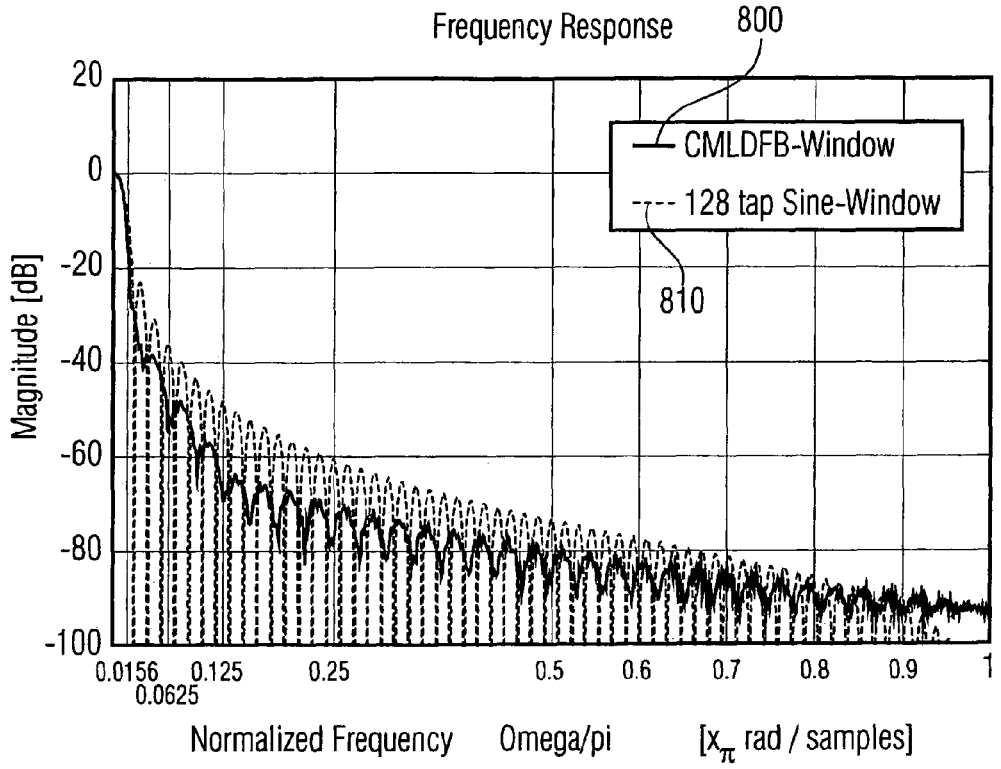
FIG. 15a shows a comparison of a frequency response of an apparatuses based on a window function according to an embodiment of the present invention and an apparatus based on a sine window function.
Figure 15B:
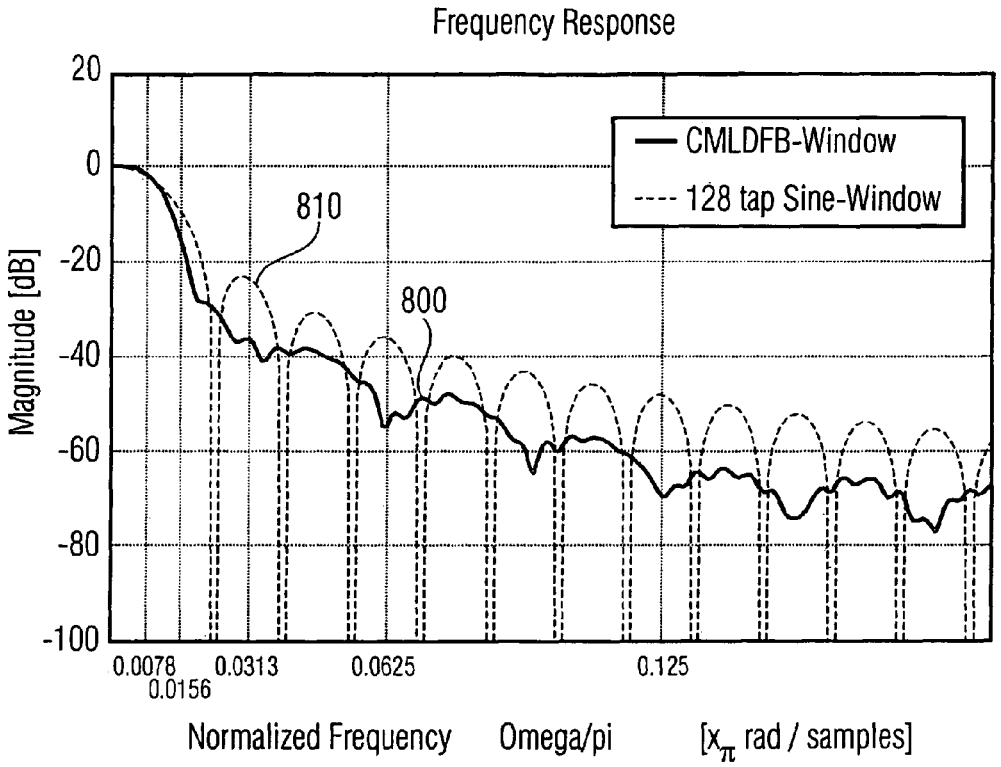

FIG. 15a shows a comparison of a frequency response in a far-field illustration of a filterbank according to the present invention employing a low-delay window (graph 800) compared to the frequency response of a filterbank employing a sine-window having a length of 128 taps (graph 810). FIG. 15b shows a magnification of the frequency response in the near-field of the same filterbanks employing the same window functions as outlined before.

A direct comparison of the two graphs 800, 810 shows that the frequency response of the filterbank employing a low-delay filterbank according to an embodiment of the present invention is significantly better than the corresponding frequency response of a filterbank employing a sine-window of 128 taps having the same delay.

Also, FIG. 16a shows a comparison of different window functions with an overall delay of 127 samples. The filterbank (CLDFB) with 64 bands comprises an overall delay of 127 samples including the framing delay and the overlap delay. A modulated filterbank with a symmetric prototype and the same delay would, therefore, have a prototype of a length of 128, as already illustrated in the context of FIGS. 15a and 15b. For these filterbanks with 50% overlap, such as, for instance, the MDCT, sine-windows or Kaiser-Bessel-derived windows generally provide a good choice for prototypes. Hence, in FIG. 16a an overview of a frequency response of a filterbank employing a low-delay window as a prototype according to an embodiment of the present invention is compared to the frequency responses of alternative symmetric prototypes with the same delay. FIG. 16a shows, apart from the frequency response of the filterbank according to the present invention (graph 800) and the frequency response of a filterbank employing a sine-window (graph 810), as already shown in FIGS. 15a and 15b, furthermore two KBD windows based on the parameters $\alpha=4$ (graph 820) and $\alpha=6$ (graph 830). Both, FIG. 16a and the close-up of FIG. 16a shown in FIG. 16b, clearly show that a much better frequency response can be achieved with a filterbank according to an embodiment of the present invention having a non-symmetric window function or a prototype filter function with the same delay.

To illustrate this advantage on a more general basis, in FIG. 17 two filterbank prototypes with delay values different from the previously described filterbank are compared. While the filterbank according to the present invention, which was considered in FIGS. 15 and 16, has an overall delay of 127 samples, which corresponds to an overlap of 8 blocks into the past and 0 blocks into the future (CLDFB 80), FIG. 17 shows a comparison of the frequency responses of two different filterbank prototypes with a same delay of 383 samples. To be more precise, FIG. 17 shows a frequency response of a non-symmetric prototype filterbank (graph 840) according to an embodiment of the present invention, which is based on an overlap of 6 blocks of time-domain samples into the past and 2 blocks of time-domain samples into the future (CLDFB 62). Moreover, FIG. 17 also shows the frequency response (graph 850) of a corresponding symmetric prototype filter function also having a delay of 383 samples. It can be seen that with the same delay value a non-symmetric prototype or window function achieves a better frequency response than a filterbank with a symmetric window function or prototype filter. This demonstrates the possibility of a better trade-off between delay and quality, as indicated earlier.

FIG. 18 illustrates the temporal masking effect of the human ear. When a sound or a tone appears at a moment in time indicated by a line 860 in FIG. 18, a masking effect concerning the frequency of the tone or the sound and neighboring frequencies arises approximately 20 ms before the actual sound starts. This effect is called pre-masking and is one aspect of the psychoacoustic properties of the human ear.

In the situation illustrated in FIG. 18, the sound remains audible for approximately 200 ms until a moment in time illustrated by a line 870. During this time, a masker of the human ear is active, which is also called simultaneous masking. After the sound stops (illustrated by line 870), the masking of the frequency in the neighboring frequency of the tone slowly decays over a period of time of approximately 150 ms as illustrated in FIG. 18. This psychoacoustic effect is also referred to as post-masking.

Figure 19A:
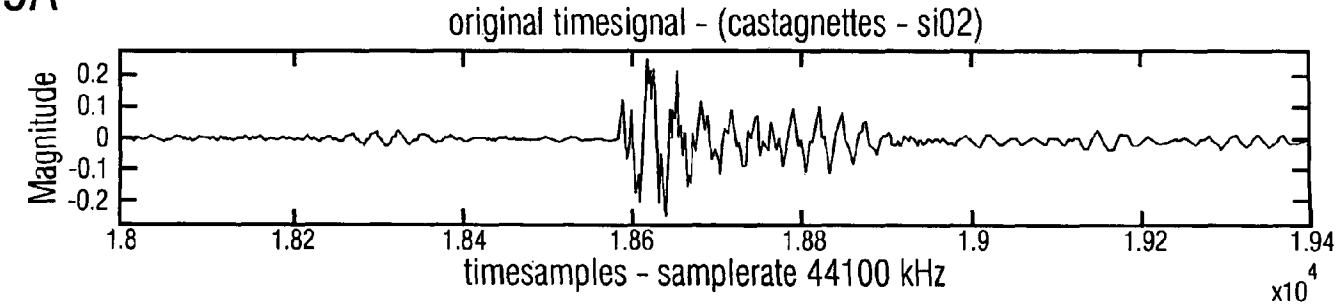
FIG. 19 illustrates a comparison of an original audio time signal, a time signal generated based on HEAAC codec and a time signal based on codec comprising an embodiment of the present invention.
Figure 19B:
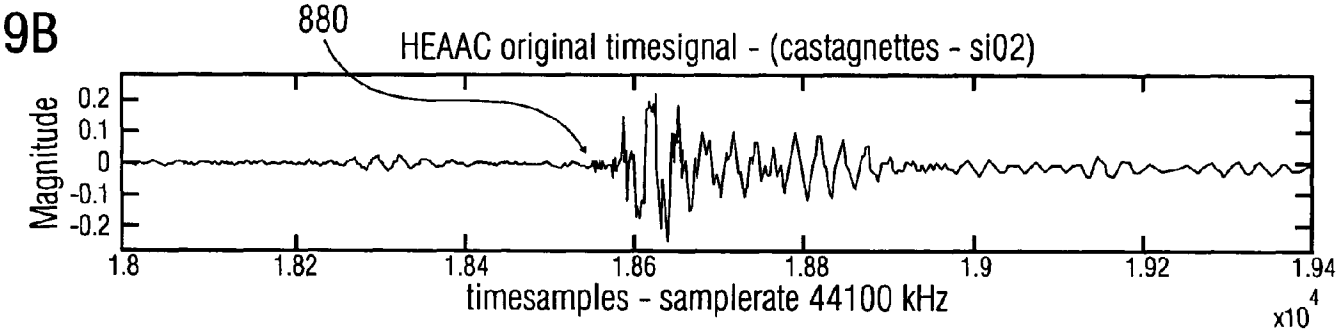

FIG. 19 illustrates a comparison of a pre-echo behavior of a conventional HE-AAC coded signal and an HE-AAC coded signal which is based on a filterbank employing a low-delay filterbank (CMLDFB) according to an embodiment of the present invention. FIG. 19a illustrates the original time signal of castagnettes, which have been processed with a system comprising an HE-AAC codec (HE-AAC=high-efficiency advanced audio codec). The output of the system based on the conventional HE-AAC is illustrated in FIG. 19b. A direct comparison of the two signals, the original time signal and the output signal of the HE-AAC codec shows that prior to the beginning of the sound of the castagnettes in the area illustrated by an arrow 880 the output signal of the HE-AAC codec comprises noticeable pre-echo effects.

Figure 19C:
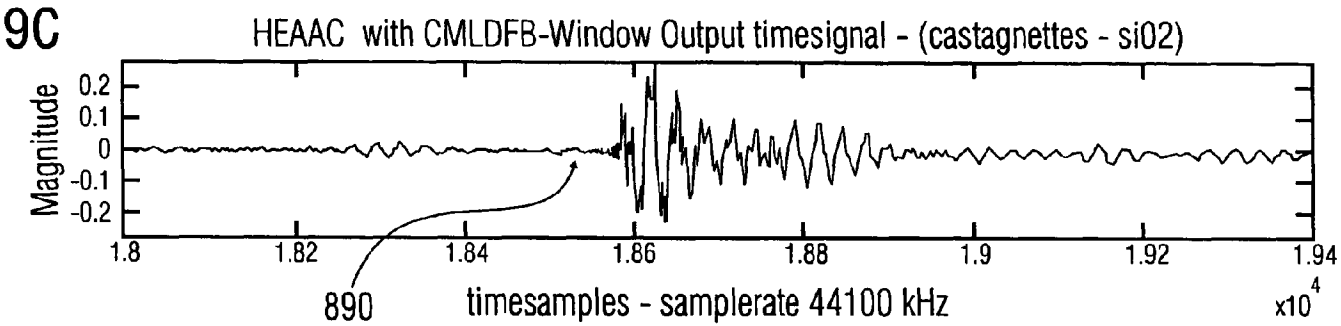

FIG. 19c illustrates an output signal of a system comprising an HE-AAC based on filterbanks comprising CMLDFB-windows according to an embodiment of the present invention. The same original time signals indicated in FIG. 19a and processed using filterbanks according to an embodiment of the present invention show a significantly reduced appearance of pre-echo effects just prior to the beginning of a castagnettes signal as indicated by an arrow 890 in FIG. 19c. Due to the pre-masking effect as described in the context of FIG. 18, the pre-echo effect indicated by the arrow 890 of FIG. 19c will be far better masked than the pre-echo effects indicated by the arrow 880 in the case of the conventional HE-AAC codec. Therefore, the pre-echo behavior of filterbanks according to the present invention, which is also a result of the significantly reduced delay compared to conventional filterbanks, causes the output to be far better fitted to the temporal masking properties and the psychoacoustics of the human ear. As a consequence, as was already indicated when describing the listening tests, employing filterbanks according to an embodiment of the present invention can even lead to an improvement concerning the quality caused by the reduced delay.

Embodiments according to the present invention do not increase the computational complexity compared to conventional filterbanks. Low-delay filterbanks use the same filter length and the same mode of modulation as, for instance, QMF filterbanks in the case of SBR systems such that the computational complexity does not increase. In terms of memory requirements due to the asymmetric nature of the prototype filters, the ROM (read-only memory) memory requirement for the synthesis filterbank increase approximately by 320 words in the case of a filterbank based on N=64 samples per block and T=10 blocks per frame. Moreover, in the case of an SBR-related system, the memory requirement further increases by another 320 words if the analysis filter is stored separately.

However, as the current ROM requirements for an AAC-ELD core is approximately 2.5 k words (kilo words) and for the SBR implementation another 2.5 k words, the ROM requirement is only moderately increased by about 10%. As a possible trade-off between memory and complexity, if a low memory consumption is paramount, a linear interpolation can be used to generate the analysis filter from the synthesis filter as outlined in the context of FIG. 3 and equation (15). This interpolation operation increases the number of instructions by only approximately 3.6%. Therefore, a replacement of the conventional QMF filterbanks in the framework of SBR modules by: low-delay filterbanks according to embodiments of the present invention, the delay can be reduced in some embodiments by more than 10 ms without any degradation of audio quality or noticeable increase in complexity.

Embodiments according to the present invention therefore relate to an analysis or synthesis window or apparatus or method for windowing. Moreover, an analysis or synthesis filterbank or method of analyzing or synthesizing a signal using a window is described. Naturally, the computer program implementing one of the above methods is also disclosed.

Implementation according to embodiments of the present invention can be carried out as hardware implementations, software implementations or a combination of both. Data, vectors and variables generated, received or otherwise stored to be processed may be stored in different kinds of memories such as random-access memories, buffers, Read-Only memories, non-volatile memories (e.g. EEPROMs, flash-memories) or other memories such as magnetic or optical memories. A storage position may, for instance, be one or more memory units needed to store or save the respective amounts of data, such as variables, parameters, vectors, matrices, window coefficients or other pieces of information and data.

Software implementations may be operated on different computers, computer-like systems, processors, ASICs (application-specific integrated circuits) or other integrated circuits (ICs).

Depending on certain implementation requirements of embodiments of the inventive methods, embodiments of the inventive methods can be implemented in hardware, software or in a combination of both. The implementation can be performed using a digital storage medium, in particular a disc CD, a DVD or another disc having an electronically readable control signal stored thereon which cooperates with a programmable computer system, processor or integrated circuit such that an embodiment of the inventive method is performed. Generally, an embodiment of the present invention is, therefore, a computer program product with a program code stored on a machine-readable carrier, the program code being operated for performing an embodiment of the inventive methods when the computer program product runs on a computer, processor or integrated circuit. In other words, embodiments of the inventive methods are, therefore, a computer program having a program code for performing at least one embodiment of the inventive methods when the computer program runs on a computer, processor or integrated circuit.

An apparatus for generating audio subband values in audio subband channels according to an embodiments of the present invention comprises an analysis windower (110) for windowing a frame (120) of time-domain audio input samples being in a time sequence extending from an early sample to a later sample using an analysis window function (190) comprising a sequence of window coefficients to obtain windowed sampled, the analysis window function (190) comprising a first group (200) of window coefficients comprising a first portion of the sequence of window coefficients and a second group (210) of window coefficients comprising a second portion of the sequence of window coefficients, the first portion comprising less window coefficients than the second portion, wherein an energy value of the window coefficients in the first portion is higher than an energy value of the window coefficients of the second portion, wherein the first group of window coefficients is used for windowing later time-domain samples and the second group of window coefficients is used for windowing earlier time-domain samples, and a calculator (170) for calculating the audio subband values using the windowed samples.

In an apparatus for generating audio subband values in audio subband channels according to an embodiments of the present invention, the analysis windower (110) is adapted such that the analysis window function (190) is asymmetric with respect to the sequence of window coefficients.

In an apparatus for generating audio subband values in audio subband channels according to an embodiments of the present invention, the analysis windower (110) is adapted such that an energy value of the window coefficients of the first portion is equal to or greater than ⅔ of an energy value of all window coefficients of the sequence of window coefficients and an energy value of the window coefficients of the second portion of window coefficients is smaller than or equal to ⅓ of an energy value of all window coefficients of the sequence of window coefficients.

In an apparatus for generating audio subband values in audio subband channels according to an embodiments of the present invention, the analysis windower (110) is adapted such that the first portion of window coefficients comprises ⅓ or less than ⅓ of a total number of window coefficients of the sequence of window coefficients and the second portion comprises ⅔ or more than ⅔ of the total number of window coefficients of the sequence of window coefficients.

In an apparatus for generating audio subband values in audio subband channels according to an embodiments of the present invention, the analysis windower (110) is adapted such that a center point of the window coefficients of the analysis window function (190) corresponds to a real value in an index range of the first portion of window coefficients.

In an apparatus for generating audio subband values in audio subband channels according to an embodiments of the present invention, the analysis windower (110) is adapted such that the analysis window function (190) comprises a strictly monotonic decreasing from the window coefficient comprising the highest absolute value of all window coefficients of the analysis window function (190) to a window coefficient of the sequence of window coefficients used for windowing the latest time-domain audio sample.

In an apparatus for generating audio subband values in audio subband channels according to an embodiments of the present invention, the analysis windower (110) is adapted such that the analysis window function (190) comprises an oscillating behavior.

In an apparatus for generating audio subband values in audio subband channels according to an embodiments of the present invention, the analysis windower (110) is adapted such that the window coefficient corresponding to an index $n=(T-1)\cdot N$ comprises an absolute value in the range of 0.9 to 1.1, wherein an index of the sequence of window coefficients is an integer in the range of 0 to $N\cdot T-1$, wherein the window coefficient used for windowing the latest time-domain audio input sample of the frame 120 is the window coefficient corresponding to the index $N\cdot T-1$, wherein the analysis windower (110) is adapted such that the frame (120) of time-domain audio input samples comprises a sequence of T blocks (130) of time-domain audio input samples extending from the earliest to the latest time-domain audio input samples of the frame (120), each block comprising N time-domain audio input samples, and wherein T and N are positive integers and T is larger than 4.

In an apparatus for generating audio subband values in audio subband channels according to an embodiments of the present invention, the analysis windower (110) is adapted such that the window coefficient corresponding to the index of the window coefficients $n=N\cdot T-1$ comprises an absolute value of less than 0.02.

In an apparatus for generating audio subband values in audio subband channels according to an embodiments of the present invention, the analysis window (110) is adapted such that windowing comprises multiplying the time-domain audio input samples x(n) of the frame (120) to obtain the windowed samples z(n) of the windowed frame based on the equation $$z(n)=x(n)\cdot c(n)$$

wherein n is an integer indicating an index of the sequence of window coefficients in the range of 0 to $T\cdot N-1$, wherein c(n) is the window coefficient of the analysis window function corresponding to the index n, wherein $x(N\cdot T-1)$ is the latest time-domain audio input sample of a frame (120) of time-domain audio input samples, wherein the analysis windower (110) is adapted such that the frame (120) of time-domain audio input samples comprises a sequence of T blocks (130) of time-domain audio input samples extending from the earliest to the latest time-domain audio input samples of the frame (120), each block comprising N time-domain audio input samples, and wherein T and N are positive integers and T is larger than 4.

In an apparatus for generating audio subband values in audio subband channels according to an embodiments of the present invention, the analysis windower (110) is adapted such that the window coefficients c(n) obey the relations given in the table in Annex 4.

In an apparatus for generating audio subband values in audio subband channels according to an embodiments of the present invention, the apparatus (100) is adapted to using an analysis window function (190) being a time-reversed or index-reversed version of a synthesis window function (370) to be used for the audio subband values.

In an apparatus for generating audio subband values in audio subband channels according to an embodiments of the present invention, the analysis windower (110) is adapted such that the first portion of the analysis window function comprises a window coefficient having an absolute maximum value being greater than 1.

In an apparatus for generating audio subband values in audio subband channels according to an embodiments of the present invention, the analysis windower (110) is adapted such that all window coefficients of the sequence of window coefficients are real-valued window coefficients.

In an apparatus for generating audio subband values in audio subband channels according to an embodiments of the present invention, the analysis windower (110) is adapted such that the frame (120) of time-domain audio input samples comprises a sequence of T blocks (130) of time-domain audio input samples extending from the earliest to the latest time-domain audio input samples of the frame (120), each block comprising N time-domain audio input samples, wherein T and N are positive integers and T is larger than 4.

In an apparatus for generating audio subband values in audio subband channels according to an embodiments of the present invention, the analysis windower (110) is adapted such that windowing comprises an element-wise multiplying of the time-domain audio input samples of the frame (120) with the window coefficients of the sequence of window coefficients.

In an apparatus for generating audio subband values in audio subband channels according to an embodiments of the present invention, the analysis windower (110) is adapted such that each time-domain audio input sample is element-wise multiplied with a window coefficient of the analysis window function according to a sequence of time-domain audio input samples and the sequence of window coefficients.

In an apparatus for generating audio subband values in audio subband channels according to an embodiments of the present invention, the analysis windower (110) is adapted such that for each time-domain audio input sample of the frame (120) of time-domain audio input samples exactly one windowed sample is generated.

In an apparatus for generating audio subband values in audio subband channels according to an embodiments of the present invention, the analysis windower (110) is adapted such that the window coefficient corresponding to an index of the window coefficients $n=(T-3)\cdot N$ comprises a value of less than −0.1, wherein the index of the sequence of window coefficients is an integer in the range of 0 to $N\cdot T-1$, and wherein the window coefficient used for windowing the latest time-domain audio input sample is the window coefficient corresponding to the index $N\cdot T-1$.

In an apparatus for generating audio subband values in audio subband channels according to an embodiments of the present invention, the analysis windower (110) is adapted such that the first portion of window coefficients comprises $3/2\cdot N$ window coefficients and the second portion of window coefficients comprises $(T-3/2)\cdot N$ window coefficients of the sequence of window coefficients.

In an apparatus for generating audio subband values in audio subband channels according to an embodiments of the present invention, the analysis windower (110) is adapted such that the window coefficients c(n) fulfill the relations given in the table in Annex 3.

In an apparatus for generating audio subband values in audio subband channels according to an embodiments of the present invention, the analysis windower (110) is adapted such that the window coefficients c(n) fulfill the relations given in the table in Annex 2.

In an apparatus for generating audio subband values in audio subband channels according to an embodiments of the present invention, the analysis windower (110) is adapted such that the window coefficients c(n) comprise the values given in the table in Annex 1.

In an apparatus for generating audio subband values in audio subband channels according to an embodiments of the present invention, the apparatus (100) is adapted such that the present frame (120) of time-domain audio input samples to be processed is generated by shifting (T−1) later blocks of a directly preceding frame (120) of time-domain audio input samples by one block towards the earlier time-domain audio input samples and by adding one block (220) of fresh time-domain audio samples as the block comprising the latest time-domain audio input samples of the present frame (120).

In an apparatus for generating audio subband values in audio subband channels according to an embodiments of the present invention, the apparatus (100) is adapted such that the present frame (120) of time-domain audio input samples x(n) to be processed is generated based on shifting the time-domain audio input samples $x_{prev}(n)$ of the directly preceding frame (120) of time-domain audio input samples based on the equation $$x(n-32)=x_{prev}(n)$$

for a time or sample index n=32, . . . , 319, and wherein the apparatus (100) is further adapted to generating the time-domain audio input samples x(n) of the present frame (120) of time-domain audio input samples by including 32 next incoming time-domain input samples according to an order of the incoming time-domain audio input samples of decreasing time or sample indices n for the time-domain audio input samples x(n) of the present frame (120) starting at the time or sample index n=31.

In an apparatus for generating audio subband values in audio subband channels according to an embodiments of the present invention, the calculator (170) comprises a time/frequency converter adapted to generating the audio subband values such that all subband values based on one frame (150) of windowed samples represent a spectral representation of the windowed samples of the frame (150) of windowed samples.

In an apparatus for generating audio subband values in audio subband channels according to an embodiments of the present invention, the time/frequency converter is adapted to generating complex-valued or real-valued audio subband values.

In an apparatus for generating audio subband values in audio subband channels according to an embodiments of the present invention, the calculator (170) is adapted to calculating one audio subband value for each time-domain audio input sample of one block (130) of time-domain audio input samples, wherein calculating each audio subband value or each of the time-domain audio input samples of one block (130) of time-domain audio input samples is based on the windowed samples of the windowed frame (150).

In an apparatus for generating audio subband values in audio subband channels according to an embodiments of the present invention, the calculator (170) is adapted to calculating the audio subband values based on multiplying the windowed samples (150) with a harmonically oscillating function for each subband value and summing up the multiplied windowed samples, wherein a frequency of the harmonically oscillating function is based on a center frequency of a corresponding subband of the subband values.

In an apparatus for generating audio subband values in audio subband channels according to an embodiments of the present invention, the calculator (170) is adapted such that the harmonically oscillating function is a complex exponential function, a sine function or a cosine function.

In an apparatus for generating audio subband values in audio subband channels according to an embodiments of the present invention, the calculator (170) is adapted to calculating the audio subband values $w_{kl}$ based on the equation $$u_n = \sum_{j=0}^{4} z(n + j \cdot 64)$$

for n=0, . . . , 63 and $$w_{kl} = \sum_{n=0}^{63} u_n \cdot 2 \cdot f_{osc}\left(\frac{\pi}{64} \cdot (k + 0.5) \cdot (2n - 95)\right)$$

for k=0, . . . , 31, wherein z(n) is a windowed sample corresponding to an index n, wherein k is a subband index, wherein 1 is an index of a block (180) of audio subband values and wherein $f_{osc}(x)$ is an oscillating function depending on a real-valued variable x.

In an apparatus for generating audio subband values in audio subband channels according to an embodiments of the present invention, the calculator (170) is adapted such that the oscillating function $f_{osc}(x)$ is $$f_{osc}(x)=\exp(i \cdot x)$$

or $$f_{osc}(x)=\cos(x)$$

or $$f_{osc}(x)=\sin(x)$$

wherein i is the imaginary unit.

In an apparatus for generating audio subband values in audio subband channels according to an embodiments of the present invention, the apparatus (100) is adapted to processing a frame (120) of real-valued time-domain audio input samples.

In an apparatus for generating audio subband values in audio subband channels according to an embodiments of the present invention, the apparatus (100) is adapted to providing a signal indicative of a synthesis window function (370) to be used with the audio subband values or indicative of the analysis window function (190) used for generating the audio subband values.

An apparatus for generating time-domain audio samples according to an embodiments of the present invention comprises a calculator (310) for calculating a sequence (330) of intermediate time-domain samples from audio subband values in audio subband channels, the sequence comprising earlier intermediate time-domain samples and later time-domain samples, a synthesis windower (360) for windowing the sequence (330) of intermediate time-domain samples using a synthesis window function (370) comprising a sequence of window coefficients to obtain windowed intermediate time-domain samples, the synthesis window function (370) comprising a first group (420) of window coefficients comprising a first portion of the sequence of window coefficients and a second group (430) of window coefficients comprising a second portion of the sequence of window coefficients, the first portion comprising less window coefficients than the second portion, wherein an energy value of the window coefficients in the first portion is higher than an energy value of the window coefficients of the second portion, wherein the first group of window coefficients is used for windowing later intermediate time-domain samples and the second group of window coefficients is used for windowing earlier intermediate time-domain samples, and an overlap-adder output stage (400) for processing the windowed intermediate time-domain samples to obtain the time-domain samples.

In an apparatus for generating time-domain audio samples according to an embodiments of the present invention, the synthesis windower (360) is adapted such that an energy value of the window coefficients of the first portion of window coefficients is larger than or equal to ⅔ of an energy value of all window coefficients of the synthesis window function (370) and an energy value of the second portion of window coefficients is smaller than, or equal to ⅓ of the energy value of all window coefficients of the synthesis window function.

In an apparatus for generating time-domain audio samples according to an embodiments of the present invention, the synthesis windower (360) is adapted such that the first portion of window coefficients comprises ⅓ or less than ⅓ of the total number of all window coefficients of the sequence of window coefficients and the second portion of window coefficients comprises ⅔ or more than ⅔ of the total number of window coefficients of the sequence of window coefficients.

In an apparatus for generating time-domain audio samples according to an embodiments of the present invention, the synthesis windower (360) is adapted such that a center point of the window coefficients of the synthesis window function (370) corresponds to a real value in an index range of the first portion of window coefficients.

In an apparatus for generating time-domain audio samples according to an embodiments of the present invention, the synthesis windower (360) is adapted such that the synthesis window function comprises a strictly monotonic increase from the window coefficient of the sequence of window coefficients used for windowing the latest intermediate time-domain sample to the window coefficient comprising the highest absolute value of all window coefficients of the synthesis window function.

In an apparatus for generating time-domain audio samples according to an embodiments of the present invention, the synthesis windower (360) is adapted such that the synthesis window function (370) comprises an oscillating behavior.

In an apparatus for generating time-domain audio samples according to an embodiments of the present invention, the window coefficient corresponding to an index n=N comprises an absolute value in the range between 0.9 and 1.1, wherein the index n of the sequence of window coefficients is an integer in the range of 0 to T·N−1, wherein the window coefficient used for windowing the latest intermediate time-domain sample is the window coefficient corresponding to the index n=0, wherein T is an integer larger than 4 indicating the number of blocks comprises in the frame (330) of intermediate time-domain samples, wherein the apparatus (300) is adapted to generating a block (410) of time-domain audio samples, the block (410) of time-domain audio samples comprising N time-domain audio samples, wherein N is a positive integer.

In an apparatus for generating time-domain audio samples according to an embodiments of the present invention, the synthesis windower (360) is adapted such that the window coefficient corresponding to the index n=0 comprises an absolute value smaller than or equal to 0.02.

In an apparatus for generating time-domain audio samples according to an embodiments of the present invention, the synthesis windower (360) is adapted such that the window coefficient corresponding to an index n=3N is smaller than −0.1, wherein the apparatus (300) is adapted to generating a block (410) of time-domain audio samples, the block (410) of time-domain audio samples comprising N time-domain audio samples, wherein N is a positive integer.

In an apparatus for generating time-domain audio samples according to an embodiments of the present invention, the synthesis window (360) is adapted such that the windowing comprises multiplying the intermediate time-domain samples g(n) of the sequence of intermediate time-domain samples to obtain the windowed samples z(n) of the windowed frame (380) based on the equation $$z(n)=g(n)\cdot c(T\cdot N-1-n)$$

for n=0, . . . , T·N−1.

In an apparatus for generating time-domain audio samples according to an embodiments of the present invention, the synthesis windower (360) is adapted such that the window coefficient c(n) fulfill the relations given in the table in Annex 4.

In an apparatus for generating time-domain audio samples according to an embodiments of the present invention, the apparatus (300) is adapted to using the synthesis window function (370) being a time-reverse or index-reversed version of an analysis window function (190) used for generating the audio subband values.

In an apparatus for generating time-domain audio samples according to an embodiments of the present invention, the apparatus (300) is adapted to generating a block (410) of time-domain audio samples, the block (410) of time-domain audio samples comprising N time-domain audio samples, wherein N is a positive integer.

In an apparatus for generating time-domain audio samples according to an embodiments of the present invention, the apparatus (300) is adapted to generating the block (410) of time-domain audio samples, based on a block (320) of audio subband values comprising N audio subband values and wherein the calculator (310) is adapted to calculating the sequence (330) of intermediate time-domain audio samples comprising T·N intermediate time-domain audio samples, wherein T is a positive integer.

In an apparatus for generating time-domain audio samples according to an embodiments of the present invention, the synthesis windower (360) is adapted such that the synthesis window function is asymmetric with respect to the sequence window coefficient.

In an apparatus for generating time-domain audio samples according to an embodiments of the present invention, the synthesis windower (360) is adapted such that the first portion comprises a maximum value of all window coefficients of the synthesis window function having an absolute value larger than 1.

In an apparatus for generating time-domain audio samples according to an embodiments of the present invention, the synthesis windower (360) is adapted such that the first portion comprises 3/2·N window coefficients and the second portion of window coefficients comprises (T−3/2)·N window coefficients, wherein T is an index greater or equal to 4 indicating a number of blocks 340 comprised in the frame (330) of intermediate time-domain samples.

In an apparatus for generating time-domain audio samples according to an embodiments of the present invention, the synthesis windower (360) is adapted such that windowing the sequence of intermediate time-domain samples comprises an element-wise multiplying of the intermediate time-domain samples with a window coefficient.

In an apparatus for generating time-domain audio samples according to an embodiments of the present invention, the synthesis windower (360) is adapted such that each intermediate time-domain sample is element-wise multiplied with the window coefficient of the synthesis window function (370) according to the sequence of intermediate time-domain samples and the sequence of window coefficients.

In an apparatus for generating time-domain audio samples according to an embodiments of the present invention, the synthesis window (360) is adapted such that the window coefficients of the synthesis window function (370) are real-valued values.

In an apparatus for generating time-domain audio samples according to an embodiments of the present invention, the synthesis windower (360) is adapted such that the window coefficient c(n) fulfill the relations given in the table in Annex 3.

In an apparatus for generating time-domain audio samples according to an embodiments of the present invention, the synthesis windower (360) is adapted such that the window coefficients c(n) fulfill the relations given in the table in Annex 2.

In an apparatus for generating time-domain audio samples according to an embodiments of the present invention, the synthesis windower (360) is adapted such that the window coefficients c(n) comprise the values given in the table in Annex 1.

In an apparatus for generating time-domain audio samples according to an embodiments of the present invention, the calculator (310) is adapted to calculating the intermediate time-domain samples of the sequence of intermediate time-domain samples based on multiplying the audio subband values with a harmonic oscillating function and summing up the multiplied audio subband values, wherein the frequency of the harmonically oscillating function is based on a center frequency of the corresponding subband.

In an apparatus for generating time-domain audio samples according to an embodiments of the present invention, the calculator (310) is adapted such that the harmonically oscillating function is a complex exponential function, a sine-function or a cosine-function.

In an apparatus for generating time-domain audio samples according to an embodiments of the present invention, the calculator (310) is adapted to calculating real-valued intermediate time-domain samples based on the complex-valued or real-valued audio subband values.

In an apparatus for generating time-domain audio samples according to an embodiments of the present invention, the calculator (310) is adapted to calculating the sequence of real-valued intermediate time-domain samples z(i,n) based on the equation $$z_{i,n} = -\frac{1}{N}\sum_{k=0}^{N-1}\mathrm{Re}\left(X_{i,k}\cdot f_{osc}\left(\frac{\pi}{N}\left(n+\frac{1}{2}-\frac{N}{2}\right)\cdot\left(k+\frac{1}{2}\right)\right)\right)$$

for an integer n in the range of 0 to N·T−1, wherein Re(x) is the real part of the complex-valued number x, $\pi$= 3.14 . . . is the circular number and $f_{osc}(x)$ is a harmonically oscillating function, wherein $$f_{osc}(x)=\exp(i\cdot x),$$

when the audio subband values provided to the calculator are complex values, wherein I is the imaginary unit, and wherein $$f_{osc}(x)=\cos(x)$$

when the audio subband values provided to the calculator (310) are real values.

In an apparatus for generating time-domain audio samples according to an embodiments of the present invention, the calculator (310) comprises a frequency/time converter adapted to generating the sequence of intermediate time-domain samples, such that the audio subband values provided to the calculator (310) represent a spectral representation of the sequence of intermediate time-domain samples.

In an apparatus for generating time-domain audio samples according to an embodiments of the present invention, the frequency/time converter is adapted to generating the sequence of intermediate time/domain samples based on complex-valued or real-valued audio subband values.

In an apparatus for generating time-domain audio samples according to an embodiments of the present invention, the calculator (310) is adapted to calculating the sequence of intermediate time-domain samples g(n) from the audio subband values X(k) based on the equation $$v(n)=v_{prev}(n-2N)$$

for an integer n in the range of 20N−1 and 2N, $$v(n) = \sum_{k=0}^{N-1}\mathrm{Re}\left(X(k)\cdot\frac{1}{64}\exp\left(i\frac{\pi}{2N}\left(k+\frac{1}{2}\right)\cdot(2n-(N-1))\right)\right)$$

for the integer n in the range of 0 and 2N−1 and $$g(2N\cdot j+k)=v(4Nj+k)$$

$$g(2N\cdot j+N+k)=v(4Nj+3N+k)$$

for an integer j in the range of 0 and 4 and for an integer k in the range of 0 and N−1, wherein N is an integer indicating the number of audio subband values and the number of the time-domain audio samples, wherein v is a real-valued vector, wherein $v_{prev}$ is a real-valued vector v of the directly previous generation of time-domain audio samples, wherein i is the imaginary unit and $\pi$ is the circular number.

In an apparatus for generating time-domain audio samples according to an embodiments of the present invention, the calculator (310) is adapted to calculating the sequence of intermediate time-domain samples g(n) from the audio subband values X(k) based on the equation $$v(n)=v_{prev}(n-2N)$$

for an integer n in the range of 20N−1 and 2N, $$v(n) = \sum_{k=0}^{N-1}X(k)\cdot\frac{1}{32}\cdot\cos\left(\frac{\pi}{2N}\left(k+\frac{1}{2}\right)\cdot(2n-(N-1))\right)$$

for the integer n in the range of 0 and 2N−1 and $$g(2N\cdot j+k)=v(4Nj+k)$$

$$g(2N\cdot j+N+k)=v(4Nj+3N+k)$$

for an integer j in the range of 0 and 4 and for an integer k in the range of 0 and N−1, wherein N is an integer indicating the number of audio subband values and the number of the time-domain audio samples, wherein v is a real-valued vector, wherein $v_{prev}$ is a real-valued vector v of the directly previous generation of time-domain audio samples and wherein $\pi$ is the circular number.

In an apparatus for generating time-domain audio samples according to an embodiments of the present invention, the overlap-add output stage (400) is adapted to processing the windowed intermediate time-domain samples in an overlapping manner, based on T consecutively provided blocks (320) of audio subband values.

In an apparatus for generating time-domain audio samples according to an embodiments of the present invention, the overlap-add output stage (400) is adapted to providing the time-domain samples $out_l(n)$, wherein n is an integer indicating a sample index based on the equation $$out_1(n)\cdot = \sum_{k=0}^{T-1}z_{(1-k),n+k\cdot N}$$

wherein $z_{l,n}$ is a windowed intermediate time-domain sample corresponding to a sample index n and a frame or sequence index l in the range from 0 to T−1, wherein l=0 corresponds to the latest frame or sequence and smaller values of l to previously generated frames or sequences.

In an apparatus for generating time-domain audio samples according to an embodiments of the present invention, the overlap-add output stage (400) is adapted to providing the time-domain samples out(k) based on the equation $$\text{out}(k) = \sum_{k=0}^{9} w(N \cdot n + k),$$

wherein w is a vector comprising the windowed intermediate time-domain samples and k is an integer indicating an index in the range between 0 and (N−1).

In an apparatus for generating time-domain audio samples according to an embodiments of the present invention, the apparatus (300) is adapted to receiving a signal indicative of the analysis window function (190) used for generating the audio subband values, or indicative of the synthesis window function (370) to be used for generating the time-domain audio samples.

According to an embodiments of the present invention, an encoder (510) comprises an apparatus (560) for generating audio subband values in audio subband channels according to according to an embodiment of the present invention.

According to an embodiments of the present invention, an encoder (510) further comprises a quantizer and coder (570) coupled to the apparatus (560) for generating audio subband values and adapted to quantizing and coding the audio subband values output by the apparatus (560) and outputting the quantized coded audio subband values.

According to an embodiments of the present invention, a decoder (580) comprises an apparatus (600) for generating time-domain audio samples according to an embodiment of the present invention.

According to an embodiments of the present invention, a decoder (580) further comprises a decoder and dequantizer (590) adapted to receiving coded and quantized audio subband values, coupled to the apparatus (600) for generating time-domain audio samples and adapted to providing the decoded and dequantized audio subband values as the audio subband values to the apparatus (600).

According to an embodiments of the present invention, a SBR encoder (520) comprises an apparatus (530) for generating audio subband values in audio subband channels, based on a frame of time-domain audio input samples provided to the SBR encoder (520) and a SBR parameter extraction module (540) coupled to the apparatus (530) for generating audio subband values and adapted to extracting and outputting SBR parameters based on the audio subband values.

According to an embodiments of the present invention, a system (610) comprises an apparatus (620) for generating audio subband values from a frame of time-domain audio input samples provided to the system (610); and an apparatus (640) for generating time-domain audio samples based on the audio subband values generated by the apparatus (640) for generating audio subband values.

According to an embodiments of the present invention, a system (610) is a SBR decoder.

According to an embodiments of the present invention, a system further comprises a HF-generator (630) interconnected between the apparatus (620) for generating audio subband values and the apparatus (640) for generating time-domain audio samples and adapted to receiving SBR data adapted to modifying or adding audio subband values based on the SBR data and the audio subband values from the apparatus (620) for generating audio subband values.

With respect to all apparatuses and methods according to embodiments of the present invention, depending on implementational details, to obtain the window coefficients based on the values given in the tables in the Annexes 1 and 3, an additional sign changes with respect to the window coefficients corresponding to the indices 128 to 255 and 384 to 511 (multiplication with factor (−1)) can be implemented. In other words, the window coefficients of the window function are based on the window coefficients given in table in Annex 1. To obtain the window coefficients of the window function shown in the figures, the window coefficients in the table corresponding to the indices 0 to 127, 256 to 383 and 512 to 639 have to be multiplied by (+1) (i.e. no sign change) and the window coefficients corresponding to the indices 128 to 255 and 384 to 511 have to be multiplied by (−1) (i.e. a sign change) to obtain the window coefficients of the window function shown. Accordingly the relations given in the table in Annex 3 have to be treated accordingly.

It should be noted, that in the framework of the present application under an equation being based on an equation an introduction of additional delays, factors, additional coefficients and an introduction of another simple function is understood. Further, simple constants, constant addends etc., can be dropped. Moreover, algebraic transformations, equivalence transformations and approximations (e.g. a Taylor approximation) not changing the result of the equation at all or in a significant manner are also included. In other words, both slight modifications as well as transformations leading to essentially in terms of the result identical are included in the case that an equation or expression is based on an equation or expression.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

Annex 1 w[0] = 1.129580193872797e−002
w[1] = 2.353059744904218e−002
w[2] = 3.450718748721251e−002
w[3] = 4.634695977000525e−002
w[4] = 5.918677345174197e−002
w[5] = 7.325978412117062e−002
w[6] = 8.829745229234007e−002
w[7] = 1.042033024802571e−001
w[8] = 1.206924277410051e−001
w[9] = 1.376149808913910e−001
w[10] = 1.547461142258783e−001
w[11] = 1.719726384566089e−001
w[12] = 1.891590407342011e−001
w[13] = 2.062605107774960e−001
w[14] = 2.232276864673650e−001
w[15] = 2.400768261284114e−001
w[16] = 2.568176309566753e−001
w[17] = 2.734977190313227e−001
w[18] = 2.901491317310591e−001
w[19] = 3.068186515423912e−001
w[20] = 3.235298682841570e−001

-continued

Annex 1 w[21] = 3.403074146062977e−001
w[22] = 3.571527896130669e−001
w[23] = 3.740643974275026e−001
w[24] = 3.910243970160607e−001
w[25] = 4.080154903861317e−001
w[26] = 4.250144186334534e−001
w[27] = 4.420013942269341e−001
w[28] = 4.589582896478246e−001
w[29] = 4.758753745532750e−001
w[30] = 4.927463828072591e−001
w[31] = 5.095720854151864e−001
w[32] = 5.263554446856779e−001
w[33] = 5.430990601899994e−001
w[34] = 5.598052330684253e−001
w[35] = 5.764734796907189e−001
w[36] = 5.930981800982896e−001
w[37] = 6.096690552916387e−001
w[38] = 6.261725236758639e−001
w[39] = 6.425939632009995e−001
w[40] = 6.589148753746076e−001
w[41] = 6.751199626157149e−001
w[42] = 6.911981575264606e−001
w[43] = 7.071447728928043e−001
w[44] = 7.229599104052475e−001
w[45] = 7:386515025302785e−001
w[46] = 7.542294504292890e−001
w[47] = 7.697093346240386e−001
w[48] = 7.851012620144958e−001
w[49] = 8.004165237845137e−001
w[50] = 8.156523162880560e−001
w[51] = 8.308039608112368e−001
w[52] = 8.458450064727010e−001
w[53] = 8.607492455327098e−001
w[54] = 8.754640719350776e−001
w[55] = 8.899474405744183e−001
w[56] = 9.041286138017367e−001
w[57] = 9.179666107725365e−001
w[58] = 9.313874086278087e−001
w[59] = 9.443802853939540e−001
w[60] = 9.568885413848645e−001
w[61] = 9.690016637782843e−001
w[62] = 9.807691702375303e−001
w[63] = 9.927543720639498e−001
w[64] = 1.001463112557766e+000
w[65] = 1.006893331637123e+000
w[66] = 1.012508393574432e+000
w[67] = 1.017729040219375e+000
w[68] = 1.022470190536100e+000
w[69] = 1.026615653698808e+000
w[70] = 1.030198648769593e+000
w[71] = 1.033205850580933e+000
w[72] = 1.035694432087486e+000
w[73] = 1.037683165297586e+000
w[74] = 1.039227995800217e+000
w[75] = 1.040349586463588e+000
w[76] = 1.041086497214721e+000
w[77] = 1.041443375950143e+000
w[78] = 1.041434355650865e+000
w[79] = 1.041043184216171e+000
w[80] = 1.040262316588456e+000
w[81] = 1.039061496136853e+000
w[82] = 1.037422300157921e+000
w[83] = 1.035311720204252e+000
w[84] = 1.032712952177121e+000
w[85] = 1.029600494883906e+000
w[86] = 1.025966756910904e+000
w[87] = 1.021798805583990e+000
w[88] = 1.017100128250049e+000
w[89] = 1.011867706519706e+000
w[90] = 1.006109248754940e+000
w[91] = 9.998285752401580e−001
w[92] = 9.930379854679836e−001
w[93] = 9.857387823493258e−001
w[94] = 9.779405164766706e−001
w[95] = 9.696426101291272e−001
w[96] = 9.608519516143015e−001
w[97] = 9.515674613550604e−001

-continued

Annex 1 w[98] = 9.417975696327747e−001
w[99] = 9.315442093447622e−001
w[100] = 9.208194746232827e−001
w[101] = 9.096310803629866e−001
w[102] = 8.979959173503500e−001
w[103] = 8.859232320517536e−001
w[104] = 8.734366852542127e−001
w[105] = 8.605542791988831e−001
w[106] = 8.472987145504696e−001
w[107] = 8.336863467961255e−001
w[108] = 8.197387292306723e−001
w[109] = 8.054701312929008e−001
w[110] = 7.908995350037713e−001
w[111] = 7.760385598209244e−001
w[112] = 7.609051036128973e−001
w[113] = 7.455111681431031e−001
w[114] = 7.298745530879272e−001
w[115] = 7.140087729493950e−001
w[116] = 6.979336851549095e−001
w[117] = 6.816667882498023e−001
w[118] = 6.652304141388827e−001
w[119] = 6.486437667370537e−001
w[120] = 6.319284031798550e−001
w[121] = 6.151031151692835e−001
w[122] = 5.981877665956570e−001
w[123] = 5.811992722116214e−001
w[124] = 5.641522833259215e−001
w[125] = 5.470652177576862e−001
w[126] = 5.299509559653194e−001
w[127] = 5.128557121424191e−001
w[128] = −4.956175421414453e−001
w[129] = −4.782650346610896e−001
w[130] = −4.609828932783459e−001
w[131] = −4.437530233023859e−001
w[132] = −4.265950246465440e−001
w[133] = −4.095160467543179e−001
w[134] = −3.925409172155113e−001
w[135] = −3.756821671788237e−001
w[136] = −3.589626517817934e−001
w[137] = −3.423942311297658e−001
w[138] = −3.259993851088293e−001
w[139] = −3.097861805973821e−001
w[140] = −2.937724988593393e−001
w[141] = −2.779637821990255e−001
w[142] = −2.623749159488041e−001
w[143] = −2.470098299603623e−001
w[144] = −2.318815478758375e−001
w[145] = −2.169925682529340e−001
w[146] = −2.023548005388463e−001
w[147] = −1.879711746686855e−001
w[148] = −1.738542127021508e−001
w[149] = −1.600061812296078e−001
w[150] = −1.464389150679625e−001
w[151] = −1.331544923127771e−001
w[152] = −1.201628679722633e−001
w[153] = −1.074630704470568e−001
w[154] = −9.506966959632511e−002
w[155] = −8.298103104739203e−002
w[156] = −7.120356992726613e−002
w[157] = −5.973741829536090e−002
w[158] = −4.859005767016811e−002
w[159] = −3.775928110298274e−002
w[160] = −2.726484300186575e−002
w[161] = −1.711323992709580e−002
w[162] = −7.298197371320593e−003
w[163] = 2.184256929356781e−003
w[164] = 1.132324047372148e−002
w[165] = 2.012236990754980e−002
w[166] = 2.857528272530154e−002
w[167] = 3.666942822678171e−002
w[168] = 4.439683978044157e−002
w[169] = 5.177964768870787e−002
w[170] = 5.881296711410786e−002
w[171] = 6.550209046893848e−002
w[172] = 7.184073822817207e−002
w[173] = 7.783299328224960e−002
w[174] = 8.347150698567406e−002

-continued

Annex 1 w[175] = 8.875756217893037e−002
w[176] = 9.368651761350569e−002
w[177] = 9.826251129465624e−002
w[178] = 1.024804711677230e−001
w[179] = 1.063454554357498e−001
w[180] = 1.098551252869576e−001
w[181] = 1.130180022553412e−001
w[182] = 1.158358935177899e−001
w[183] = 1.183233335449968e−001
w[184] = 1.204854506722672e−001
w[185] = 1.223371395264402e−001
w[186] = 1.238868653862843e−001
w[187] = 1.251477258491527e−001
w[188] = 1.261262023246478e−001
w[189] = 1.268280540744526e−001
w[190] = 1.272498700590511e−001
w[191] = 1.273590703506806e−001
w[192] = 1.274567595465545e−001
w[193] = 1.275561350483646e−001
w[194] = 1.273648326872248e−001
w[195] = 1.269415772180714e−001
w[196] = 1.262995646340671e−001
w[197] = 1.254605188749804e−001
w[198] = 1.244269583009826e−001
w[199] = 1.232131583108813e−001
w[200] = 1.218183974842866e−001
w[201] = 1.202545652840080e−001
w[202] = 1.185243106889108e−001
w[203] = 1.166399102636992e−001
w[204] = 1.146042249339280e−001
w[205] = 1.124296184976912e−001
w[206] = 1.101215600923314e−001
w[207] = 1.076972053405737e−001
w[208] = 1.051641975499523e−001
w[209] = 1.025397604985405e−001
w[210] = 9.982957934346254e−002
w[211] = 9.705239536075722e−002
w[212] = 9.421624116597689e−002
w[213] = 9.133590931873967e−002
w[214] = 8.841813387276727e−002
w[215] = 8.547715661443602e−002
w[216] = 8.251962055343706e−002
w[217] = 7.955570759229536e−002
w[218] = 7.657649751612349e−002
w[219] = 7.360559211914287e−002
w[220] = 7.064948295960993e−002
w[221] = 6.771675107480543e−002
w[222] = 6.480448458935215e−002
w[223] = 6.192692754258131e−002
w[224] = 5.911363249658311e−002
w[225] = 5.637219228757212e−002
w[226] = 5.368313072045600e−002
w[227] = 5.105620793438655e−002
w[228] = 4.849284995895640e−002
w[229] = 4.599068181839981e−002
w[230] = 4.355568588898841e−002
w[231] = 4.125570251909672e−002
w[232] = 3.907137550527191e−002
w[233] = 3.696342556744636e−002
w[234] = 3.493300140502248e−002
w[235] = 3.298151059524886e−002
w[236] = 3.110861245410919e−002
w[237] = 2.931525594774175e−002
w[238] = 2.760090729801069e−002
w[239] = 2.597956638848436e−002
w[240] = 2.443433592149451e−002
w[241] = 2.296470793543091e−002
w[242] = 2.156304510969632e−002
w[243] = 2.023524610221679e−002
w[244] = 1.897505817503749e−002
w[245] = 1.778248750467421e−002
w[246] = 1.665187994388476e−002
w[247] = 1.557759513377242e−002
w[248] = 1.456208586604537e−002
w[249] = 1.361072086117313e−002
w[250] = 1.270747042064656e−002
w[251] = 1.186210743261470e−002

-continued

Annex 1 w[252] = 1.106958962776399e−002
w[253] = 1.033126278863177e−002
w[254] = 9.640298325700842e−003
w[255] = 8.996371481700806e−003
w[256] = −8.407748878436545e−003
w[257] = −7.876393114319395e−003
w[258] = −7.380543918629573e−003
w[259] = −6.925141135202262e−003
w[260] = −6.500502521462604e−003
w[261] = −6.109178606718115e−003
w[262] = −5.741103163221257e−003
w[263] = −5.394569608919965e−003
w[264] = −5.063851046064050e−003
w[265] = −4.754191853611012e−003
w[266] = −4.448993249380505e−003
w[267] = −4.133639756278191e−003
w[268] = −3.811612348723333e−003
w[269] = −3.505531318950422e−003
w[270] = −3.209092846617964e−003
w[271] = −2.927159436740159e−003
w[272] = −2.653818578698405e−003
w[273] = −2.396404013961463e−003
w[274] = −2.152379960589273e−003
w[275] = −1.924844672908215e−003
w[276] = −1.699160580023900e−003
w[277] = −1.480542563288228e−003
w[278] = −1.283280633901446e−003
w[279] = −1.131859661378862e−003
w[280] = −9.730460256556873e−004
w[281] = −7.677634115875747e−004
w[282] = −5.599347984905645e−004
w[283] = −3.337966579125254e−004
w[284] = −9.099722643476421e−005
w[285] = 1.498231621816041e−004
w[286] = 4.366447012116811e−004
w[287] = 6.307841647560053e−004
w[288] = 6.150316826138937e−004
w[289] = 8.990255827053560e−004
w[290] = 1.232134364570107e−003
w[291] = 1.471167206249042e−003
w[292] = 1.697652664777771e−003
w[293] = 1.985825255428654e−003
w[294] = 2.172866052963961e−003
w[295] = 1.812176023993582e−003
w[296] = 1.344657262814793e−003
w[297] = 9.373975348172919e−004
w[298] = 5.621720998949145e−004
w[299] = 2,048498552413189e−004
w[300] = −2.004822830002534e−004
w[301] = −6.169854804735951e−004
w[302] = −1.061498982103114e−003
w[303] = −1.594860949611097e−003
w[304] = −2.124647831574725e−003
w[305] = −2.621537051750861e−003
w[306] = −3.064311083207632e−003
w[307] = −3.460362845825662e−003
w[308] = −3.794425324215804e−003
w[309] = −4.091032597247918e−003
w[310] = −4.369553676668050e−003
w[311] = −4.554811297024067e−003
w[312] = −4.663276675479689e−003
w[313] = −4.722567636185647e−003
w[314] = −4.704321497976561e−003
w[315] = −4.636227793039124e−003
w[316] = −4.517190210387324e−003
w[317] = −4.351667566540186e−003
w[318] = −4.135130493071822e−003
w[319] = −3.870851645947402e−003
w[320] = −3.597475533950260e−003
w[321] = −3.318857985461042e−003
w[322] = −3.000422543655664e−003
w[323] = −2.658042081080524e−003
w[324] = −2.292813563887493e−003
w[325] = −1.914114740669928e−003
w[326] = −1.525818616748839e−003
w[327] = −1.156680209049319e−003
w[328] = −7.804546272743493e−004

-continued

Annex 1 w[329] = −4.268574601396473e−004
w[330] = −1.324291707264515e−004
w[331] = 1.218226450050751e−004
w[332] = 3.189336138130849e−004
w[333] = 4.749931197951235e−004
w[334] = 5.970696819774243e−004
w[335] = 6.673250213055329e−004
w[336] = 6.887783835812338e−004
w[337] = 6.766320515830324e−004
w[338] = 6.944123176012471e−004
w[339] = 7.139919634325070e−004
w[340] = 7.154123487609100e−004
w[341] = 7.376101027486600e−004
w[342] = 6.976561203768226e−004
w[343] = 5.721223454434728e−004
w[344] = 2.934875643581191e−004
w[345] = 1.092526149391273e−004
w[346] = 6.415402443848103e−004
w[347] = 1.194730618383423e−003
w[348] = 1.557112059887280e−003
w[349] = 1.891971801393744e−003
w[350] = 2.225524159129023e−003
w[351] = 2.530906981099261e−003
w[352] = 2.719749515067397e−003
w[353] = 2.729136737522100e−003
w[354] = 2.703019498899013e−003
w[355] = 2.630471852319136e−003
w[356] = 2.470456304276468e−003
w[357] = 2.239142906871446e−003
w[358] = 2.033465291493264e−003
w[359] = 1.948069005335563e−003
w[360] = 1.725029670030533e−003
w[361] = 1.417366709895927e−003
w[362] = 1.127141815310061e−003
w[363] = 8.089811988213151e−004
w[364] = 4.708009521678285e−004
w[365] = 7.882620739833088e−005
w[366] = −2.998739993995956e−004
w[367] = −4.733148292475610e−004
w[368] = −5.791145447913150e−004
w[369] = −6.754935404082003e−004
w[370] = −8.029620210721900e−004
w[371] = −9.726698841994444e−004
w[372] = −1.196637962311630e−003
w[373] = −1.292865844760059e−003
w[374] = −1.146268465739874e−003
w[375] = −1.040598055074471e−003
w[376] = −9.767709065548874e−004
w[377] = −9.294665200453614e−004
w[378] = −9.862027119530482e−004
w[379] = −1.047654674829846e−003
w[380] = −1.099000599887377e−003
w[381] = −1.151795860160292e−003
w[382] = −1.194743370333155e−003
w[383] = −1.250742797799558e−003
w[384] = 1.287819050086379e−003
w[385] = 1.263569296641556e−003
w[386] = 1.226113111394085e−003
w[387] = 1.177515087338257e−003
w[388] = 1.122503050159859e−003
w[389] = 1.089428846944533e−003
w[390] = 1.054963366189962e−003
w[391] = 9.019128558297515e−004
w[392] = 7.847839620863715e−004
w[393] = 6.205675927856794e−004
w[394] = 3.157663628445906e−004
w[395] = 2.556449844935384e−004
w[396] = 2.520606580606257e−004
w[397] = 2.346980949474655e−004
w[398] = 2.060394037017961e−004
w[399] = 1.635905995590986e−004
w[400] = 1.176237128375623e−004
w[401] = 6.193369904730005e−005
w[402] = 3.568554800150508e−005
w[403] = 2.443161189273522e−005
w[404] = 1.334090914042349e−005
w[405] = 2.853437194757816e−006

-continued

Annex 1 w[406] = −1.039263591111469e−004
w[407] = 5.144969377044875e−005
w[408] = 9.711681816385056e−005
w[409] = 2.472023910553232e−005
w[410] = 5.397064424090302e−005
w[411] = 6.487880719449901e−005
w[412] = −5.192444140699947e−005
w[413] = −9.204876089551197e−005
w[414] = −1.815837353167847e−004
w[415] = −3.595054179561440e−004
w[416] = −5.901617707607606e−007
w[417] = 1.831121301698088e−004
w[418] = 9.755685190624611e−005
w[419] = 6.606461762989423e−005
w[420] = 3.799971890923797e−005
w[421] = 4.150075391929448e−005
w[422] = 5.021905476506264e−005
w[423] = 5.861800137434713e−005
w[424] = 2.126364641291926e−005
w[425] = 1.181077582797280e−004
w[426] = 9.990757789944374e−005
w[427] = 1.035782617124906e−004
w[428] = 8.870181845310037e−005
w[429] = 5.533953373249822e−005
w[430] = 1.580188994455254e−005
w[431] = 1.277184430250593e−006
w[432] = 5.009913312943629e−006
w[433] = 1.499170392246774e−005
w[434] = 2:241545750231630e−005
w[435] = 3.628511258723260e−005
w[436] = 2.406516798531014e−005
w[437] = 2.515118233957011e−005
w[438] = 3.759629789955498e−005
w[439] = 5.408154543124121e−005
w[440] = 4.493916063285122e−005
w[441] = 2.806963579578946e−005
w[442] = 2.364518513682831e−005
w[443] = 1.260639764582286e−005
w[444] = −2.599467772603631e−008
w[445] = −1.774108392496017e−005
w[446] = −5.889276659458115e−006
w[447] = −4.663777919108619e−005
w[448] = −2.078886359425321e−004
w[449] = −2.131405580107761e−004
w[450] = −1.784192600231068e−004
w[451] = −1.744841754193053e−004
w[452] = −1.728672507238372e−004
w[453] = −1.885286127508226e−004
w[454] = −2.078299015661617e−004
w[455] = −2.123671573189573e−004
w[456] = −2.415166002501312e−004
w[457] = −2.217025456251449e−004
w[458] = −9.907630821710970e−005
w[459] = −8.039231481768845e−005
w[460] = −7.934509417722400e−005
w[461] = −5.874199358780108e−005
w[462] = −5.449816072329412e−005
w[463] = −4.489491034408147e−005
w[464] = −3.498285982359981e−005
w[465] = −1.748284921486958e−005
w[466] = −9.075430772832575e−006
w[467] = −1.052707430241351e−005
w[468] = −6.538878366985722e−006
w[469] = 2.206341308073472e−005
w[470] = 1.769261935287328e−004
w[471] = 6.418658561385058e−005
w[472] = −−8.882305312548962e−005
w[473] = −1.721347222211949e−005
w[474] = −6.093372716385583e−005
w[475] = −7.679955330373515e−005
w[476] = 7.194151087015007e−005
w[477] = 7.245095937243279e−005
w[478] = 7.870354371072524e−005
w[479] = 5.822201682995846e−004
w[480] = 2.666444630171025e−004
w[481] = 7.872592352725688e−005
w[482] = 7.095886893185526e−005

-continued

Annex 1 w[483] = 5.643103068471008e−005
w[484] = 6.904415362098980e−005
w[485] = 4.694251739991356e−005
w[486] = 3.367998338617662e−005
w[487] = 6.481921021601837e−005
w[488] = 6.582328030188790e−005
w[489] = −4.256442530773449e−005
w[490] = 4.939392400898679e−005
w[491] = 5.272982009116034e−005
w[492] = 4.005269212731273e−005
w[493] = 2.461876679726978e−005
w[494] = 4.469729032194765e−006
w[495] = 3.798519731621893e−007
w[496] = 1.374896222030490e−006
w[497] = 3.965363805500215e−006
w[498] = 7.300588863934780e−006
w[499] = 1.168894474770061e−005
w[500] = 8.563819899447630e−006
w[501] = 8.975977837330335e−006
w[502] = 2.800455533708622e−005
w[503] = 2.015445311139832e−005
w[504] = 1.125134651175812e−005
w[505] = 5.869707265615299e−006
w[506] = 1.013259758329981e−005
w[507] = 1.088325131492173e−005
w[508] = 7.167101260771279e−006
w[509] = 4.840577540089826e−006
w[510] = −1.469933448634890e−005
w[511] = −8.010079089953001e−006
w[512] = −3.299004046633323e−005
w[513] = −4.373302115187172e−005
w[514] = −3.177468256997963e−005
w[515] = −2.976824036182567e−005
w[516] = −2.464228015326852e−005
w[517] = −1.606050838620834e−005
w[518] = −6.261944255489322e−006
w[519] = 4.591009581217994e−007
w[520] = 1.395220723090848e−005
w[521] = 1.622786214398703e−005
w[522] = −2.043464113212971e−006
w[523] = −1.653463907257247e−006
w[524] = −1.551250801467300e−008
w[525] = −1.907927361317977e−006
w[526] = −9.607068622268791e−007
w[527] = −4.636105364510011e−007
w[528] = −2.765649762593200e−007
w[529] = −1.922074581855119e−006
w[530] = −9.897194091136331e−007
w[531] = −7.873304717454037e−008
w[532] = 2.945239208477290e−008
w[533] = −2.757610624807679e−006
w[534] = −1.402925247695813e−005
w[535] = −9.388962780643742e−006
w[536] = 2.068297421740023e−005
w[537] = 1.496435902895210e−007
w[538] = 6.757014945674924e−009
w[539] = −2.778618354859861e−007
w[540] = −1.569003268449803e−006
w[541] = −1.089500601234349e−006
w[542] = −9.870547653835426e−007
w[543] = 3.867483283567218e−005
w[544] = −1.232693496472088e−005
w[545] = 9.464782951082177e−007
w[546] = 8.254429452094225e−007
w[547] = 4.883304950437536e−007
w[548] = −2.066961713890010e−007
w[549] = 5.158212471036245e−009
w[550] = 2.267731106642486e−007
w[551] = −4.880844550713951e−008
w[552] = 3.361682183852576e−006
w[553] = 4.677015459111491e−006
w[554] = 2.820292122791583e−008
w[555] = 5.143614846654519e−007
w[556] = 3.818588614859347e−009
w[557] = 1.737276553950212e−007
w[558] = 1.876022048145804e−007
w[559] = −2.986488593070417e−009

-continued

Annex 1 w[560] = −1.409927495646886e−008
w[561] = −6.977078748707401e−008
w[562] = −1.280675520205100e−008
w[563] = −2.222072007942510e−009
w[564] = −1.775191290895584e−009
w[565] = −1.686136654621906e−009
w[566] = 5.818594642226675e−006
w[567] = 2.150883991167946e−006
w[568] = 2.714879009950152e−007
w[569] = −2.567964804401197e−008
w[570] = 2.041128570435378e−006
w[571] = 3.262753594084781e−006
w[572] = 3.567581483749161e−006
w[573] = 4.083718802566134e−006
w[574] = 5.364807253588177e−006
w[575] = 4.178050149840223e−006
w[576] = 5.189086332701670e−006
w[577] = 3.357218747491756e−006
w[578] = 6.310207878018869e−006
w[579] = 5.924001540927652e−006
w[580] = 5.161606640348293e−006
w[581] = 3.377814811745950e−006
w[582] = 1.323267689777069e−006
w[583] = −1.074716688428712e−007
w[584] = −3.561585382456484e−006
w[585] = −4.518603099564185e−006
w[586] = 7.301956971603966e−007
w[587] = 5.891904775161025e−007
w[588] = 2.801882088134371e−008
w[589] = 6.322770332405526e−007
w[590] = 2.542598385847351e−007
w[591] = 1.272704908592385e−007
w[592] = 8.226599990523664e−008
w[593] = 5.433718768789140e−007
w[594] = 4.211177232106135e−007
w[595] = 3.552991527555180e−008
w[596] = −1.398913109540774e−008
w[597] = 1.356727552196146e−006
w[598] = −1.706941020342299e−005
w[599] = 1.013575160981381e−005
w[600] = −2.285562946018590e−005
w[601] = −8.908041185396514e−008
w[602] = −9.597515277415496e−009
w[603] = −3.225913527455964e−007
w[604] = 1.070242712585309e−006
w[605] = 6.293002327021578e−007
w[606] = 3.575650976036433e−007
w[607] = 2.722295965060517e−005
w[608] = 8.676848186676888e−006
w[609] = 3.428660858940255e−007
w[610] = 4.767793949944890e−007
w[611] = 3.330981930777764e−007
w[612] = 2.399696144635756e−007
w[613] = 7.326611439066549e−009
w[614] = 1.349943693297681e−007
w[615] = −5.393555749348494e−008
w[616] = 3.629067065524143e−006
w[617] = −5.690530948134642e−006
w[618] = 1.387566465624550e−008
w[619] = 2.40085172403935e−007
w[620] = 1.723217058490933e−009
w[621] = 7.391973323448250e−008
w[622] = 5.303527922331415e−008
w[623] = −8.883499047404846e−010
w[624] = −3.870536804891648e−009
w[625] = −1.846547564287500e−008
w[626] = −4.244090917065736e−009
w[627] = −4.013524925634108e−009
w[628] = −6.325664562585882e−010
w[629] = −6.025110605409611e−010
w[630] = 1.620171502086309e−006
w[631] = 5.490569954646963e−007
w[632] = 6.355303179925355e−008
w[633] = −5.426597100684762e−009
w[634] = 4.292861814894369e−007
w[635] = 6.834209542421138e−007
w[636] = 7.099633014995863e−007

-continued

Annex 1 w[637] = 8.109951846981774e−007
w[638] = 4.118359768898598e−007
w[639] = 6.571760029213382e−007

Annex 2

|w[0]| = 1.129580193872797e−002
|w[1]| = 2.353059744904218e−002
|w[2]| = 3.450718748721251e−002
|w[3]| = 4.634695977000525e−002
|w[4]| = 5.918677345174197e−002
|w[5]| = 7.325978412117062e−002
|w[6]| = 8.829745229234007e−002
|w[7]| = 1.042033024802571e−001
|w[8]| = 1.206924277410051e−001
|w[9]| = 1.376149808913910e−001
|w[10]| = 1.547461142258783e−001
|w[11]| = 1.719726384566089e−001
|w[12]| = 1.891590407342011e−001
|w[13]| = 2.062605107774960e−001
|w[14]| = 2.232276864673650e−001
|w[15]| = 2.400768261284114e−001
|w[16]| = 2.568176309566753e−001
|w[17]| = 2.734977190313227e−001
|w[18]| = 2.901491317310591e−001
|w[19]| = 3.068186515423912e−001
|w[20]| = 3.235298682841570e−001
|w[21]| = 3.403074146062977e−001
|w[22]| = 3.571527896130669e−001
|w[23]| = 3.740643974275026e−001
|w[24]| = 3.910243970160607e−001
|w[25]| = 4.080154903861317e−001
|w[26]| = 4.250144186334534e−001
|w[27]| = 4.420013942269341e−001
|w[28]| = 4.589582896478246e−001
|w[29]| = 4.758753745532750e−001
|w[30]| = 4.927463828072591e−001
|w[31]| = 5.095720854151864e−001
|w[32]| = 5.263554446856779e−001
|w[33]| = 5.430990601899994e−001
|w[34]| = 5.598052330684253e−001
|w[35]| = 5.764734796907189e−001
|w[36]| = 5.930981800982896e−001
|w[37]| = 6.096690552916387e−001
|w[38]| = 6.261725236758639e−001
|w[39]| = 6.425939632009995e−001
|w[40]| = 6.589148753746076e−001
|w[41]| = 6.751199626157149e−001
|w[42]| = 6.911981575264606e−001
|w[43]| = 7.071447728928043e−001
|w[44]| = 7.229599104052475e−001
|w[45]| = 7.386515025302785e−001
|w[46]| = 7.542294504292890e−001
|w[47]| = 7.697093346240386e−001
|w[48]| = 7.851012620144958e−001
|w[49]| = 8.004165237845137e−001
|w[50]| = 8.156523162880560e−001
|w[51]| = 8.308039608112368e−001
|w[52]| = 8.458450064727010e−001
|w[53]| = 8.607492455327098e−001
|w[54]| = 8.754640719350776e−001
|w[55]| = 8.899474405744183e−001
|w[56]| = 9.041286138017367e−001
|w[57]| = 9.179666107725365e−001
|w[58]| = 9.313874086278087e−001
|w[59]| = 9.443802853939540e−001
|w[60]| = 9.568885413848645e−001
|w[61]| = 9.690016637782843e−001
|w[62]| = 9.807691702375303e−001
|w[63]| = 9.927543720639498e−001
|w[64]| = 1.001463112557766e+000
|w[65]| = 1.006893331637123e+000
|w[66]| = 1.012508393574432e+000
|w[67]| = 1.017729040219375e+000

-continued

Annex 2

|w[68]| = 1.022470190536100e+000
|w[69]| = 1.026615653698808e+000
|w[70]| = 1.030198648769593e+000
|w[71]| = 1.033205850580933e+000
|w[72]| = 1.035694432087486e+000
|w[73]| = 1.037683165297586e+000
|w[74]| = 1.039227995800217e+000
|w[75]| = 1.040349586463588e+000
|w[76]| = 1.041086497214721e+000
|w[77]| = 1.041443375950143e+000
|w[78]| = 1.041434355650865e+000
|w[79]| = 1.041043184216171e+000
|w[80]| = 1.040262316588456e+000
|w[81]| = 1.039061496136853e+000
|w[82]| = 1.037422300157921e+000
|w[83]| = 1.035311720204252e+000
|w[84]| = 1.032712952177121e+000
|w[85]| = 1.029600494883906e+000
|w[86]| = 1.025966756910904e+000
|w[87]| = 1.021798805583990e+000
|w[88]| = 1.017100128250049e+000
|w[89]| = 1.011867706519706e+000
|w[90]| = 1.006109248754940e+000
|w[91]| = 9.998285752401580e−001
|w[92]| = 9.930379854679836e−001
|w[93]| = 9.857387823493258e−001
|w[94]| = 9.779405164766706e−001
|w[95]| = 9.696426101291272e−001
|w[96]| = 9.608519516143015e−001
|w[97]| = 9.515674613550604e−001
|w[98]| = 9.417975696327747e−001
|w[99]| = 9.315442093447622e−001
|w[100]| = 9.208194746232827e−001
|w[101]| = 9.096310803629866e−001
|w[102]| = 8.979959173503500e−001
|w[103]| = 8.859232320517536e−001
|w[104]| = 8.734366852542127e−001
|w[105]| = 8.605542791988831e−001
|w[106]| = 8.472987145504696e−001
|w[107]| = 8.336863467961255e−001
|w[108]| = 8.197387292306723e−001
|w[109]| = 8.054701312929008e−001
|w[110]| = 7.908995350037713e−001
|w[111]| = 7.760385598209244e−001
|w[112]| = 7.609051036128973e−001
|w[113]| = 7.455111681431031e−001
|w[114]| = 7.298745530879272e−001
|w[115]| = 7.140087729493950e−001
|w[116]| = 6.979336851549095e−001
|w[117]| = 6.816667882498023e−001
|w[118]| = 6.652304141388827e−001
|w[119]| = 6.486437667370537e−001
|w[120]| = 6.319284031798550e−001
|w[121]| = 6.151031151692835e−001
|w[122]| = 5.981877665956570e−001
|w[123]| = 5.811992722116214e−001
|w[124]| = 5.641522833259215e−001
|w[125]| = 5.470652177576862e−001
|w[126]| = 5.299509559653194e−001
|w[127]| = 5.128557121424191e−001
|w[128]| = 4.956175421414453e−001
|w[129]| = 4.782650346610896e−001
|w[130]| = 4.609828932783459e−001
|w[131]| = 4.437530233023859e−001
|w[132]| = 4.265950246465440e−001
|w[133]| = 4.095160467543179e−001
|w[134]| = 3.925409172155113e−001
|w[135]| = 3.756821671788237e−001
|w[136]| = 3.589626517817934e−001
|w[137]| = 3.423942311297658e−001
|w[138]| = 3.259993851088293e−001
|w[139]| = 3.097861805973821e−001
|w[140]| = 2.937724988593393e−001
|w[141]| = 2.779637821990255e−001
|w[142]| = 2.623749159488041e−001
|w[143]| = 2.470098299603623e−001
|w[144]| = 2.318815478758375e−001

-continued

Annex 2

|w[145]| = 2.169925682529340e−001
|w[146]| = 2.023548005388463e−001
|w[147]| = 1.879711746686855e−001
|w[148]| = 1.738542127021508e−001
|w[149]| = 1.600061812296078e−001
|w[150]| = 1.464389150679625e−001
|w[151]| = 1.331544923127771e−001
|w[152]| = 1.201628679722633e−001
|w[153]| = 1.074630704470568e−001
|w[154]| = 9.506966959632511e−002
|w[155]| = 8.298103104739203e−002
|w[156]| = 7.120356992726613e−002
|w[157]| = 5.973741829536090e−002
|w[158]| = 4.859005767016811e−002
|w[159]| = 3.775928110298274e−002
|w[160]| = 2.726484300186575e−002
|w[161]| = 1.711323992709580e−002
|w[162]| = 7.298197371320593e−003
|w[163]| = 2.184256929356781e−003
|w[164]| = 1.132324047372148e−002
|w[165]| = 2.012236990754980e−002
|w[166]| = 2.857528272530154e−002
|w[167]| = 3.666942822678171e−002
|w[168]| = 4.439683978044157e−002
|w[169]| = 5.177964768870787e−002
|w[170]| = 5.881296711410786e−002
|w[171]| = 6.550209046893848e−002
|w[172]| = 7.184073822817207e−002
|w[173]| = 7.783299328224960e−002
|w[174]| = 8.347150698567406e−002
|w[175]| = 8.875756217893037e−002
|w[176]| = 9.368651761350569e−002
|w[177]| = 9.826251129465624e−002
|w[178]| = 1.024804711677230e−001
|w[179]| = 1.063454554357498e−001
|w[180]| = 1.098551252869576e−001
|w[181]| = 1.130180022553412e−001
|w[182]| = 1.158358935177899e−001
|w[183]| = 1.183233335449968e−001
|w[184]| = 1.204854506722672e−001
|w[185]| = 1.223371395264402e−001
|w[186]| = 1.238868653862843e−001
|w[187]| = 1.251477258491527e−001
|w[188]| = 1.261262023246478e−001
|w[189]| = 1.268280540744526e−001
|w[190]| = 1.272498700590511e−001
|w[191]| = 1.273590703506806e−001
|w[192]| = 1.274567595465545e−001
|w[193]| = 1.275561350483646e−001
|w[194]| = 1.273648326872248e−001
|w[195]| = 1.269415772180714e−001
|w[196]| = 1.262995646340671e−001
|w[197]| = 1.254605188749804e−001
|w[198]| = 1.244269583009826e−001
|w[199]| = 1.232131583108813e−001
|w[200]| = 1.218183974842866e−001
|w[201]| = 1.202545652840080e−001
|w[202]| = 1.185243106889108e−001
|w[203]| = 1.166399102636992e−001
|w[204]| = 1.146042249339280e−001
|w[205]| = 1.124296184976912e−001
|w[206]| = 1.101215600923314e−001
|w[207]| = 1.076972053405737e−001
|w[208]| = 1.051641975499523e−001
|w[209]| = 1.025397604985405e−001
|w[210]| = 9.982957934346254e−002
|w[211]| = 9.705239536075722e−002
|w[212]| = 9.421624116597689e−002
|w[213]| = 9.133590931873967e−002
|w[214]| = 8.841813387276727e−002
|w[215]| = 8.547715661443602e−002
|w[216]| = 8.251962055343706e−002
|w[217]| = 7.955570759229536e−002
|w[218]| = 7,657649751612349e−002
|w[219]| = 7.360559211914287e−002
|w[220]| = 7.064948295960993e−002
|w[221]| = 6.771675107480543e−002

-continued

Annex 2

|w[222]| = 6.480448458935215e−002
|w[223]| = 6.192692754258131e−002
|w[224]| = 5.911363249658311e−002
|w[225]| = 5.637219228757212e−002
|w[226]| = 5.368313072045600e−002
|w[227]| = 5.105620793438655e−002
|w[228]| = 4.849284995895640e−002
|w[229]| = 4.599068181839981e−002
|w[230]| = 4.355568588898841e−002
|w[231]| = 4.125570251909672e−002
|w[232]| = 3.907137550527191e−002
|w[233]| = 3.696342556744636e−002
|w[234]| = 3.493300140502248e−002
|w[235]| = 3.298151059524886e−002
|w[236]| = 3.110861245410919e−002
|w[237]| = 2.931525594774175e−002
|w[238]| = 2.760090729801069e−002
|w[239]| = 2.597956638848436e−002
|w[240]| = 2.443433592149451e−002
|w[241]| = 2.296470793543091e−002
|w[242]| = 2.156304510969632e−002
|w[243]| = 2.023524610221679e−002
|w[244]| = 1.897505817503749e−002
|w[245]| = 1.778248750467421e−002
|w[246]| = 1.665187994388476e−002
|w[247]| = 1.557759513377242e−002
|w[248]| = 1.456208586604537e−002
|w[249]| = 1.361072086117313e−002
|w[250]| = 1.270747042064656e−002
|w[251]| = 1.186210743261470e−002
|w[252]| = 1.106958962776399e−002
|w[253]| = 1.033126278863177e−002
|w[254]| = 9.640298325700842e−003
|w[255]| = 8.996371481700806e−003
|w[256]| = 8.407748878436545e−003
|w[257]| = 7.876393114319395e−003
|w[258]| = 7.380543918629573e−003
|w[259]| = 6.925141135202262e−003
|w[260]| = 6.500502521462604e−003
|w[261]| = 6.109178606718115e−003
|w[262]| = 5.741103163221257e−003
|w[263]| = 5.394569608919965e−003
|w[264]| = 5.063851046064050e−003
|w[265]| = 4.754191853611012e−003
|w[266]| = 4.448993249380505e−003
|w[267]| = 4.133639756278191e−003
|w[268]| = 3.811612348723333e−003
|w[269]| = 3.505531318950422e−003
|w[270]| = 3.209092846617964e−003
|w[271]| = 2.927159436740159e−003
|w[272]| = 2.653818578698405e−003
|w[273]| = 2.396404013961463e−003
|w[274]| = 2.152379960589273e−003
|w[275]| = 1.924844672908215e−003
|w[276]| = 1.699160580023900e−003
|w[277]| = 1.480542563288228e−003
|w[278]| = 1.283280633901446e−003
|w[279]| = 1.131859661378862e−003
|w[280]| = 9.730460256556873e−004
|w[281]| = 7.677634115875747e−004
|w[282]| = 5.599347984905645e−004
|w[283]| = 3.337966579125254e−004
|w[284]| = 9.099722643476421e−005
|w[285]| = 1.498231621816041e−004
|w[286]| = 4.366447012116811e−004
|w[287]| = 6.307841647560053e−004
|w[288]| = 6.150316826138937e−004
|w[289]| = 8.990255827053560e−004
|w[290]| = 1.232134364570107e−003
|w[291]| = 1.471167206249042e−003
|w[292]| = 1.697652664777771e−003
|w[293]| = 1.985825255428654e−003
|w[294]| = 2.172866052963961e−003
|w[295]| = 1.812176023993582e−003
|w[296]| = 1.344657262814793e−003
|w[297]| = 9.373975348172919e−004
|w[298]| = 5.621720998949145e−004

-continued

Annex 2

|w[299]| = 2.048498552413189e−004
|w[300]| = 2.004822830002534e−004
|w[301]| = 6.169854804735951e−004
|w[302]| = 1.061498982103114e−003
|w[303]| = 1.594860949611097e−003
|w[304]| = 2.124647831574725e−003
|w[305]| = 2.621537051750861e−003
|w[306]| = 3.064311083207632e−003
|w[307]| = 3.460362845825662e−003
|w[308]| = 3.794425324215804e−003
|w[309]| = 4.091032597247918e−003
|w[310]| = 4.369553676668050e−003
|w[311]| = 4.554811297024067e−003
|w[312]| = 4.663276675479689e−003
|w[313]| = 4.722567636185647e−003
|w[314]| = 4.704321497976561e−003
|w[315]| = 4.636227793039124e−003
|w[316]| = 4.517190210387324e−003
|w[317]| = 4.351667566540186e−003
|w[318]| = 4.135130493071822e−003
|w[319]| = 3.870851645947402e−003
|w[320]| = 3.597475533950260e−003
|w[321]| = 3.318857985461042e−003
|w[322]| = 3.000422543655664e−003
|w[323]| = 2.658042081080524e−003
|w[324]| = 2.292813563887493e−003
|w[325]| = 1.914114740669928e−003
|w[326]| = 1.525818616748839e−003
|w[327]| = 1.1.56680209049319e−003
|w[328]| = 7.804546272743493e−004
|w[329]| = 4.268574601396473e−004
|w[330]| = 1.324291707264515e−004
|w[331]| = 1.218226450050751e−004
|w[332]| = 3.189336138130849e−004
|w[333]| = 4.749931197951235e−004
|w[334]| = 5.970696819774243e−004
|w[335]| = 6.673250213055329e−004
|w[336]| = 6.887783835812338e−004
|w[337]| = 6.766320515830324e−004
|w[338]| = 6.944123176012471e−004
|w[339]| = 7.139919634325070e−004
|w[340]| = 7.154123487609100e−004
|w[341]| = 7.376101027486600e−004
|w[342]| = 6.976561203768226e−004
|w[343]| = 5.721223454434728e−004
|w[344]| = 2.934875643581191e−004
|w[345]| = 1.092526149391273e−004
|w[346]| = 6.415402443848103e−004
|w[347]| = 1.194730618383423e−003
|w[348]| = 1.557112059887280e−003
|w[349]| = 1.891971801393744e−003
|w[350]| = 2.225524159129023e−003
|w[351]| = 2.530906981099261e−003
|w[352]| = 2.719749515067397e−003
|w[353]| = 2.729136737522100e−003
|w[354]| = 2.703019498899013e−003
|w[355]| = 2.630471852319136e−003
|w[356]| = 2.470456304276468e−003
|w[357]| = 2.239142906871446e−003
|w[358]| = 2.033465291493264e−003
|w[359]| = 1.948069005335563e−003
|w[360]| = 1.725029670030533e−003
|w[361]| = 1.417366709895927e−003
|w[362]| = 1.127141815310061e−003
|w[363]| = 8.089811988213151e−004
|w[364]| = 4.708009521678285e−004
|w[365]| = 7.882620739833088e−005
|w[366]| = 2.998739993995956e−004
|w[367]| = 4.733148292475610e−004
|w[368]| = 5.791145447913150e−004
|w[369]| = 6.754935404082003e−004
|w[370]| = 8.029620210721900e−004
|w[371]| = 9.726698841994444e−004
|w[372]| = 1.196637962311630e−003
|w[373]| = 1.292865844760059e−003
|w[374]| = 1.146268465739874e−003
|w[375]| = 1.040598055074471e−003

-continued

Annex 2

|w[376]| = 9.767709065548874e−004
|w[377]| = 9.294665200453614e−004
|w[378]| = 9.862027119530482e−004
|w[379]| = 1.047654674829846e−003
|w[380]| = 1.099000599887377e−003
|w[381]| = 1.151795860160292e−003
|w[382]| = 1.194743370333155e−003
|w[383]| = 1.250742797799558e−003
|w[384]| = 1.287819050086379e−003
|w[385]| = 1.263569296641556e−003
|w[386]| = 1.226113111394085e−003
|w[387]| = 1.177515087338257e−003
|w[388]| = 1.122503050159859e−003
|w[389]| = 1.089428846944533e−003
|w[390]| = 1.054963366189962e−003
|w[391]| = 9.019128558297515e−004
|w[392]| = 7.847839620863715e−004
|w[393]| = 6.205675927856794e−004
|w[394]| = 3.157663628445906e−004
|w[395]| = 2.556449844935384e−004
|w[396]| = 2.520606580606257e−004
|w[397]| = 2.346980949474655e−004
|w[398]| = 2.060394037017961e−004
|w[399]| = 1.635905995590986e−004
|w[400]| = 1.176237128375623e−004
|w[401]| = 6.193369904730005e−005
|w[402]| = 3.568554800150508e−005
|w[403]| = 2.443161189273522e−005
|w[404]| = 1.334090914042349e−005
|w[405]| = 2.853437194757816e−006
|w[406]| = 1.039263591111469e−004
|w[407]| = 5.144969377044875e−005
|w[408]| = 9.711681816385056e−005
|w[409]| = 2.472023910553232e−005
|w[410]| = 5.397064424090302e−005
|w[411]| = 6.487880719449901e−005
|w[412]| = 5.192444140699947e−005
|w[413]| = 9.204876089551197e−005
|w[414]| = 1.815837353167847e−004
|w[415]| = 3.595054179561440e−004
|w[416]| = 5.901617707607606e−007
|w[417]| = 1.831121301698088e−004
|w[418]| = 9.755685190624611e−005
|w[419]| = 6.606461762989423e−005
|w[420]| = 3.799971890923797e−005
|w[421]| = 4.150075391929448e−005
|w[422]| = 5.021905476506264e−005
|w[423]| = 5.861800137434713e−005
|w[424]| = 2.126364641291926e−005
|w[425]| = 1.181077582797280e−004
|w[426]| = 9.990757789944374e−005
|w[427]| = 1.035782617124906e−004
|w[428]| = 8.870181845310037e−005
|w[429]| = 5.533953373249822e−005
|w[430]| = 1.580188994455254e−005
|w[431]| = 1.277184430250593e−006
|w[432]| = 5.009913312943629e−006
|w[433]| = 1.499170392246774e−005
|w[434]| = 2.241545750231630e−005
|w[435]| = 3.628511258723260e−005
|w[436]| = 2.406516798531014e−005
|w[437]| = 2.515118233957011e−005
|w[438]| = 3.759629789955498e−005
|w[439]| = 5.408154543124121e−005
|w[440]| = 4.493916063285122e−005
|w[441]| = 2.806963579578946e−005
|w[442]| = 2.364518513682831e−005
|w[443]| = 1.260639764582286e−005
|w[444]| = 2.599467772603631e−008
|w[445]| = 1.774108392496017e−005
|w[446]| = 5.889276659458115e−006
|w[447]| = 4.663777919108619e−005
|w[448]| = 2.078886359425321e−004
|w[449]| = 2.131405580107761e−004
|w[450]| = 1.784192600231068e−004
|w[451]| = 1.744841754193053e−004
|w[452]| = 1.728672507238372e−004

-continued

Annex 2

|w[453]| = 1.885286127508226e−004
|w[454]| = 2.078299015661617e−004
|w[455]| = 2.123671573189573e−004
|w[456]| = 2.415166002501312e−004
|w[457]| = 2.217025456251449e−004
|w[458]| = 9.907630821710970e−005
|w[459]| = 8.039231481768845e−005
|w[460]| = 7.934509417722400e−005
|w[461]| = 5.874199358780108e−005
|w[462]| = 5.449816072329412e−005
|w[463]| = 4.489491034408147e−005
|w[464]| = 3.498285982359981e−005
|w[465]| = 1.748284921486958e−005
|w[466]| = 9.075430772832575e−006
|w[467]| = 1.052707430241351e−005
|w[468]| = 6.538878366985722e−006
|w[469]| = 2.206341308073472e−005
|w[470]| = 1.769261935287328e−004
|w[471]| = 6.418658561385058e−005
|w[472]| = 8.882305312548962e−005
|w[473]| = 1.721347222211949e−005
|w[474]| = 6.093372716385583e−005
|w[475]| = 7.679955330373515e−005
|w[476]| = 7.194151087015007e−005
|w[477]| = 7.245095937243279e−005
|w[478]| = 7.870354371072524e−005
|w[479]| = 5.822201682995846e−004
|w[480]| = 2.666444630171025e−004
|w[481]| = 7.872592352725688e−005
|w[482]| = 7.095886893185526e−005
|w[483]| = 5.643103068471008e−005
|w[484]| = 6.904415362098980e−005
|w[485]| = 4.694251739991356e−005
|w[486]| = 3.367998338617662e−005
|w[487]| = 6.481921021601837e−005
|w[488]| = 6.582328030188790e−005
|w[489]| = 4.256442530773449e−005
|w[490]| = 4.939392400898679e−005
|w[491]| = 5.272982009116034e−005
|w[492]| = 4.005269212731273e−005
|w[493]| = 2.461876679726978e−005
|w[494]| = 4.469729032194765e−006
|w[495]| = 3.798519731621893e−007
|w[496]| = 1.374896222030490e−006
|w[497]| = 3.965363805500215e−006
|w[498]| = 7.300588863934780e−006
|w[499]| = 1.168894474770061e−005
|w[500]| = 8.563819899447630e−006
|w[501]| = 8.975977837330335e−006
|w[502]| = 2.800455533708622e−005
|w[503]| = 2.015445311139832e−005
|w[504]| = 1.125134651175812e−005
|w[505]| = 5.869707265615299e−006
|w[506]| = 1.013259758329981e−005
|w[507]| = 1.088325131492173e−005
|w[508]| = 7.167101260771279e−006
|w[509]| = 4.840577540089826e−006
|w[510]| = 1.469933448634890e−005
|w[511]| = 8.010079089953001e−006
|w[512]| = 3.299004046633323e−005
|w[513]| = 4.373302115187172e−005
|w[514]| = 3.177468256997963e−005
|w[515]| = 2.976824036182567e−005
|w[516]| = 2.464228015326852e−005
|w[517]| = 1.606050838620834e−005
|w[518]| = 6.261944255489322e−006
|w[519]| = 4.591009581217994e−007
|w[520]| = 1.395220723090848e−005
|w[521]| = 1.622786214398703e−005
|w[522]| = 2.043464113212971e−006
|w[523]| = 1.653463907257247e−006
|w[524]| = 1.551250801467300e−008
|w[525]| = 1.907927361317977e−006
|w[526]| = 9.607068622268791e−007
|w[527]| = 4.636105364510011e−007
|w[528]| = 2.765649762593200e−007
|w[529]| = 1.922074581855119e−006

-continued

Annex 2

|w[530]| = 9.897194091136331e−007
|w[531]| = 7.873304717454037e−008
|w[532]| = 2.945239208477290e−008
|w[533]| = 2.757610624807679e−006
|w[534]| = 1.402925247695813e−005
|w[535]| = 9.388962780643742e−006
|w[536]| = 2.068297421740023e−005
|w[537]| = 1.496435902895210e−007
|w[538]| = 6.757014945674924e−009
|w[539]| = 2.778618354859861e−007
|w[540]| = 1.569003268449803e−006
|w[541]| = 1.089500601234349e−006
|w[542]| = 9.870547653835426e−007
|w[543]| = 3.867483283567218e−005
|w[544]| = 1.232693496472088e−005
|w[545]| = 9.464782951082177e−007
|w[546]| = 8.254429452094225e−007
|w[547]| = 4.883304950437536e−007
|w[548]| = 2.066961713890010e−007
|w[549]| = 5.158212471036245e−009
|w[550]| = 2.267731106642486e−007
|w[551]| = 4.880844550713951e−008
|w[552]| = 3.361682183852576e−006
|w[553]| = 4.677015459111491e−006
|w[554]| = 2.820292122791583e−008
|w[555]| = 5.143614846654519e−007
|w[556]| = 3.818588614859347e−009
|w[557]| = 1.737276553950212e−007
|w[558]| = 1.876022048145804e−007
|w[559]| = 2.986488593070417e−009
|w[560]| = 1.409927495646886e−008
|w[561]| = 6.977087487074 01e−008
|w[562]| = 1.280675520205100e−008
|w[563]| = 2.222072007942510e−009
|w[564]| = 1.775191290895584e−009
|w[565]| = 1.686136654621906e−009
|w[566]| = 5.818594642226675e−006
|w[567]| = 1.150883991167946e−006
|w[568]| = 2.714879009950152e−007
|w[569]| = 2.567964804401197e−008
|w[570]| = 2.041128570435378e−006
|w[571]| = 3.262753594084781e−006
|w[572]| = 3.567581483749161e−006
|w[573]| = 4.083718802566134e−006
|w[574]| = 5.364807253588177e−006
|w[575]| = 4.178050149840223e−006
|w[576]| = 5.189086332701670e−006
|w[577]| = 3.357218747491756e−006
|w[578]| = 6.310207878018869e−006
|w[579]| = 5.924001540927652e−006
|w[580]| = 5.161606640348293e−006
|w[581]| = 3.377814811745950e−006
|w[582]| = 1.323267689777069e−006
|w[583]| = 1.074716688428712e−007
|w[584]| = 3.561585382456484e−006
|w[585]| = 4.518603099564185e−006
|w[586]| = 7.301956971603966e−007
|w[587]| = 5.891904775161025e−007
|w[588]| = 2.801882088134371e−008
|w[589]| = 6.322770332405526e−007
|w[590]| = 2.542598385847351e−007
|w[591]| = 1.272704908592385e−007
|w[592]| = 8.226599990523664e−008
|w[593]| = 5.433718768789140e−007
|w[594]| = 4.211177232106135e−007
|w[595]| = 3.552991527555180e−008
|w[596]| = 1.398913109540774e−008
|w[597]| = 1.356727552196146e−006
|w[598]| = 1.706941020342299e−005
|w[599]| = 1.013575160981381e−005
|w[600]| = 2.285562946018590e−005
|w[601]| = 8.908041185396514e−008
|w[602]| = 9.597515277415496e−009
|w[603]| = 3.225913527455964e−007
|w[604]| = 1.070242712585309e−006
|w[605]| = 6.293002327021578e−007
|w[606]| = 3.575650976036433e−007

-continued

| Annex 2 |
|---|
| \|w[607]\| = 2.722295965060517e−005 |
| \|w[608]\| = 8.676848186676888e−006 |
| \|w[609]\| = 3.428660858940255e−007 |
| \|w[610]\| = 4.767793949944890e−007 |
| \|w[611]\| = 3.330981930777764e−007 |
| \|w[612]\| = 2.399696144635756e−007 |
| \|w[613]\| = 7.326611439066549e−009 |
| \|w[614]\| = 1.349943693297681e−007 |
| \|w[615]\| = 5.393555749348494e−008 |
| \|w[616]\| = 3.629067065524143e−006 |
| \|w[617]\| = 5.690530948134642e−006 |
| \|w[618]\| = 1.387566465624550e−008 |
| \|w[619]\| = 2.443085172403935e−007 |
| \|w[620]\| = 1.723217058490933e−009 |
| \|w[621]\| = 7.391973323448250e−008 |
| \|w[622]\| = 5.303527922331415e−008 |
| \|w[623]\| = 8.883499047404846e−010 |
| \|w[624]\| = 3.870536804891648e−009 |
| \|w[625]\| = 1.846547564287500e−008 |
| \|w[626]\| = 4.244090917065736e−009 |
| \|w[627]\| = 4.013524925634108e−009 |
| \|w[628]\| = 6.325664562585882e−010 |
| \|w[629]\| = 6.025110605409611e−010 |
| \|w[630]\| = 1.620171502086309e−006 |
| \|w[631]\| = 5.490569954646963e−007 |
| \|w[632]\| = 6.355303179925355e−008 |
| \|w[633]\| = 5.426597100684762e−009 |
| \|w[634]\| = 4.292861814894369e−007 |
| \|w[635]\| = 6.834209542421138e−007 |
| \|w[636]\| = 7.099633014995863e−007 |
| \|w[637]\| = 8.109951846981774e−007 |
| \|w[638]\| = 4.118359768898598e−007 |
| \|w[639]\| = 6.571760029213382e−007 |

| Annex 3 |
|---|
| 0.010 < w[0] < 0.012 |
| 0.023 < w[1] < 0.025 |
| 0.034 < w[2] < 0.036 |
| 0.045 < w[3] < 0.047 |
| 0.058 < w[4] < 0.060 |
| 0.072 < w[5] < 0.074 |
| 0.087 < w[6] < 0.089 |
| 0.103 < w[7] < 0.105 |
| 0.120 < w[8] < 0.122 |
| 0.137 < w[9] < 0.139 |
| 0.154 < w[10] < 0.156 |
| 0.171 < w[11] < 0.173 |
| 0.188 < w[12] < 0.190 |
| 0.205 < w[13] < 0.207 |
| 0.222 < w[14] < 0.224 |
| 0.239 < w[15] < 0.241 |
| 0.256 < w[16] < 0.258 |
| 0.272 < w[17] < 0.274 |
| 0.289 < w[18] < 0.291 |
| 0.306 < w[19] < 0.308 |
| 0.323 < w[20] < 0.325 |
| 0.339 < w[21] < 0.341 |
| 0.356 < w[22] < 0.358 |
| 0.373 < w[23] < 0.375 |
| 0.390 < w[24] < 0.392 |
| 0.407 < w[25] < 0.409 |
| 0.424 < w[26] < 0.426 |
| 0.441 < w[27] < 0.443 |
| 0.458 < w[28] < 0.460 |
| 0.475 < w[29] < 0.477 |
| 0.492 < w[30] < 0.494 |
| 0.509 < w[31] < 0.511 |
| 0.525 < w[32] < 0.527 |
| 0.542 < w[33] < 0.544 |
| 0.559 < w[34] < 0.561 |
| 0.575 < w[35] < 0.577 |
| 0.592 < w[36] < 0.594 |
| 0.609 < w[37] < 0.611 |

-continued

| Annex 3 |
|---|
| 0.625 < w[38] < 0.627 |
| 0.642 < w[39] < 0.644 |
| 0.658 < w[40] < 0.660 |
| 0.674 < w[41] < 0.676 |
| 0.690 < w[42] < 0.692 |
| 0.706 < w[43] < 0.708 |
| 0.722 < w[44] < 0.724 |
| 0.738 < w[45] < 0.740 |
| 0.753 < w[46] < 0.755 |
| 0.769 < w[47] < 0.771 |
| 0.784 < w[48] < 0.786 |
| 0.799 < w[49] < 0.801 |
| 0.815 < w[50] < 0.817 |
| 0.830 < w[51] < 0.832 |
| 0.845 < w[52] < 0.847 |
| 0.860 < w[53] < 0.862 |
| 0.874 < w[54] < 0.876 |
| 0.889 < w[55] < 0.891 |
| 0.903 < w[56] < 0.905 |
| 0.917 < w[57] < 0.919 |
| 0.930 < w[58] < 0.932 |
| 0.943 < w[59] < 0.945 |
| 0.956 < w[60] < 0.958 |
| 0.968 < w[61] < 0.970 |
| 0.980 < w[62] < 0.982 |
| 0.992 < w[63] < 0.994 |
| 1.000 < w[64] < 1.002 |
| 1.006 < w[65] < 1.008 |
| 1.012 < w[66] < 1.014 |
| 1.017 < w[67] < 1.019 |
| 1.021 < w[68] < 1.023 |
| 1.026 < w[69] < 1.028 |
| 1.029 < w[70] < 1.031 |
| 1.032 < w[71] < 1.034 |
| 1.035 < w[72] < 1.037 |
| 1.037 < w[73] < 1.039 |
| 1.038 < w[74] < 1.040 |
| 1.039 < w[75] < 1.041 |
| 1.040 < w[76] < 1.042 |
| 1.040 < w[77] < 1.042 |
| 1.040 < w[78] < 1.042 |
| 1.040 < w[79] < 1.042 |
| 1.039 < w[80] < 1.041 |
| 1.038 < w[81] < 1.040 |
| 1.036 < w[82] < 1.038 |
| 1.034 < w[83] < 1.036 |
| 1.032 < w[84] < 1.034 |
| 1.029 < w[85] < 1.031 |
| 1.025 < w[86] < 1.027 |
| 1.021 < w[87] < 1.023 |
| 1.016 < w[88] < 1.018 |
| 1.011 < w[89] < 1.013 |
| 1.005 < w[90] < 1.007 |
| 0.999 < w[91] < 1.001 |
| 0.992 < w[92] < 0.994 |
| 0.985 < w[93] < 0.987 |
| 0.977 < w[94] < 0.979 |
| 0.969 < w[95] < 0.971 |
| 0.960 < w[96] < 0.962 |
| 0.951 < w[97] < 0.953 |
| 0.941 < w[98] < 0.943 |
| 0.931 < w[99] < 0.933 |
| 0.920 < w[100] < 0.922 |
| 0.909 < w[101] < 0.911 |
| 0.897 < w[102] < 0.899 |
| 0.885 < w[103] < 0.887 |
| 0.872 < w[104] < 0.874 |
| 0.860 < w[105] < 0.862 |
| 0.846 < w[106] < 0.848 |
| 0.833 < w[107] < 0.835 |
| 0.819 < w[108] < 0.821 |
| 0.804 < w[109] < 0.806 |
| 0.790 < w[110] < 0.792 |
| 0.775 < w[111] < 0.777 |
| 0.760 < w[112] < 0.762 |
| 0.745 < w[113] < 0.747 |
| 0.729 < w[114] < 0.731 |

-continued

| Annex 3 |
|---|
| 0.713 < w[115] < 0.715 |
| 0.697 < w[116] < 0.699 |
| 0.681 < w[117] < 0.683 |
| 0.664 < w[118] < 0.666 |
| 0.648 < w[119] < 0.650 |
| 0.631 < w[120] < 0.633 |
| 0.614 < w[121] < 0.616 |
| 0.597 < w[122] < 0.599 |
| 0.580 < w[123] < 0.582 |
| 0.563 < w[124] < 0.565 |
| 0.546 < w[125] < 0.548 |
| 0.529 < w[126] < 0.531 |
| 0.512 < w[127] < 0.514 |
| −0.497 < w[128] < −0.495 |
| −0.479 < w[129] < −0.477 |
| −0.462 < w[130] < −0.460 |
| −0.445 < w[131] < −0.443 |
| −0.428 < w[132] < −0.426 |
| −0.411 < w[133] < −0.409 |
| −0.394 < w[134] < −0.392 |
| −0.377 < w[135] < −0.375 |
| −0.360 < w[136] < −0.358 |
| −0.343 < w[137] < −0.341 |
| −0.327 < w[138] < −0.325 |
| −0.311 < w[139] < −0.309 |
| −0.295 < w[140] < −0.293 |
| −0.279 < w[141] < −0.277 |
| −0.263 < w[142] < −0.261 |
| −0.248 < w[143] < −0.246 |
| −0.233 < w[144] < −0.231 |
| −0.218 < w[145] < −0.216 |
| −0.203 < w[146] < −0.201 |
| −0.189 < w[147] < −0.187 |
| −0.175 < w[148] < −0.173 |
| −0.161 < w[149] < −0.159 |
| −0.147 < w[150] < −0.145 |
| −0.134 < w[151] < −0.132 |
| −0.121 < w[152] < −0.119 |
| −0.108 < w[153] < −0.106 |
| −0.096 < w[154] < −0.094 |
| −0.084 < w[155] < −0.082 |
| −0.072 < w[156] < −0.070 |
| −0.061 < w[157] < −0.059 |
| −0.050 < w[158] < −0.048 |
| −0.039 < w[159] < −0.037 |
| −0.028 < w[160] < −0.026 |
| −0.018 < w[161] < −0.016 |
| −0.008 < w[162] < −0.006 |
| 0.001 < w[163] < 0.003 |
| 0.010 < w[164] < 0.012 |
| 0.019 < w[165] < 0.021 |
| 0.028 < w[166] < 0.030 |
| 0.036 < w[167] < 0.038 |
| 0.043 < w[168] < 0.045 |
| 0.051 < w[169] < 0.053 |
| 0.058 < w[170] < 0.060 |
| 0.065 < w[171] < 0.067 |
| 0.071 < w[172] < 0.073 |
| 0.077 < w[173] < 0.079 |
| 0.082 < w[174] < 0.084 |
| 0.088 < w[175] < 0.090 |
| 0.093 < w[176] < 0.095 |
| 0.097 < w[177] < 0.099 |
| 0.101 < w[178] < 0.103 |
| 0.105 < w[179] < 0.107 |
| 0.109 < w[180] < 0.111 |
| 0.112 < w[181] < 0.114 |
| 0.115 < w[182] < 0.117 |
| 0.117 < w[183] < 0.119 |
| 0.119 < w[184] < 0.121 |
| 0.121 < w[185] < 0.123 |
| 0.123 < w[186] < 0.125 |
| 0.124 < w[187] < 0.126 |
| 0.125 < w[188] < 0.127 |
| 0.126 < w[189] < 0.128 |
| 0.126 < w[190] < 0.128 |
| 0.126 < w[191] < 0.128 |

-continued

| Annex 3 |
|---|
| 0.126 < w[192] < 0.128 |
| 0.127 < w[193] < 0.129 |
| 0.126 < w[194] < 0.128 |
| 0.126 < w[195] < 0.128 |
| 0.125 < w[196] < 0.127 |
| 0.124 < w[197] < 0.126 |
| 0.123 < w[198] < 0.125 |
| 0.122 < w[199] < 0.124 |
| 0.121 < w[200] < 0.123 |
| 0.119 < w[201] < 0.121 |
| 0.118 < w[202] < 0.120 |
| 0.116 < w[203] < 0.118 |
| 0.114 < w[204] < 0.116 |
| 0.111 < w[205] < 0.113 |
| 0.109 < w[206] < 0.111 |
| 0.107 < w[207] < 0.109 |
| 0.104 < w[208] < 0.106 |
| 0.102 < w[209] < 0.104 |
| 0.099 < w[210] < 0.101 |
| 0.096 < w[211] < 0.098 |
| 0.093 < w[212] < 0.095 |
| 0.090 < w[213] < 0.092 |
| 0.087 < w[214] < 0.089 |
| 0.084 < w[215] < 0.086 |
| 0.082 < w[216] < 0.084 |
| 0.079 < w[217] < 0.081 |
| 0.076 < w[218] < 0.078 |
| 0.073 < w[219] < 0.075 |
| 0.070 < w[220] < 0.072 |
| 0.067 < w[221] < 0.069 |
| 0.064 < w[222] < 0.066 |
| 0.061 < w[223] < 0.063 |
| 0.058 < w[224] < 0.060 |
| 0.055 < w[225] < 0.057 |
| 0.053 < w[226] < 0.055 |
| 0.050 < w[227] < 0.052 |
| 0.047 < w[228] < 0.049 |
| 0.045 < w[229] < 0.047 |
| 0.043 < w[230] < 0.045 |
| 0.040 < w[231] < 0.042 |
| 0.038 < w[232] < 0.040 |
| 0.036 < w[233] < 0.038 |
| 0.034 < w[234] < 0.036 |
| 0.032 < w[235] < 0.034 |
| 0.030 < w[236] < 0.032 |
| 0.028 < w[237] < 0.030 |
| 0.027 < w[238] < 0.029 |
| 0.025 < w[239] < 0.027 |
| 0.023 < w[240] < 0.025 |
| 0.022 < w[241] < 0.024 |
| 0.021 < w[242] < 0.023 |
| 0.019 < w[243] < 0.021 |
| 0.018 < w[244] < 0.020 |
| 0.017 < w[245] < 0.019 |
| 0.016 < w[246] < 0.018 |
| 0.015 < w[247] < 0.017 |
| 0.014 < w[248] < 0.016 |
| 0.013 < w[249] < 0.015 |
| 0.012 < w[250] < 0.014 |
| 0.011 < w[251] < 0.013 |
| 0.010 < w[252] < 0.012 |
| 0.009 < w[253] < 0.011 |
| 0.009 < w[254] < 0.011 |
| 0.008 < w[255] < 0.010 |
| −0.009 < w[256] < −0.007 |
| −0.009 < w[257] < −0.007 |
| −0.008 < w[258] < −0.006 |
| −0.008 < w[259] < −0.006 |
| −0.008 < w[260] < −0.006 |
| −0.007 < w[261] < −0.005 |
| −0.007 < w[262] < −0.005 |
| −0.006 < w[263] < −0.004 |
| −0.006 < w[264] < −0.004 |
| −0.006 < w[265] < −0.004 |
| −0.005 < w[266] < −0.003 |
| −0.005 < w[267] < −0.003 |
| −0.005 < w[268] < −0.003 |

-continued

| Annex 3 |
|---|
| −0.005 < w[269] < −0.003 |
| −0.004 < w[270] < −0.002 |
| −0.004 < w[271] < −0.002 |
| −0.004 < w[272] < −0.002 |
| −0.003 < w[273] < −0.001 |
| −0.003 < w[274] < −0.001 |
| −0.003 < w[275] < −0.001 |
| −0.003 < w[276] < −0.001 |
| −0.002 < w[277] < 0.000 |
| −0.002 < w[278] < 0.000 |
| −0.002 < w[279] < 0.000 |
| −0.002 < w[280] < 0.000 |
| −0.002 < w[281] < 0.000 |
| −0.002 < w[282] < 0.000 |
| −0.001 < w[283] < 0.001 |
| −0.001 < w[284] < 0.001 |
| −0.001 < w[285] < 0.001 |
| −0.001 < w[286] < 0.001 |
| 0.000 < w[287] < 0.002 |
| 0.000 < w[288] < 0.002 |
| 0.000 < w[289] < 0.002 |
| 0.000 < w[290] < 0.002 |
| 0.000 < w[291] < 0.002 |
| 0.001 < w[292] < 0.003 |
| 0.001 < w[293] < 0.003 |
| 0.001 < w[294] < 0.003 |
| 0.001 < w[295] < 0.003 |
| 0.000 < w[296] < 0.002 |
| 0.000 < w[297] < 0.002 |
| 0.000 < w[298] < 0.002 |
| −0.001 < w[299] < 0.001 |
| −0.001 < w[300] < 0.001 |
| −0.002 < w[301] < 0.000 |
| −0.002 < w[302] < 0.000 |
| −0.003 < w[303] < −0.001 |
| −0.003 < w[304] < −0.001 |
| −0.004 < w[305] < −0.002 |
| −0.004 < w[306] < −0.002 |
| −0.004 < w[307] < −0.002 |
| −0.005 < w[308] < −0.003 |
| −0.005 < w[309] < −0.003 |
| −0.005 < w[310] < −0.003 |
| −0.006 < w[311] < −0.004 |
| −0.006 < w[312] < −0.004 |
| −0.006 < w[313] < −0.004 |
| −0.006 < w[314] < −0.004 |
| −0.006 < w[315] < −0.004 |
| −0.006 < w[316] < −0.004 |
| −0.005 < w[317] < −0.003 |
| −0.005 < w[318] < −0.003 |
| −0.005 < w[319] < −0.003 |
| −0.005 < w[320] < −0.003 |
| −0.004 < w[321] < −0.002 |
| −0.004 < w[322] < −0.002 |
| −0.004 < w[323] < −0.002 |
| −0.003 < w[324] < −0.001 |
| −0.003 < w[325] < −0.001 |
| −0.003 < w[326] < −0.001 |
| −0.002 < w[327] < 0.000 |
| −0.002 < w[328] < 0.000 |
| −0.001 < w[329] < 0.001 |
| −0.001 < w[330] < 0.001 |
| −0.001 < w[331] < 0.001 |
| −0.001 < w[332] < 0.001 |
| −0.001 < w[333] < 0.001 |
| 0.000 < w[334] < 0.002 |
| 0.000 < w[335] < 0.002 |
| 0.000 < w[336] < 0.002 |
| 0.000 < w[337] < 0.002 |
| 0.000 < w[338] < 0.002 |
| 0.000 < w[339] < 0.002 |
| 0.000 < w[340] < 0.002 |
| 0.000 < w[341] < 0.002 |
| 0.000 < w[342] < 0.002 |
| 0.000 < w[343] < 0.002 |
| −0.001 < w[344] < 0.001 |
| −0.001 < w[345] < 0.001 |

-continued

| Annex 3 |
|---|
| 0.000 < w[346] < 0.002 |
| 0.000 < w[347] < 0.002 |
| 0.001 < w[348] < 0.003 |
| 0.001 < w[349] < 0.003 |
| 0.001 < w[350] < 0.003 |
| 0.002 < w[351] < 0.004 |
| 0.002 < w[352] < 0.004 |
| 0.002 < w[353] < 0.004 |
| 0.002 < w[354] < 0.004 |
| 0.002 < w[355] < 0.004 |
| 0.001 < w[356] < 0.003 |
| 0.001 < w[357] < 0.003 |
| 0.001 < w[358] < 0.003 |
| 0.001 < w[359] < 0.003 |
| 0.001 < w[360] < 0.003 |
| 0.000 < w[361] < 0.002 |
| 0.000 < w[362] < 0.002 |
| 0.000 < w[363] < 0.002 |
| −0.001 < w[364] < 0.001 |
| −0.001 < w[365] < 0.001 |
| −0.001 < w[366] < 0.001 |
| −0.001 < w[367] < 0.001 |
| −0.002 < w[368] < 0.000 |
| −0.002 < w[369] < 0.000 |
| −0.002 < w[370] < 0.000 |
| −0.002 < w[371] < 0.000 |
| −0.002 < w[372] < 0.000 |
| −0.002 < w[373] < 0.000 |
| −0.002 < w[374] < 0.000 |
| −0.002 < w[375] < 0.000 |
| −0.002 < w[376] < 0.000 |
| −0.002 < w[377] < 0.000 |
| −0.002 < w[378] < 0.000 |
| −0.002 < w[379] < 0.000 |
| −0.002 < w[380] < 0.000 |
| −0.002 < w[381] < 0.000 |
| −0.002 < w[382] < 0.000 |
| −0.002 < w[383] < 0.000 |
| 0.000 < w[384] < 0.002 |
| 0.000 < w[385] < 0.002 |
| 0.000 < w[386] < 0.002 |
| 0.000 < w[387] < 0.002 |
| 0.000 < w[388] < 0.002 |
| 0.000 < w[389] < 0.002 |
| 0.000 < w[390] < 0.002 |
| 0.000 < w[391] < 0.002 |
| 0.000 < w[392] < 0.002 |
| 0.000 < w[393] < 0.002 |
| −0.001 < w[394] < 0.001 |
| −0.001 < w[395] < 0.001 |
| −0.001 < w[396] < 0.001 |
| −0.001 < w[397] < 0.001 |
| −0.001 < w[398] < 0.001 |
| −0.001 < w[399] < 0.001 |
| −0.001 < w[400] < 0.001 |
| −0.001 < w[401] < 0.001 |
| −0.001 < w[402] < 0.001 |
| −0.001 < w[403] < 0.001 |
| −0.001 < w[404] < 0.001 |
| −0.001 < w[405] < 0.001 |
| −0.001 < w[406] < 0.001 |
| −0.001 < w[407] < 0.001 |
| −0.001 < w[408] < 0.001 |
| −0.001 < w[409] < 0.001 |
| −0.001 < w[410] < 0.001 |
| −0.001 < w[411] < 0.001 |
| −0.001 < w[412] < 0.001 |
| −0.001 < w[413] < 0.001 |
| −0.001 < w[414] < 0.001 |
| −0.001 < w[415] < 0.001 |
| −0.001 < w[416] < 0.001 |
| −0.001 < w[417] < 0.001 |
| −0.001 < w[418] < 0.001 |
| −0.001 < w[419] < 0.001 |
| −0.001 < w[420] < 0.001 |
| −0.001 < w[421] < 0.001 |
| −0.001 < w[422] < 0.001 |

-continued

| Annex 3 |
|---|
| −0.001 < w[423] < 0.001 |
| −0.001 < w[424] < 0.001 |
| −0.001 < w[425] < 0.001 |
| −0.001 < w[426] < 0.001 |
| −0.001 < w[427] < 0.001 |
| −0.001 < w[428] < 0.001 |
| −0.001 < w[429] < 0.001 |
| −0.001 < w[430] < 0.001 |
| −0.001 < w[431] < 0.001 |
| −0.001 < w[432] < 0.001 |
| −0.001 < w[433] < 0.001 |
| −0.001 < w[434] < 0.001 |
| −0.001 < w[435] < 0.001 |
| −0.001 < w[436] < 0.001 |
| −0.001 < w[437] < 0.001 |
| −0.001 < w[438] < 0.001 |
| −0.001 < w[439] < 0.001 |
| −0.001 < w[440] < 0.001 |
| −0.001 < w[441] < 0.001 |
| −0.001 < w[442] < 0.001 |
| −0.001 < w[443] < 0.001 |
| −0.001 < w[444] < 0.001 |
| −0.001 < w[445] < 0.001 |
| −0.001 < w[446] < 0.001 |
| −0.001 < w[447] < 0.001 |
| −0.001 < w[448] < 0.001 |
| −0.001 < w[449] < 0.001 |
| −0.001 < w[450] < 0.001 |
| −0.001 < w[451] < 0.001 |
| −0.001 < w[452] < 0.001 |
| −0.001 < w[453] < 0.001 |
| −0.001 < w[454] < 0.001 |
| −0.001 < w[455] < 0.001 |
| −0.001 < w[456] < 0.001 |
| −0.001 < w[457] < 0.001 |
| −0.001 < w[458] < 0.001 |
| −0.001 < w[459] < 0.001 |
| −0.001 < w[460] < 0.001 |
| −0.001 < w[461] < 0.001 |
| −0.001 < w[462] < 0.001 |
| −0.001 < w[463] < 0.001 |
| −0.001 < w[464] < 0.001 |
| −0.001 < w[465] < 0.001 |
| −0.001 < w[466] < 0.001 |
| −0.001 < w[467] < 0.001 |
| −0.001 < w[468] < 0.001 |
| −0.001 < w[469] < 0.001 |
| −0.001 < w[470] < 0.001 |
| −0.001 < w[471] < 0.001 |
| −0.001 < w[472] < 0.001 |
| −0.001 < w[473] < 0.001 |
| −0.001 < w[474] < 0.001 |
| −0.001 < w[475] < 0.001 |
| −0.001 < w[476] < 0.001 |
| −0.001 < w[477] < 0.001 |
| −0.001 < w[478] < 0.001 |
| 0.000 < w[479] < 0.002 |
| −0.001 < w[480] < 0.001 |
| −0.001 < w[481] < 0.001 |
| −0.001 < w[482] < 0.001 |
| −0.001 < w[483] < 0.001 |
| −0.001 < w[484] < 0.001 |
| −0.001 < w[485] < 0.001 |
| −0.001 < w[486] < 0.001 |
| −0.001 < w[487] < 0.001 |
| −0.001 < w[488] < 0.001 |
| −0.001 < w[489] < 0.001 |
| −0.001 < w[490] < 0.001 |
| −0.001 < w[491] < 0.001 |
| −0.001 < w[492] < 0.001 |
| −0.001 < w[493] < 0.001 |
| −0.001 < w[494] < 0.001 |
| −0.001 < w[495] < 0.001 |
| −0.001 < w[496] < 0.001 |
| −0.001 < w[497] < 0.001 |
| −0.001 < w[498] < 0.001 |
| −0.001 < w[499] < 0.001 |

-continued

| Annex 3 |
|---|
| −0.001 < w[500] < 0.001 |
| −0.001 < w[501] < 0.001 |
| −0.001 < w[502] < 0.001 |
| −0.001 < w[503] < 0.001 |
| −0.001 < w[504] < 0.001 |
| −0.001 < w[505] < 0.001 |
| −0.001 < w[506] < 0.001 |
| −0.001 < w[507] < 0.001 |
| −0.001 < w[508] < 0.001 |
| −0.001 < w[509] < 0.001 |
| −0.001 < w[510] < 0.001 |
| −0.001 < w[511] < 0.001 |
| −0.001 < w[512] < 0.001 |
| −0.001 < w[513] < 0.001 |
| −0.001 < w[514] < 0.001 |
| −0.001 < w[515] < 0.001 |
| −0.001 < w[516] < 0.001 |
| −0.001 < w[517] < 0.001 |
| −0.001 < w[518] < 0.001 |
| −0.001 < w[519] < 0.001 |
| −0.001 < w[520] < 0.001 |
| −0.001 < w[521] < 0.001 |
| −0.001 < w[522] < 0.001 |
| −0.001 < w[523] < 0.001 |
| −0.001 < w[524] < 0.001 |
| −0.001 < w[525] < 0.001 |
| −0.001 < w[526] < 0.001 |
| −0.001 < w[527] < 0.001 |
| −0.001 < w[528] < 0.001 |
| −0.001 < w[529] < 0.001 |
| −0.001 < w[530] < 0.001 |
| −0.001 < w[531] < 0.001 |
| −0.001 < w[532] < 0.001 |
| −0.001 < w[533] < 0.001 |
| −0.001 < w[534] < 0.001 |
| −0.001 < w[535] < 0.001 |
| −0.001 < w[536] < 0.001 |
| −0.001 < w[537] < 0.001 |
| −0.001 < w[538] < 0.001 |
| −0.001 < w[539] < 0.001 |
| −0.001 < w[540] < 0.001 |
| −0.001 < w[541] < 0.001 |
| −0.001 < w[542] < 0.001 |
| −0.001 < w[543] < 0.001 |
| −0.001 < w[544] < 0.001 |
| −0.001 < w[545] < 0.001 |
| −0.001 < w[546] < 0.001 |
| −0.001 < w[547] < 0.001 |
| −0.001 < w[548] < 0.001 |
| −0.001 < w[549] < 0.001 |
| −0.001 < w[550] < 0.001 |
| −0.001 < w[551] < 0.001 |
| −0.001 < w[552] < 0.001 |
| −0.001 < w[553] < 0.001 |
| −0.001 < w[554] < 0.001 |
| −0.001 < w[555] < 0.001 |
| −0.001 < w[556] < 0.001 |
| −0.001 < w[557] < 0.001 |
| −0.001 < w[558] < 0.001 |
| −0.001 < w[559] < 0.001 |
| −0.001 < w[560] < 0.001 |
| −0.001 < w[561] < 0.001 |
| −0.001 < w[562] < 0.001 |
| −0.001 < w[563] < 0.001 |
| −0.001 < w[564] < 0.001 |
| −0.001 < w[565] < 0.001 |
| −0.001 < w[566] < 0.001 |
| −0.001 < w[567] < 0.001 |
| −0.001 < w[568] < 0.001 |
| −0.001 < w[569] < 0.001 |
| −0.001 < w[570] < 0.001 |
| −0.001 < w[571] < 0.001 |
| −0.001 < w[572] < 0.001 |
| −0.001 < w[573] < 0.001 |
| −0.001 < w[574] < 0.001 |
| −0.001 < w[575] < 0.001 |
| −0.001 < w[576] < 0.001 |

-continued

| Annex 3 |
|---|
| −0.001 < w[577] < 0.001 |
| −0.001 < w[578] < 0.001 |
| −0.001 < w[579] < 0.001 |
| −0.001 < w[580] < 0.001 |
| −0.001 < w[581] < 0.001 |
| −0.001 < w[582] < 0.001 |
| −0.001 < w[583] < 0.001 |
| −0.001 < w[584] < 0.001 |
| −0.001 < w[585] < 0.001 |
| −0.001 < w[586] < 0.001 |
| −0.001 < w[587] < 0.001 |
| −0.001 < w[588] < 0.001 |
| −0.001 < w[589] < 0.001 |
| −0.001 < w[590] < 0.001 |
| −0.001 < w[591] < 0.001 |
| −0.001 < w[592] < 0.001 |
| −0.001 < w[593] < 0.001 |
| −0.001 < w[594] < 0.001 |
| −0.001 < w[595] < 0.001 |
| −0.001 < w[596] < 0.001 |
| −0.001 < w[597] < 0.001 |
| −0.001 < w[598] < 0.001 |
| −0.001 < w[599] < 0.001 |
| −0.001 < w[600] < 0.001 |
| −0.001 < w[601] < 0.001 |
| −0.001 < w[602] < 0.001 |
| −0.001 < w[603] < 0.001 |
| −0.001 < w[604] < 0.001 |
| −0.001 < w[605] < 0.001 |
| −0.001 < w[606] < 0.001 |
| −0.001 < w[607] < 0.001 |
| −0.001 < w[608] < 0.001 |
| −0.001 < w[609] < 0.001 |
| −0.001 < w[610] < 0.001 |
| −0.001 < w[611] < 0.001 |
| −0.001 < w[612] < 0.001 |
| −0.001 < w[613] < 0.001 |
| −0.001 < w[614] < 0.001 |
| −0.001 < w[615] < 0.001 |
| −0.001 < w[616] < 0.001 |
| −0.001 < w[617] < 0.001 |
| −0.001 < w[618] < 0.001 |
| −0.001 < w[619] < 0.001 |
| −0.001 < w[620] < 0.001 |
| −0.001 < w[621] < 0.001 |
| −0.001 < w[622] < 0.001 |
| −0.001 < w[623] < 0.001 |
| −0.001 < w[624] < 0.001 |
| −0.001 < w[625] < 0.001 |
| −0.001 < w[626] < 0.001 |
| −0.001 < w[627] < 0.001 |
| −0.001 < w[628] < 0.001 |
| −0.001 < w[629] < 0.001 |
| −0.001 < w[630] < 0.001 |
| −0.001 < w[631] < 0.001 |
| −0.001 < w[632] < 0.001 |
| −0.001 < w[633] < 0.001 |
| −0.001 < w[634] < 0.001 |
| −0.001 < w[635] < 0.001 |
| −0.001 < w[636] < 0.001 |
| −0.001 < w[637] < 0.001 |
| −0.001 < w[638] < 0.001 |
| −0.001 < w[639] < 0.001 |

| Annex 4 |
|---|
| 0.010 < \|w[0]\| < 0.012 |
| 0.023 < \|w[1]\| < 0.025 |
| 0.034 < \|w[2]\| < 0.036 |
| 0.045 < \|w[3]\| < 0.047 |
| 0.058 < \|w[4]\| < 0.060 |
| 0.072 < \|w[5]\| < 0.074 |
| 0.087 < \|w[6]\| < 0.089 |
| 0.103 < \|w[7]\| < 0.105 |

-continued

| Annex 4 |
|---|
| 0.120 < \|w[8]\| < 0.122 |
| 0.137 < \|w[9]\| < 0.139 |
| 0.154 < \|w[10]\| < 0.156 |
| 0.171 < \|w[11]\| < 0.173 |
| 0.188 < \|w[12]\| < 0.190 |
| 0.205 < \|w[13]\| < 0.207 |
| 0.222 < \|w[14]\| < 0.224 |
| 0.239 < \|w[15]\| < 0.241 |
| 0.256 < \|w[16]\| < 0.258 |
| 0.272 < \|w[17]\| < 0.274 |
| 0.289 < \|w[18]\| < 0.291 |
| 0.306 < \|w[19]\| < 0.308 |
| 0.323 < \|w[20]\| < 0.325 |
| 0.339 < \|w[21]\| < 0.341 |
| 0.356 < \|w[22]\| < 0.358 |
| 0.373 < \|w[23]\| < 0.375 |
| 0.390 < \|w[24]\| < 0.392 |
| 0.407 < \|w[25]\| < 0.409 |
| 0.424 < \|w[26]\| < 0.426 |
| 0.441 < \|w[27]\| < 0.443 |
| 0.458 < \|w[28]\| < 0.460 |
| 0.475 < \|w[29]\| < 0.477 |
| 0.492 < \|w[30]\| < 0.494 |
| 0.509 < \|w[31]\| < 0.511 |
| 0.525 < \|w[32]\| < 0.527 |
| 0.542 < \|w[33]\| < 0.544 |
| 0.559 < \|w[34]\| < 0.561 |
| 0.575 < \|w[35]\| < 0.577 |
| 0.592 < \|w[36]\| < 0.594 |
| 0.609 < \|w[37]\| < 0.611 |
| 0.625 < \|w[38]\| < 0.627 |
| 0.642 < \|w[39]\| < 0.644 |
| 0.658 < \|w[40]\| < 0.660 |
| 0.674 < \|w[41]\| < 0.676 |
| 0.690 < \|w[42]\| < 0.692 |
| 0.706 < \|w[43]\| < 0.708 |
| 0.722 < \|w[44]\| < 0.724 |
| 0.738 < \|w[45]\| < 0.740 |
| 0.753 < \|w[46]\| < 0.755 |
| 0.769 < \|w[47]\| < 0.771 |
| 0.784 < \|w[48]\| < 0.786 |
| 0.799 < \|w[49]\| < 0.801 |
| 0.815 < \|w[50]\| < 0.817 |
| 0.830 < \|w[51]\| < 0.832 |
| 0.845 < \|w[52]\| < 0.847 |
| 0.860 < \|w[53]\| < 0.862 |
| 0.874 < \|w[54]\| < 0.876 |
| 0.889 < \|w[55]\| < 0.891 |
| 0.903 < \|w[56]\| < 0.905 |
| 0.917 < \|w[57]\| < 0.919 |
| 0.930 < \|w[58]\| < 0.932 |
| 0.943 < \|w[59]\| < 0.945 |
| 0.956 < \|w[60]\| < 0.958 |
| 0.968 < \|w[61]\| < 0.970 |
| 0.980 < \|w[62]\| < 0.982 |
| 0.992 < \|w[63]\| < 0.994 |
| 1.000 < \|w[64]\| < 1.002 |
| 1.006 < \|w[65]\| < 1.008 |
| 1.012 < \|w[66]\| < 1.014 |
| 1.017 < \|w[67]\| < 1.019 |
| 1.021 < \|w[68]\| < 1.023 |
| 1.026 < \|w[69]\| < 1.028 |
| 1.029 < \|w[70]\| < 1.031 |
| 1.032 < \|w[71]\| < 1.034 |
| 1.035 < \|w[72]\| < 1.037 |
| 1.037 < \|w[73]\| < 1.039 |
| 1.038 < \|w[74]\| < 1.040 |
| 1.039 < \|w[75]\| < 1.041 |
| 1.040 < \|w[76]\| < 1.042 |
| 1.040 < \|w[77]\| < 1.042 |
| 1.040 < \|w[78]\| < 1.042 |
| 1.040 < \|w[79]\| < 1.042 |
| 1.039 < \|w[80]\| < 1.041 |
| 1.038 < \|w[81]\| < 1.040 |
| 1.036 < \|w[82]\| < 1.038 |
| 1.034 < \|w[83]\| < 1.036 |
| 1.032 < \|w[84]\| < 1.034 |

-continued

| Annex 4 |
|---|
| 1.029 < \|w[85]\| < 1.031 |
| 1.025 < \|w[86]\| < 1.027 |
| 1.021 < \|w[87]\| < 1.023 |
| 1.016 < \|w[88]\| < 1.018 |
| 1.011 < \|w[89]\| < 1.013 |
| 1.005 < \|w[90]\| < 1.007 |
| 0.999 < \|w[91]\| < 1.001 |
| 0.992 < \|w[92]\| < 0.994 |
| 0.985 < \|w[93]\| < 0.987 |
| 0.977 < \|w[94]\| < 0.979 |
| 0.969 < \|w[95]\| < 0.971 |
| 0.960 < \|w[96]\| < 0.962 |
| 0.951 < \|w[97]\| < 0.953 |
| 0.941 < \|w[98]\| < 0.943 |
| 0.931 < \|w[99]\| < 0.933 |
| 0.920 < \|w[100]\| < 0.922 |
| 0.909 < \|w[101]\| < 0.911 |
| 0.897 < \|w[102]\| < 0.899 |
| 0.885 < \|w[103]\| < 0.887 |
| 0.872 < \|w[104]\| < 0.874 |
| 0.860 < \|w[105]\| < 0.862 |
| 0.846 < \|w[106]\| < 0.848 |
| 0.833 < \|w[107]\| < 0.835 |
| 0.819 < \|w[108]\| < 0.821 |
| 0.804 < \|w[109]\| < 0.806 |
| 0.790 < \|w[110]\| < 0.792 |
| 0.775 < \|w[111]\| < 0.777 |
| 0.760 < \|w[112]\| < 0.762 |
| 0.745 < \|w[113]\| < 0.747 |
| 0.729 < \|w[114]\| < 0.731 |
| 0.713 < \|w[115]\| < 0.715 |
| 0.697 < \|w[116]\| < 0.699 |
| 0.681 < \|w[117]\| < 0.683 |
| 0.664 < \|w[118]\| < 0.666 |
| 0.648 < \|w[119]\| < 0.650 |
| 0.631 < \|w[120]\| < 0.633 |
| 0.614 < \|w[121]\| < 0.616 |
| 0.597 < \|w[122]\| < 0.599 |
| 0.580 < \|w[123]\| < 0.582 |
| 0.563 < \|w[124]\| < 0.565 |
| 0.546 < \|w[125]\| < 0.548 |
| 0.529 < \|w[126]\| < 0.531 |
| 0.512 < \|w[127]\| < 0.514 |
| 0.495 < \|w[128]\| < 0.497 |
| 0.477 < \|w[129]\| < 0.479 |
| 0.460 < \|w[130]\| < 0.462 |
| 0.443 < \|w[131]\| < 0.445 |
| 0.426 < \|w[132]\| < 0.428 |
| 0.409 < \|w[133]\| < 0.411 |
| 0.392 < \|w[134]\| < 0.394 |
| 0.375 < \|w[135]\| < 0.377 |
| 0.358 < \|w[136]\| < 0.360 |
| 0.341 < \|w[137]\| < 0.343 |
| 0.325 < \|w[138]\| < 0.327 |
| 0.309 < \|w[139]\| < 0.311 |
| 0.293 < \|w[140]\| < 0.295 |
| 0.277 < \|w[141]\| < 0.279 |
| 0.261 < \|w[142]\| < 0.263 |
| 0.246 < \|w[143]\| < 0.248 |
| 0.231 < \|w[144]\| < 0.233 |
| 0.216 < \|w[145]\| < 0.218 |
| 0.201 < \|w[146]\| < 0.203 |
| 0.187 < \|w[147]\| < 0.189 |
| 0.173 < \|w[148]\| < 0.175 |
| 0.159 < \|w[149]\| < 0.161 |
| 0.145 < \|w[150]\| < 0.147 |
| 0.132 < \|w[151]\| < 0.134 |
| 0.119 < \|w[152]\| < 0.121 |
| 0.106 < \|w[153]\| < 0.108 |
| 0.094 < \|w[154]\| < 0.096 |
| 0.082 < \|w[155]\| < 0.084 |
| 0.070 < \|w[156]\| < 0.072 |
| 0.059 < \|w[157]\| < 0.061 |
| 0.048 < \|w[158]\| < 0.050 |
| 0.037 < \|w[159]\| < 0.039 |
| 0.026 < \|w[160]\| < 0.028 |
| 0.016 < \|w[161]\| < 0.018 |

-continued

| Annex 4 |
|---|
| 0.006 < \|w[162]\| < 0.008 |
| 0.001 < \|w[163]\| < 0.003 |
| 0.010 < \|w[164]\| < 0.012 |
| 0.019 < \|w[165]\| < 0.021 |
| 0.028 < \|w[166]\| < 0.030 |
| 0.036 < \|w[167]\| < 0.038 |
| 0.043 < \|w[168]\| < 0.045 |
| 0.051 < \|w[169]\| < 0.053 |
| 0.058 < \|w[170]\| < 0.060 |
| 0.065 < \|w[171]\| < 0.067 |
| 0.071 < \|w[172]\| < 0.073 |
| 0.077 < \|w[173]\| < 0.079 |
| 0.082 < \|w[174]\| < 0.084 |
| 0.088 < \|w[175]\| < 0.090 |
| 0.093 < \|w[176]\| < 0.095 |
| 0.097 < \|w[177]\| < 0.099 |
| 0.101 < \|w[178]\| < 0.103 |
| 0.105 < \|w[179]\| < 0.107 |
| 0.109 < \|w[180]\| < 0.111 |
| 0.112 < \|w[181]\| < 0.114 |
| 0.115 < \|w[182]\| < 0.117 |
| 0.117 < \|w[183]\| < 0.119 |
| 0.119 < \|w[184]\| < 0.121 |
| 0.121 < \|w[185]\| < 0.123 |
| 0.123 < \|w[186]\| < 0.125 |
| 0.124 < \|w[187]\| < 0.126 |
| 0.125 < \|w[188]\| < 0.127 |
| 0.126 < \|w[189]\| < 0.128 |
| 0.126 < \|w[190]\| < 0.128 |
| 0.126 < \|w[191]\| < 0.128 |
| 0.126 < \|w[192]\| < 0.128 |
| 0.127 < \|w[193]\| < 0.129 |
| 0.126 < \|w[194]\| < 0.128 |
| 0.126 < \|w[195]\| < 0.128 |
| 0.125 < \|w[196]\| < 0.127 |
| 0.124 < \|w[197]\| < 0.126 |
| 0.123 < \|w[198]\| < 0.125 |
| 0.122 < \|w[199]\| < 0.124 |
| 0.121 < \|w[200]\| < 0.123 |
| 0.119 < \|w[201]\| < 0.121 |
| 0.118 < \|w[202]\| < 0.120 |
| 0.116 < \|w[203]\| < 0.118 |
| 0.114 < \|w[204]\| < 0.116 |
| 0.111 < \|w[205]\| < 0.113 |
| 0.109 < \|w[206]\| < 0.111 |
| 0.107 < \|w[207]\| < 0.109 |
| 0.104 < \|w[208]\| < 0.106 |
| 0.102 < \|w[209]\| < 0.104 |
| 0.099 < \|w[210]\| < 0.101 |
| 0.096 < \|w[211]\| < 0.098 |
| 0.093 < \|w[212]\| < 0.095 |
| 0.090 < \|w[213]\| < 0.092 |
| 0.087 < \|w[214]\| < 0.089 |
| 0.084 < \|w[215]\| < 0.086 |
| 0.082 < \|w[216]\| < 0.084 |
| 0.079 < \|w[217]\| < 0.081 |
| 0.076 < \|w[218]\| < 0.078 |
| 0.073 < \|w[219]\| < 0.075 |
| 0.070 < \|w[220]\| < 0.072 |
| 0.067 < \|w[221]\| < 0.069 |
| 0.064 < \|w[222]\| < 0.066 |
| 0.061 < \|w[223]\| < 0.063 |
| 0.058 < \|w[224]\| < 0.060 |
| 0.055 < \|w[225]\| < 0.057 |
| 0.053 < \|w[226]\| < 0.055 |
| 0.050 < \|w[227]\| < 0.052 |
| 0.047 < \|w[228]\| < 0.049 |
| 0.045 < \|w[229]\| < 0.047 |
| 0.043 < \|w[230]\| < 0.045 |
| 0.040 < \|w[231]\| < 0.042 |
| 0.038 < \|w[232]\| < 0.040 |
| 0.036 < \|w[233]\| < 0.038 |
| 0.034 < \|w[234]\| < 0.036 |
| 0.032 < \|w[235]\| < 0.034 |
| 0.030 < \|w[236]\| < 0.032 |
| 0.028 < \|w[237]\| < 0.030 |
| 0.027 < \|w[238]\| < 0.029 |

-continued

| Annex 4 |
|---|
| 0.025 < \|w[239]\| < 0.027 |
| 0.023 < \|w[240]\| < 0.025 |
| 0.022 < \|w[241]\| < 0.024 |
| 0.021 < \|w[242]\| < 0.023 |
| 0.019 < \|w[243]\| < 0.021 |
| 0.018 < \|w[244]\| < 0.020 |
| 0.017 < \|w[245]\| < 0.019 |
| 0.016 < \|w[246]\| < 0.018 |
| 0.015 < \|w[247]\| < 0.017 |
| 0.014 < \|w[248]\| < 0.016 |
| 0.013 < \|w[249]\| < 0.015 |
| 0.012 < \|w[250]\| < 0.014 |
| 0.011 < \|w[251]\| < 0.013 |
| 0.010 < \|w[252]\| < 0.012 |
| 0.009 < \|w[253]\| < 0.011 |
| 0.009 < \|w[254]\| < 0.011 |
| 0.008 < \|w[255]\| < 0.010 |
| 0.007 < \|w[256]\| < 0.009 |
| 0.007 < \|w[257]\| < 0.009 |
| 0.006 < \|w[258]\| < 0.008 |
| 0.006 < \|w[259]\| < 0.008 |
| 0.006 < \|w[260]\| < 0.008 |
| 0.005 < \|w[261]\| < 0.007 |
| 0.005 < \|w[262]\| < 0.007 |
| 0.004 < \|w[263]\| < 0.006 |
| 0.004 < \|w[264]\| < 0.006 |
| 0.004 < \|w[265]\| < 0.006 |
| 0.003 < \|w[266]\| < 0.005 |
| 0.003 < \|w[267]\| < 0.005 |
| 0.003 < \|w[268]\| < 0.005 |
| 0.003 < \|w[269]\| < 0.005 |
| 0.002 < \|w[270]\| < 0.004 |
| 0.002 < \|w[271]\| < 0.004 |
| 0.002 < \|w[272]\| < 0.004 |
| 0.001 < \|w[273]\| < 0.003 |
| 0.001 < \|w[274]\| < 0.003 |
| 0.001 < \|w[275]\| < 0.003 |
| 0.001 < \|w[276]\| < 0.003 |
| 0.000 < \|w[277]\| < 0.002 |
| 0.000 < \|w[278]\| < 0.002 |
| 0.000 < \|w[279]\| < 0.002 |
| 0.000 < \|w[280]\| < 0.002 |
| 0.000 < \|w[281]\| < 0.002 |
| 0.000 < \|w[282]\| < 0.002 |
| −0.001 < \|w[283]\| < 0.001 |
| −0.001 < \|w[284]\| < 0.001 |
| −0.001 < \|w[285]\| < 0.001 |
| −0.001 < \|w[286]\| < 0.001 |
| 0.000 < \|w[287]\| < 0.002 |
| 0.000 < \|w[288]\| < 0.002 |
| 0.000 < \|w[289]\| < 0.002 |
| 0.000 < \|w[290]\| < 0.002 |
| 0.000 < \|w[291]\| < 0.002 |
| 0.001 < \|w[292]\| < 0.003 |
| 0.001 < \|w[293]\| < 0.003 |
| 0.001 < \|w[294]\| < 0.003 |
| 0.001 < \|w[295]\| < 0.003 |
| 0.000 < \|w[296]\| < 0.002 |
| 0.000 < \|w[297]\| < 0.002 |
| 0.000 < \|w[298]\| < 0.002 |
| −0.001 < \|w[299]\| < 0.001 |
| −0.001 < \|w[300]\| < 0.001 |
| 0.000 < \|w[301]\| < 0.002 |
| 0.000 < \|w[302]\| < 0.002 |
| 0.001 < \|w[303]\| < 0.003 |
| 0.001 < \|w[304]\| < 0.003 |
| 0.002 < \|w[305]\| < 0.004 |
| 0.002 < \|w[306]\| < 0.004 |
| 0.002 < \|w[307]\| < 0.004 |
| 0.003 < \|w[308]\| < 0.005 |
| 0.003 < \|w[309]\| < 0.005 |
| 0.003 < \|w[310]\| < 0.005 |
| 0.004 < \|w[311]\| < 0.006 |
| 0.004 < \|w[312]\| < 0.006 |
| 0.004 < \|w[313]\| < 0.006 |
| 0.004 < \|w[314]\| < 0.006 |
| 0.004 < \|w[315]\| < 0.006 |

-continued

| Annex 4 |
|---|
| 0.004 < \|w[316]\| < 0.006 |
| 0.003 < \|w[317]\| < 0.005 |
| 0.003 < \|w[318]\| < 0.005 |
| 0.003 < \|w[319]\| < 0.005 |
| 0.003 < \|w[320]\| < 0.005 |
| 0.002 < \|w[321]\| < 0.004 |
| 0.002 < \|w[322]\| < 0.004 |
| 0.002 < \|w[323]\| < 0.004 |
| 0.001 < \|w[324]\| < 0.003 |
| 0.001 < \|w[325]\| < 0.003 |
| 0.001 < \|w[326]\| < 0.003 |
| 0.000 < \|w[327]\| < 0.002 |
| 0.000 < \|w[328]\| < 0.002 |
| −0.001 < \|w[329]\| < 0.001 |
| −0.001 < \|w[330]\| < 0.001 |
| −0.001 < \|w[331]\| < 0.001 |
| −0.001 < \|w[332]\| < 0.001 |
| −0.001 < \|w[333]\| < 0.001 |
| 0.000 < \|w[334]\| < 0.002 |
| 0.000 < \|w[335]\| < 0.002 |
| 0.000 < \|w[336]\| < 0.002 |
| 0.000 < \|w[337]\| < 0.002 |
| 0.000 < \|w[338]\| < 0.002 |
| 0.000 < \|w[339]\| < 0.002 |
| 0.000 < \|w[340]\| < 0.002 |
| 0.000 < \|w[341]\| < 0.002 |
| 0.000 < \|w[342]\| < 0.002 |
| 0.000 < \|w[343]\| < 0.002 |
| −0.001 < \|w[344]\| < 0.001 |
| −0.001 < \|w[345]\| < 0.001 |
| 0.000 < \|w[346]\| < 0.002 |
| 0.000 < \|w[347]\| < 0.002 |
| 0.001 < \|w[348]\| < 0.003 |
| 0.001 < \|w[349]\| < 0.003 |
| 0.001 < \|w[350]\| < 0.003 |
| 0.002 < \|w[351]\| < 0.004 |
| 0.002 < \|w[352]\| < 0.004 |
| 0.002 < \|w[353]\| < 0.004 |
| 0.002 < \|w[354]\| < 0.004 |
| 0.002 < \|w[355]\| < 0.004 |
| 0.001 < \|w[356]\| < 0.003 |
| 0.001 < \|w[357]\| < 0.003 |
| 0.001 < \|w[358]\| < 0.003 |
| 0.001 < \|w[359]\| < 0.003 |
| 0.001 < \|w[360]\| < 0.003 |
| 0.000 < \|w[361]\| < 0.002 |
| 0.000 < \|w[362]\| < 0.002 |
| 0.000 < \|w[363]\| < 0.002 |
| −0.001 < \|w[364]\| < 0.001 |
| −0.001 < \|w[365]\| < 0.001 |
| −0.001 < \|w[366]\| < 0.001 |
| −0.001 < \|w[367]\| < 0.001 |
| 0.000 < \|w[368]\| < 0.002 |
| 0.000 < \|w[369]\| < 0.002 |
| 0.000 < \|w[370]\| < 0.002 |
| 0.000 < \|w[371]\| < 0.002 |
| 0.000 < \|w[372]\| < 0.002 |
| 0.000 < \|w[373]\| < 0.002 |
| 0.000 < \|w[374]\| < 0.002 |
| 0.000 < \|w[375]\| < 0.002 |
| 0.000 < \|w[376]\| < 0.002 |
| 0.000 < \|w[377]\| < 0.002 |
| 0.000 < \|w[378]\| < 0.002 |
| 0.000 < \|w[379]\| < 0.002 |
| 0.000 < \|w[380]\| < 0.002 |
| 0.000 < \|w[381]\| < 0.002 |
| 0.000 < \|w[382]\| < 0.002 |
| 0.000 < \|w[383]\| < 0.002 |
| 0.000 < \|w[384]\| < 0.002 |
| 0.000 < \|w[385]\| < 0.002 |
| 0.000 < \|w[386]\| < 0.002 |
| 0.000 < \|w[387]\| < 0.002 |
| 0.000 < \|w[388]\| < 0.002 |
| 0.000 < \|w[389]\| < 0.002 |
| 0.000 < \|w[390]\| < 0.002 |
| 0.000 < \|w[391]\| < 0.002 |
| 0.000 < \|w[392]\| < 0.002 |

-continued

| Annex 4 |
|---|
| 0.000 < \|w[393]\| < 0.002 |
| −0.001 < \|w[394]\| < 0.001 |
| −0.001 < \|w[395]\| < 0.001 |
| −0.001 < \|w[396]\| < 0.001 |
| −0.001 < \|w[397]\| < 0.001 |
| −0.001 < \|w[398]\| < 0.001 |
| −0.001 < \|w[399]\| < 0.001 |
| −0.001 < \|w[400]\| < 0.001 |
| −0.001 < \|w[401]\| < 0.001 |
| −0.001 < \|w[402]\| < 0.001 |
| −0.001 < \|w[403]\| < 0.001 |
| −0.001 < \|w[404]\| < 0.001 |
| −0.001 < \|w[405]\| < 0.001 |
| −0.001 < \|w[406]\| < 0.001 |
| −0.001 < \|w[407]\| < 0.001 |
| −0.001 < \|w[408]\| < 0.001 |
| −0.001 < \|w[409]\| < 0.001 |
| −0.001 < \|w[410]\| < 0.001 |
| −0.001 < \|w[411]\| < 0.001 |
| −0.001 < \|w[412]\| < 0.001 |
| −0.001 < \|w[413]\| < 0.001 |
| −0.001 < \|w[414]\| < 0.001 |
| −0.001 < \|w[415]\| < 0.001 |
| −0.001 < \|w[416]\| < 0.001 |
| −0.001 < \|w[417]\| < 0.001 |
| −0.001 < \|w[418]\| < 0.001 |
| −0.001 < \|w[419]\| < 0.001 |
| −0.001 < \|w[420]\| < 0.001 |
| −0.001 < \|w[421]\| < 0.001 |
| −0.001 < \|w[422]\| < 0.001 |
| −0.001 < \|w[423]\| < 0.001 |
| −0.001 < \|w[424]\| < 0.001 |
| −0.001 < \|w[425]\| < 0.001 |
| −0.001 < \|w[426]\| < 0.001 |
| −0.001 < \|w[427]\| < 0.001 |
| −0.001 < \|w[428]\| < 0.001 |
| −0.001 < \|w[429]\| < 0.001 |
| −0.001 < \|w[430]\| < 0.001 |
| −0.001 < \|w[431]\| < 0.001 |
| −0.001 < \|w[432]\| < 0.001 |
| −0.001 < \|w[433]\| < 0.001 |
| −0.001 < \|w[434]\| < 0.001 |
| −0.001 < \|w[435]\| < 0.001 |
| −0.001 < \|w[436]\| < 0.001 |
| −0.001 < \|w[437]\| < 0.001 |
| −0.001 < \|w[438]\| < 0.001 |
| −0.001 < \|w[439]\| < 0.001 |
| −0.001 < \|w[440]\| < 0.001 |
| −0.001 < \|w[441]\| < 0.001 |
| −0.001 < \|w[442]\| < 0.001 |
| −0.001 < \|w[443]\| < 0.001 |
| −0.001 < \|w[444]\| < 0.001 |
| −0.001 < \|w[445]\| < 0.001 |
| −0.001 < \|w[446]\| < 0.001 |
| −0.001 < \|w[447]\| < 0.001 |
| −0.001 < \|w[448]\| < 0.001 |
| −0.001 < \|w[449]\| < 0.001 |
| −0.001 < \|w[450]\| < 0.001 |
| −0.001 < \|w[451]\| < 0.001 |
| −0.001 < \|w[452]\| < 0.001 |
| −0.001 < \|w[453]\| < 0.001 |
| −0.001 < \|w[454]\| < 0.001 |
| −0.001 < \|w[455]\| < 0.001 |
| −0.001 < \|w[456]\| < 0.001 |
| −0.001 < \|w[457]\| < 0.001 |
| −0.001 < \|w[458]\| < 0.001 |
| −0.001 < \|w[459]\| < 0.001 |
| −0.001 < \|w[460]\| < 0.001 |
| −0.001 < \|w[461]\| < 0.001 |
| −0.001 < \|w[462]\| < 0.001 |
| −0.001 < \|w[463]\| < 0.001 |
| −0.001 < \|w[464]\| < 0.001 |
| −0.001 < \|w[465]\| < 0.001 |
| −0.001 < \|w[466]\| < 0.001 |
| −0.001 < \|w[467]\| < 0.001 |
| −0.001 < \|w[468]\| < 0.001 |
| −0.001 < \|w[469]\| < 0.001 |

-continued

| Annex 4 |
|---|
| −0.001 < \|w[470]\| < 0.001 |
| −0.001 < \|w[471]\| < 0.001 |
| −0.001 < \|w[472]\| < 0.001 |
| −0.001 < \|w[473]\| < 0.001 |
| −0.001 < \|w[474]\| < 0.001 |
| −0.001 < \|w[475]\| < 0.001 |
| −0.001 < \|w[476]\| < 0.001 |
| −0.001 < \|w[477]\| < 0.001 |
| −0.001 < \|w[478]\| < 0.001 |
| 0.000 < \|w[479]\| < 0.002 |
| −0.001 < \|w[480]\| < 0.001 |
| −0.001 < \|w[481]\| < 0.001 |
| −0.001 < \|w[482]\| < 0.001 |
| −0.001 < \|w[483]\| < 0.001 |
| −0.001 < \|w[484]\| < 0.001 |
| −0.001 < \|w[485]\| < 0.001 |
| −0.001 < \|w[486]\| < 0.001 |
| −0.001 < \|w[487]\| < 0.001 |
| −0.001 < \|w[488]\| < 0.001 |
| −0.001 < \|w[489]\| < 0.001 |
| −0.001 < \|w[490]\| < 0.001 |
| −0.001 < \|w[491]\| < 0.001 |
| −0.001 < \|w[492]\| < 0.001 |
| −0.001 < \|w[493]\| < 0.001 |
| −0.001 < \|w[494]\| < 0.001 |
| −0.001 < \|w[495]\| < 0.001 |
| −0.001 < \|w[496]\| < 0.001 |
| −0.001 < \|w[497]\| < 0.001 |
| −0.001 < \|w[498]\| < 0.001 |
| −0.001 < \|w[499]\| < 0.001 |
| −0.001 < \|w[500]\| < 0.001 |
| −0.001 < \|w[501]\| < 0.001 |
| −0.001 < \|w[502]\| < 0.001 |
| −0.001 < \|w[503]\| < 0.001 |
| −0.001 < \|w[504]\| < 0,001 |
| −0.001 < \|w[505]\| < 0.001 |
| −0.001 < \|w[506]\| < 0.001 |
| −0.001 < \|w[507]\| < 0.001 |
| −0.001 < \|w[508]\| < 0.001 |
| −0.001 < \|w[509]\| < 0.001 |
| −0.001 < \|w[510]\| < 0.001 |
| −0.001 < \|w[511]\| < 0.001 |
| −0.001 < \|w[512]\| < 0.001 |
| −0.001 < \|w[513]\| < 0.001 |
| −0.001 < \|w[514]\| < 0.001 |
| −0.001 < \|w[515]\| < 0.001 |
| −0.001 < \|w[516]\| < 0.001 |
| −0.001 < \|w[517]\| < 0.001 |
| −0.001 < \|w[518]\| < 0.001 |
| −0.001 < \|w[519]\| < 0.001 |
| −0.001 < \|w[520]\| < 0.001 |
| −0.001 < \|w[521]\| < 0.001 |
| −0.001 < \|w[522]\| < 0.001 |
| −0.001 < \|w[523]\| < 0,001 |
| −0.001 < \|w[524]\| < 0.001 |
| −0.001 < \|w[525]\| < 0.001 |
| −0.001 < \|w[526]\| < 0.001 |
| −0.001 < \|w[527]\| < 0.001 |
| −0.001 < \|w[528]\| < 0.001 |
| −0.001 < \|w[529]\| < 0.001 |
| −0.001 < \|w[530]\| < 0.001 |
| −0.001 < \|w[531]\| < 0.001 |
| −0.001 < \|w[532]\| < 0.001 |
| −0.001 < \|w[533]\| < 0.001 |
| −0.001 < \|w[534]\| < 0.001 |
| −0.001 < \|w[535]\| < 0.001 |
| −0.001 < \|w[536]\| < 0.001 |
| −0.001 < \|w[537]\| < 0.001 |
| −0.001 < \|w[538]\| < 0.001 |
| −0.001 < \|w[539]\| < 0.001 |
| −0.001 < \|w[540]\| < 0.001 |
| −0.001 < \|w[541]\| < 0.001 |
| −0.001 < \|w[542]\| < 0.001 |
| −0.001 < \|w[543]\| < 0.001 |
| −0.001 < \|w[544]\| < 0.001 |
| −0.001 < \|w[545]\| < 0.001 |
| −0.001 < \|w[546]\| < 0.001 |

-continued

| Annex 4 |
|---|
| $-0.001 < \lvert w[547] \rvert < 0.001$ |
| $-0.001 < \lvert w[548] \rvert < 0.001$ |
| $-0.001 < \lvert w[549] \rvert < 0.001$ |
| $-0.001 < \lvert w[550] \rvert < 0.001$ |
| $-0.001 < \lvert w[551] \rvert < 0.001$ |
| $-0.001 < \lvert w[552] \rvert < 0.001$ |
| $-0.001 < \lvert w[553] \rvert < 0.001$ |
| $-0.001 < \lvert w[554] \rvert < 0.001$ |
| $-0.001 < \lvert w[555] \rvert < 0.001$ |
| $-0.001 < \lvert w[556] \rvert < 0.001$ |
| $-0.001 < \lvert w[557] \rvert < 0.001$ |
| $-0.001 < \lvert w[558] \rvert < 0.001$ |
| $-0.001 < \lvert w[559] \rvert < 0.001$ |
| $-0.001 < \lvert w[560] \rvert < 0.001$ |
| $-0.001 < \lvert w[561] \rvert < 0.001$ |
| $-0.001 < \lvert w[562] \rvert < 0.001$ |
| $-0.001 < \lvert w[563] \rvert < 0.001$ |
| $-0.001 < \lvert w[564] \rvert < 0.001$ |
| $-0.001 < \lvert w[565] \rvert < 0.001$ |
| $-0.001 < \lvert w[566] \rvert < 0.001$ |
| $-0.001 < \lvert w[567] \rvert < 0.001$ |
| $-0.001 < \lvert w[568] \rvert < 0.001$ |
| $-0.001 < \lvert w[569] \rvert < 0.001$ |
| $-0.001 < \lvert w[570] \rvert < 0.001$ |
| $-0.001 < \lvert w[571] \rvert < 0.001$ |
| $-0.001 < \lvert w[572] \rvert < 0.001$ |
| $-0.001 < \lvert w[573] \rvert < 0.001$ |
| $-0.001 < \lvert w[574] \rvert < 0.001$ |
| $-0.001 < \lvert w[575] \rvert < 0.001$ |
| $-0.001 < \lvert w[576] \rvert < 0.001$ |
| $-0.001 < \lvert w[577] \rvert < 0.001$ |
| $-0.001 < \lvert w[578] \rvert < 0.001$ |
| $-0.001 < \lvert w[579] \rvert < 0.001$ |
| $-0.001 < \lvert w[580] \rvert < 0.001$ |
| $-0.001 < \lvert w[581] \rvert < 0.001$ |
| $-0.001 < \lvert w[582] \rvert < 0.001$ |
| $-0.001 < \lvert w[583] \rvert < 0.001$ |
| $-0.001 < \lvert w[584] \rvert < 0.001$ |
| $-0.001 < \lvert w[585] \rvert < 0.001$ |
| $-0.001 < \lvert w[586] \rvert < 0.001$ |
| $-0.001 < \lvert w[587] \rvert < 0.001$ |
| $-0.001 < \lvert w[588] \rvert < 0.001$ |
| $-0.001 < \lvert w[589] \rvert < 0.001$ |
| $-0.001 < \lvert w[590] \rvert < 0.001$ |
| $-0.001 < \lvert w[591] \rvert < 0.001$ |
| $-0.001 < \lvert w[592] \rvert < 0.001$ |
| $-0.001 < \lvert w[593] \rvert < 0.001$ |
| $-0.001 < \lvert w[594] \rvert < 0.001$ |
| $-0.001 < \lvert w[595] \rvert < 0.001$ |
| $-0.001 < \lvert w[596] \rvert < 0.001$ |
| $-0.001 < \lvert w[597] \rvert < 0.001$ |
| $-0.001 < \lvert w[598] \rvert < 0.001$ |
| $-0.001 < \lvert w[599] \rvert < 0.001$ |
| $-0.001 < \lvert w[600] \rvert < 0.001$ |
| $-0.001 < \lvert w[601] \rvert < 0.001$ |
| $-0.001 < \lvert w[602] \rvert < 0.001$ |
| $-0.001 < \lvert w[603] \rvert < 0.001$ |
| $-0.001 < \lvert w[604] \rvert < 0.001$ |
| $-0.001 < \lvert w[605] \rvert < 0.001$ |
| $-0.001 < \lvert w[606] \rvert < 0.001$ |
| $-0.001 < \lvert w[607] \rvert < 0.001$ |
| $-0.001 < \lvert w[608] \rvert < 0.001$ |
| $-0.001 < \lvert w[609] \rvert < 0.001$ |
| $-0.001 < \lvert w[610] \rvert < 0.001$ |
| $-0.001 < \lvert w[611] \rvert < 0.001$ |
| $-0.001 < \lvert w[612] \rvert < 0.001$ |
| $-0.001 < \lvert w[613] \rvert < 0.001$ |
| $-0.001 < \lvert w[614] \rvert < 0.001$ |
| $-0.001 < \lvert w[615] \rvert < 0.001$ |
| $-0.001 < \lvert w[616] \rvert < 0.001$ |
| $-0.001 < \lvert w[617] \rvert < 0.001$ |
| $-0.001 < \lvert w[618] \rvert < 0.001$ |
| $-0.001 < \lvert w[619] \rvert < 0.001$ |
| $-0.001 < \lvert w[620] \rvert < 0.001$ |
| $-0.001 < \lvert w[621] \rvert < 0.001$ |
| $-0.001 < \lvert w[622] \rvert < 0.001$ |
| $-0.001 < \lvert w[623] \rvert < 0.001$ |

-continued

| Annex 4 |
|---|
| $-0.001 < \lvert w[624] \rvert < 0.001$ |
| $-0.001 < \lvert w[625] \rvert < 0.001$ |
| $-0.001 < \lvert w[626] \rvert < 0.001$ |
| $-0.001 < \lvert w[627] \rvert < 0.001$ |
| $-0.001 < \lvert w[628] \rvert < 0.001$ |
| $-0.001 < \lvert w[629] \rvert < 0.001$ |
| $-0.001 < \lvert w[630] \rvert < 0.001$ |
| $-0.001 < \lvert w[631] \rvert < 0.001$ |
| $-0.001 < \lvert w[632] \rvert < 0.001$ |
| $-0.001 < \lvert w[633] \rvert < 0.001$ |
| $-0.001 < \lvert w[634] \rvert < 0.001$ |
| $-0.001 < \lvert w[635] \rvert < 0.001$ |
| $-0.001 < \lvert w[636] \rvert < 0.001$ |
| $-0.001 < \lvert w[637] \rvert < 0.001$ |
| $-0.001 < \lvert w[638] \rvert < 0.001$ |
| $-0.001 < \lvert w[639] \rvert < 0.001$ |

The invention claimed is:

[1. An apparatus for generating audio subband values in audio subband channels, comprising:

an analysis windower for windowing a frame of time–domain audio input samples being in a time sequence extending from an early sample to a later sample using an analysis window function comprising a sequence of window coefficients to acquire windowed samples, the analysis window function comprising a first number of window coefficients derived from a larger window function comprising a sequence of a larger second number of window coefficients, wherein the window coefficients of the window function are derived by an interpolation of window coefficients of the larger window function; and wherein the second number is an even number; and a calculator for calculating the audio subband values using the windowed samples.]

[2. The apparatus according to claim 1, wherein the apparatus is adapted to interpolating the window coefficients of the larger window function to acquire the window coefficients of the window function.]

[3. The apparatus according to claim 1, wherein the apparatus or the analysis windower is adapted such that the window coefficients of the window function are linearly interpolated.]

[4. The apparatus according to claim 1, wherein the apparatus or the analysis windower is adapted such that the window coefficients of the analysis window function are interpolated based on two consecutive window coefficients of the larger window function according to the sequence of the window coefficients of the larger window function to acquire one window coefficient of the window function.]

[5. The apparatus according to claim 1, wherein the apparatus or the analysis windower is adapted to acquire the window coefficients c(n) of the analysis window function based on the equation $$c(n) = \frac{1}{2}(c_2(2n) + c_2(2n+1)),$$

wherein n is an integer indicating an index of the window coefficients c(n), and $c_2(n)$ is a window coefficient of the larger window function.]

[6. The apparatus according to claim 5, wherein the apparatus or the analysis windower is adapted such that the window coefficients $c_2(n)$ of the larger window function obey the relations given in the table in Annex 4.]

[7. The apparatus according to claim 1, wherein the analysis windower is adapted such that windowing comprises multiplying the time–domain audio input samples x(n) of the frame to acquire the windowed samples z(n) of the windowed frame based on the equation $$z(n)=x(n)\cdot c(n)$$

wherein n is an integer indicating an index of the sequence of window coefficients in the range of 0 to T·N−1, wherein c(n) is the window coefficient of the analysis window function corresponding to the index n, wherein x(N·T−1) is the latest time–domain audio input sample of a frame of time–domain audio input samples, wherein the analysis windower is adapted such that the frame of time–domain audio input samples comprises a sequence of T blocks of time–domain audio input samples extending from the earliest to the latest time–domain audio input samples of the frame, each block comprising N time–domain audio input samples, and wherein T and N are positive integers and T is larger than 4.]

[8. The apparatus according to claim 1, wherein the analysis windower is adapted such that the analysis window function comprises a first group of window coefficients comprising a first portion of the sequence of window coefficients and a second group of window coefficients comprising a second portion of the sequence of window coefficients, wherein the first portion comprises less window coefficients than the second portion, wherein an energy value of the window coefficients in the first portion is higher than an energy value of the window coefficients of the second portion, and wherein the first group of window coefficients is used for windowing later time–domain samples and the second group of window coefficients is used for windowing earlier time–domain samples.]

[9. The apparatus according to claim 1, wherein the apparatus is adapted to using an analysis window function being a time-reversed or index-reversed version of a synthesis window function to be used for the audio subband values.]

[10. The apparatus according to claim 1, wherein the analysis windower is adapted such that the larger window function is asymmetric with respect to the sequence of window coefficients.]

[11. An apparatus for generating time–domain audio samples, comprising:

a calculator for calculating a sequence of intermediate time–domain samples from audio subband values in audio subband channels, the sequence comprising earlier intermediate time–domain samples and later time–domain samples;

a synthesis windower for windowing the sequence of intermediate time–domain samples using a synthesis window function comprising a sequence of window coefficients to acquire windowed intermediate time–domain samples, the synthesis window function comprising a first number of window coefficients derived from a larger window function comprising a sequence of a larger second number of window coefficients, wherein the window coefficients of the window function are derived by an interpolation of window coefficients of the larger window function; and wherein the second number is even; and an overlap-adder output stage for processing the windowed intermediate time–domain samples to acquire the time–domain samples.]

[12. The apparatus according to claim 11, wherein the apparatus is adapted to interpolating the window coefficients of the larger window function to acquire the window coefficients of the window function.]

[13. The apparatus according to claim 11, wherein the apparatus is adapted such that the window coefficients of the synthesis window function are linearly interpolated.]

[14. The apparatus according to claim 11, wherein the apparatus is adapted such that the window coefficients of the synthesis window function are interpolated based on two consecutive window coefficients of the larger window function according to the sequence of window coefficients of the larger window function to acquire one window coefficient of the window function.]

[15. The apparatus according to claim 11, wherein the apparatus is adapted to acquire the window coefficients c(n) of the synthesis window function based on equation $$c(n) = \frac{1}{2}(c_2(2n) + c_2(2n+1)),$$

wherein $c_2(n)$ are window coefficients of a larger window function corresponding to the index n.]

[16. The apparatus according to claim 15, wherein the apparatus is adapted such that the window coefficient $c_2(n)$ fulfill the relations given in the table in Annex 4.]

[17. The apparatus according to claim 11, wherein the synthesis window is adapted such that the windowing comprises multiplying the intermediate time–domain samples g(n) of the sequence of intermediate time–domain samples to acquire the windowed samples z(n) of the windowed frame based on the equation $$z(n)=g(n)\cdot c(T-N-1-n)$$

for n=0, . . . , T·N−1.]

[18. The apparatus according to claim 11, wherein the synthesis windower is adapted such that the synthesis window function comprises a first group of window coefficients comprising a first portion of the sequence of window coefficients and a second group of window coefficients comprising a second portion of the sequence of window coefficients, the first portion comprising less window coefficients than the second portion, wherein an energy value of the window coefficients in the first portion is higher than an energy value of the window coefficients of the second portion, and wherein the first group of window coefficients is used for windowing later intermediate time–domain samples and the second group of window coefficients is used for windowing earlier intermediate time–domain samples.]

[19. The apparatus according to claim 11, wherein the apparatus is adapted to using the synthesis window function being a time–reverse or index-reversed version of an analysis window function used for generating the audio subband values.]

[20. The apparatus according to claim 11, wherein the synthesis windower is adapted such that the larger window function is asymmetric with respect to a sequence window coefficients.]

[21. A method for generating audio subband values in audio subband channels, comprising:

windowing, by an analysis windower, a frame of time–domain audio input samples being in a time sequence extending from an early sample to a later sample using an analysis window function to acquire windowed samples, the analysis window function comprising a first number of window coefficients derived from a larger window function comprising a sequence of a larger second number of window coefficients, wherein the window coefficients of the window function are derived by an interpolation by window coefficients of the larger window function; and wherein the second number is an even number; and calculating, by a calculator, the audio subband values using the windowed samples, wherein at least one of the analysis windower and the calculator comprises a hardware implementation.]

[22. A method for generating time–domain audio samples, comprising:

calculating, by a calculator, a sequence of intermediate time–domain samples from audio subband values in audio subband channels, the sequence comprising earlier intermediate time–domain samples and later intermediate time–domain samples;

windowing, by a synthesis windower, the sequence of intermediate time–domain samples using a synthesis window function to acquire windowed time–domain samples, the synthesis window function comprising a first number of window coefficients derived from a larger window function comprising a sequence of a larger second number of window coefficients, wherein the window coefficients of the window function are derived by an interpolation of window coefficients of the larger window function; and wherein the second number is even; and overlap-adding, by an overlap-adder output stage, the windowed time–domain samples to acquire the time–domain samples;

wherein at least one of the synthesis windower, the calculator and the overlap-adder output stage comprises a hardware implementation.]

[23. A non-transitory storage medium having stored thereon a program with a program code for executing a method for generating audio subband values in audio subband channels, the method comprising:

windowing a frame of time–domain audio input samples being in a time sequence extending from an early sample to a later sample using an analysis window function to acquire windowed samples, the analysis window function comprising a first number of window coefficients derived from a larger window function comprising a sequence of a larger second number of window coefficients, wherein the window coefficients of the window function are derived by an interpolation by window coefficients of the larger window function; and wherein the second number is an even number; and calculating the audio subband values using the windowed samples, when running on a processor.]

[24. A non-transitory storage medium having stored thereon a program with a program code for executing a method for generating time–domain audio samples, the method comprising:

calculating a sequence of intermediate time–domain samples from audio subband values in audio subband channels, the sequence comprising earlier intermediate time–domain samples and later intermediate time–domain samples;

windowing the sequence of intermediate time–domain samples using a synthesis window function to acquire windowed time–domain samples, the synthesis window function comprising a first number of window coefficients derived from a larger window function comprising a sequence of a larger second number of window coefficients, wherein the window coefficients of the window function are derived by an interpolation of window coefficients of the larger window function; and wherein the second number is even; and overlap-adding the windowed time–domain samples to acquire the time–domain samples, when running on a processor.]

*25. An apparatus for generating audio subband values in audio subband channels, comprising:*

*an analysis windower for windowing a frame of time-domain audio input samples being in a time sequence extending from an early sample to a later sample using an analysis window function comprising a sequence of window coefficients to acquire windowed samples, the analysis window function comprising a first number of window coefficients derived from a larger window function comprising a sequence of a larger second number of window coefficients,*

*wherein the window coefficients of the window function are derived by an interpolation of window coefficients of the larger window function; and*

*wherein the second number is an even number; and*

*a calculator for calculating the audio subband values using the windowed samples,*

*wherein at least one of the analysis windower and the calculator comprises a hardware implementation comprising a digital storage medium which cooperates with a programmable computer system, processor, or integrated circuit.*

*26. The apparatus according to claim 25, wherein the apparatus or the analysis windower is adapted such that the window coefficients of the analysis window function are interpolated based on two consecutive window coefficients of the larger window function according to the sequence of the window coefficients of the larger window function to acquire one window coefficient of the window function.*

*27. The apparatus according to claim 25, wherein the apparatus or the analysis windower is adapted to acquire the window coefficients $c(n)$ of the analysis window function based on the equation*

$$c(n)=\tfrac{1}{2}(c_2(2n)+c_2(2n+1))$$

*wherein n is an integer indicating an index of the window coefficients $c(n)$, and $c_2(n)$ is a window coefficient of the larger window function.*

*28. The apparatus according to claim 27, wherein the apparatus or the analysis windower is adapted such that the window coefficients $c_2(n)$ of the larger window function obey the relations given in the table in Annex 4.*

*29. The apparatus according to claim 25, wherein the analysis windower is adapted such that the analysis window function comprises a first group of window coefficients comprising a first portion of the sequence of window coefficients and a second group of window coefficients comprising a second portion of the sequence of window coefficients, wherein the first portion comprises less window coefficients than the second portion, wherein an energy value of the window coefficients in the first portion is higher than an energy value of the window coefficients of the second portion, and wherein the first group of window coefficients is used for windowing later time-domain samples and the second group of window coefficients is used for windowing earlier time-domain samples.*

*30. The apparatus according to claim 25, wherein the apparatus is adapted to using an analysis window function*

*being a time-reversed or index-reversed version of a synthesis window function to be used for the audio subband values.*

*31. The apparatus according to claim 25, wherein the analysis windower is adapted such that the larger window function is asymmetric with respect to the sequence of window coefficients.*

* * * * *